US009263144B2

(12) United States Patent
Ito et al.

(10) Patent No.: US 9,263,144 B2
(45) Date of Patent: Feb. 16, 2016

(54) SEMICONDUCTOR MEMORY DEVICE
(71) Applicant: Kabushiki Kaisha Toshiba, Minato-ku (JP)
(72) Inventors: Hiroshi Ito, Kanagawa-ken (JP); Hiroshi Maejima, Tokyo (JP)
(73) Assignee: KABUSHIKI KAISHA TOSHIBA, Minato-ku (JP)
( * ) Notice: Subject to any disclaimer, the term of this patent is extended or adjusted under 35 U.S.C. 154(b) by 29 days.
(21) Appl. No.: 14/187,500
(22) Filed: Feb. 24, 2014
(65) Prior Publication Data
US 2014/0247671 A1 Sep. 4, 2014
(30) Foreign Application Priority Data
Mar. 1, 2013 (JP) .................................. 2013-040954
(51) Int. Cl.
G11C 11/34 (2006.01)
G11C 16/06 (2006.01)
G11C 16/26 (2006.01)
G11C 16/10 (2006.01)
G11C 16/14 (2006.01)
G11C 16/04 (2006.01)
G11C 16/08 (2006.01)
G11C 16/24 (2006.01)
(52) U.S. Cl.
CPC ............ *G11C 16/26* (2013.01); *G11C 16/0483* (2013.01); *G11C 16/08* (2013.01); *G11C 16/10* (2013.01); *G11C 16/14* (2013.01); *G11C 16/24* (2013.01)
(58) Field of Classification Search
None
See application file for complete search history.

(56) References Cited

U.S. PATENT DOCUMENTS

| 6,608,772 | B2 | 8/2003 | Ooishi |
| 7,102,928 | B2 | 9/2006 | Kawamura |
| 7,236,401 | B2 | 6/2007 | Kameda |
| 7,266,016 | B2 | 9/2007 | Kameda |
| 7,656,708 | B2 | 2/2010 | Hong et al. |
| 8,338,882 | B2 | 12/2012 | Tanaka et al. |
| 8,503,248 | B2 | 8/2013 | Otsuka et al. |
| 2008/0137459 | A1 | 6/2008 | Morishima |

FOREIGN PATENT DOCUMENTS

| JP | 2002-216471 | 8/2002 |
| JP | 2006-54034 | 2/2006 |
| JP | 2006-107643 | 4/2006 |
| JP | 2006-146989 | 6/2006 |
| JP | 2009-507315 | 2/2009 |
| JP | 2010-225222 A | 10/2010 |
| JP | 2011-187794 | 9/2011 |
| JP | 2011-198437 | 10/2011 |
| JP | 2011-233180 | 11/2011 |
| WO | WO 02/01574 A1 | 1/2002 |

OTHER PUBLICATIONS

Office Action issued Jun. 16, 2015 in Japanese Patent Application No. 2013-040954 (with English language translation).
Office Action issued Oct. 20, 2015 in Japanese Office Action No. 2013-040954 with English translation. (3 pages).

*Primary Examiner* — Kretelia Graham
(74) *Attorney, Agent, or Firm* — Oblon, McClelland, Maier & Neustadt, L.L.P.

(57) ABSTRACT

According to one embodiment, a semiconductor memory device includes a first sub-array including a plurality of first memory cells; a second sub-array including a plurality of second memory cells; a first bit line electrically connected to a first group of the first memory cells; a second bit line electrically connected to a first group of the second memory cells; a bit line connection unit configured to connect the first bit line and the second bit line; a first sense amplifier configured to receive a first voltage from either of the first bit line and the second bit line in a read operation, and transfer a second voltage either of the first bit line and the second bit line in a write operation; a first source line electrically connected to the first memory cells; a second source line electrically connected to the second memory cells; and a source line driver configured to apply voltages to the first source line and the second source line.

9 Claims, 52 Drawing Sheets

SEMICONDUCTOR MEMORY DEVICE

CROSS-REFERENCE TO RELATED APPLICATION

This application is based upon and claims the benefit of priority from Japanese Patent Application No. 2013-040954, filed Mar. 1, 2013, the entire contents of which are incorporated herein by reference.

FIELD

Embodiments described herein relate to a semiconductor memory device.

BACKGROUND

A NAND type flash memory with a three-dimensional structure manufactured using a BiCS (Bit Cost Scalable Flash memory: BiCS) manufacturing technique is referred to in the art as BiCS memory.

DETAILED DESCRIPTION

In general, according to one embodiment, a semiconductor memory device includes a first sub-array including a plurality of first memory cells stacked above a semiconductor substrate; a second sub-array including a plurality of second memory cells stacked above the semiconductor substrate; a first bit line electrically connected to a first group of the first memory cells; a second bit line electrically connected to a first group of the second memory cells; a bit line connection unit configured to connect the first bit line and the second bit line; a first sense amplifier configured to receive a first voltage from either of the first bit line and the second bit line in a read operation, and transfer a second voltage either of the first bit line and the second bit line in a write operation; a first source line electrically connected to the first memory cells; a second source line electrically connected to the second memory cells; and a source line driver configured to apply voltages to the first source line and the second source line, wherein the first sense amplifier is electrically connected to the first bit line on the condition that the first bit line is disconnected from the second bit line in either the read operation of the first memory cells or the write operation of the first memory cells, the bit line connection unit electrically connects the first bit line to the second bit line in either the read operation of the second memory cells or the write operation of the second memory cells, and the source line driver applies an erase voltage to the first source line and does not apply the erase voltage to the second source line in an erase operation of the first memory cells.

Hereinafter, embodiments will be described with reference to the drawings. In the following description, a common part is given a common reference sign throughout all the drawings.

1. First Embodiment

A semiconductor memory device according to the first embodiment will be described. Hereinafter, a three-dimensional NAND type flash memory will be described as an example of the semiconductor memory device.

1.1 Configuration of Semiconductor Memory Device

First, a configuration of the semiconductor memory device according to the present embodiment will be described.

1.1.1 Overall Configuration of Semiconductor Memory Device

Figure 1:
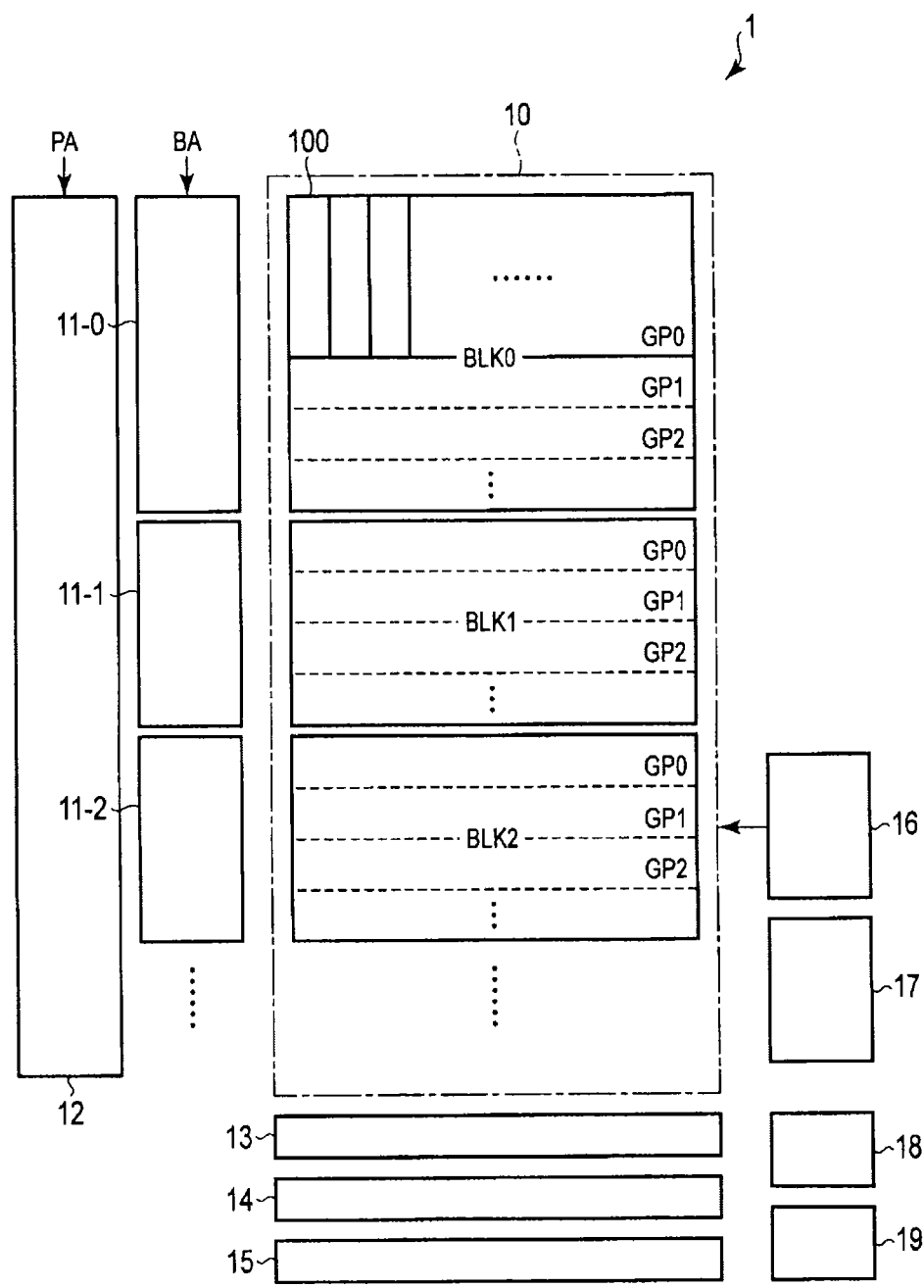
FIG. 1 is a block diagram of a semiconductor memory device according to a first embodiment.

FIG. 1 is a block diagram of a semiconductor memory device according to the present embodiment. As shown in FIG. 1, the NAND type flash memory 1 includes a memory cell array 10, N (where N is a natural number which is equal to or more than 2) row decoders 11 (11-0, 11-1, 11-2, ...), a row driver 12, a sense amplifier 13, a data control unit 14, an input and output circuit 15, a bit line connection unit 16, a source line driver 17, a voltage generation circuit 18, and a control circuit 19.

The memory cell array 10 includes a plurality of (N in this example) blocks BLK (BLK0, BLK1, BLK2, ...) which is a set of nonvolatile memory cells. Data of the same block BLK is collectively erased. Each block BLK includes a plurality of (M in the example where M is a natural number which is equal to or more than 2) memory groups GP (GP0, GP1, GP2, ...) which is a set of NAND strings 100. One of the NAND strings includes the memory cells which are connected in series. Of course, any number of blocks of the memory cell array 10 and any number of memory groups of the block BLK may be used.

The row decoders 11-0 to 11-(N−1) are provided so as to correspond to the respective blocks BLK0 to BLK(N−1). In addition, the row decoders 11-0 to 11-(N−1) select row directions of the corresponding blocks BLK.

The row driver 12 supplies voltages which are necessary to write, read and erase data, to the row decoders 11. These voltages are applied to the memory cells by the row decoders 11.

The sense amplifier 13 senses and amplifies data read from the memory cell in the read operation. In addition, in the write operation, data to be written is transferred to the memory cell. The sense amplifier 13 includes a plurality of sense amplifier circuits SAC.

The data control unit 14 selects a column direction (a bit line described later) of the memory cell array 10. In addition, in the read operation, the data control unit 14 temporarily holds data which is sensed and amplified by the sense amplifier 13, and transfers the data to an external controller or host apparatus via the input and output circuit 15. Further, in the write operation, the data control unit 14 temporarily holds data to be written which is sent from the controller or the host apparatus via the input and output circuit 15, and transfers the data to the sense amplifier 13.

The bit line connection unit 16 electrically controls connection between bit lines of a plurality of sub-arrays in the memory cell array 10. Details of the sub-array and the bit line connection unit 16 will be described later.

The source line driver 17 supplies a voltage to a source line described later.

The voltage generation circuit 18 generates voltages which are necessary to write, read and erase data, and supplies the voltages to the row driver 12, the sense amplifier 13, the source line driver 17, and the like.

The control circuit 19 controls an operation of the entire NAND type flash memory 1.

1.1.2 Memory Cell Array 10

Figure 2:
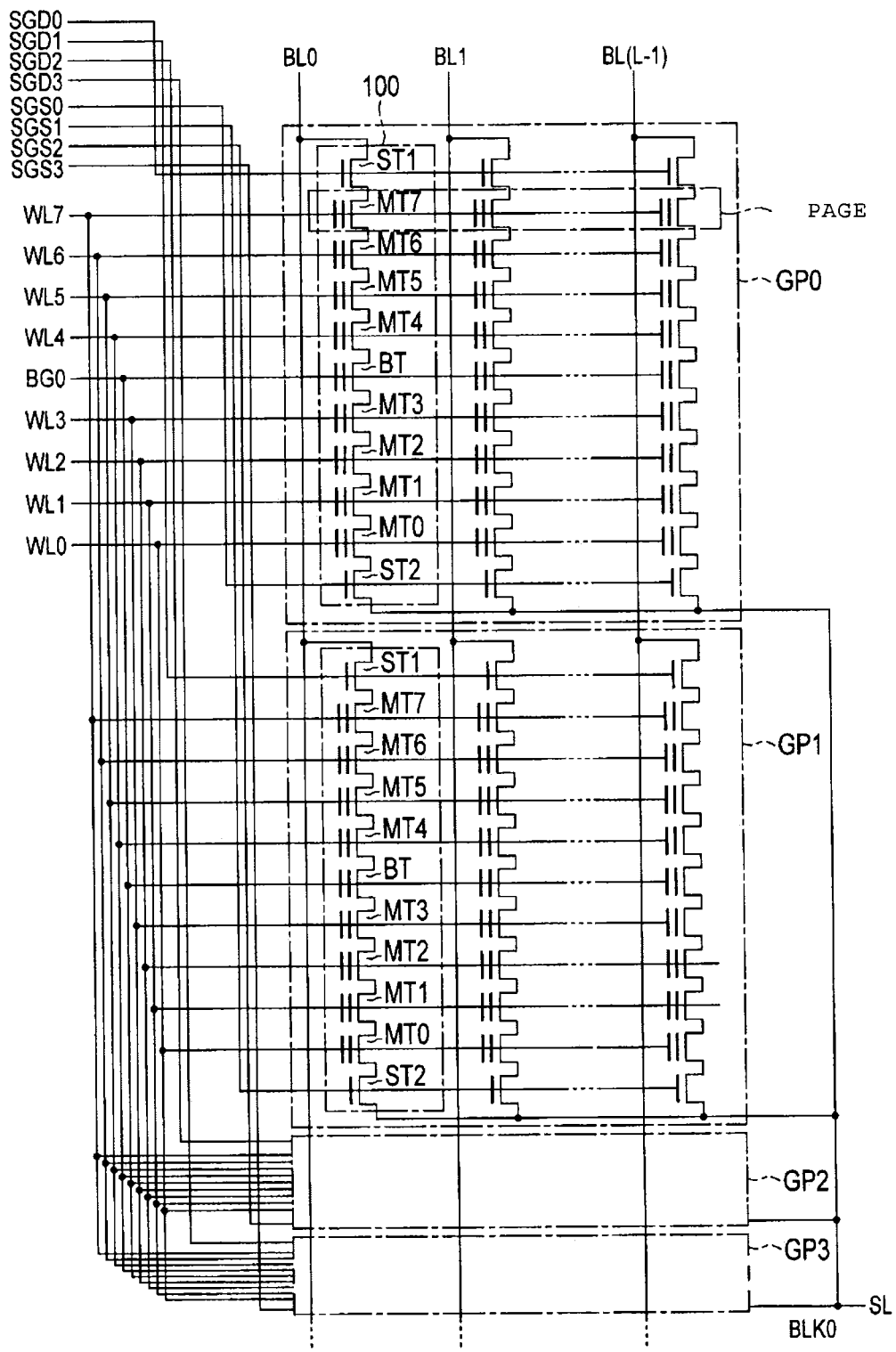
FIG. 2 is a circuit diagram of a memory cell array according to the first embodiment.

Next, a configuration of the memory cell array 10 will be described in detail. FIG. 2 is a circuit diagram of the block BLK0. The other blocks BLK also have the same configuration.

As shown in FIG. 2, the block BLK0 includes M memory groups GP. In addition, each memory group GP includes L NAND strings 100.

Each of the NAND strings 100 includes, for example, eight memory cell transistors MT (MT0 to MT7), selection transistors ST1 and ST2, and a back gate transistor BT. The memory cell transistor MT includes a control gate and a charge storage layer, and holds data in a nonvolatile manner. In addition, the number of memory cell transistors MT is not limited to eight, and may be 16, 32, 64, 128, or the like, that is, the number thereof is not limited. n the same manner as the memory cell transistor MT, the back gate transistor BT is also provided with a control gate and a charge storage layer. However, the back gate transistor BT is not used to hold data but merely functions as a current path in the read operation, the write operation or the erase operation. The memory cell transistor MT and the back gate transistor BT are disposed such that a current path is connected in series between the selection transistors ST1 and ST2. In addition, the back gate transistor BT is provided between the memory cell transistors MT3 and MT4. A current path of the memory cell transistor MT7 on one end side of this serial connection is connected to one end of a current path of the selection transistor ST1, and a current path of the memory cell transistor MT0 on the other end side thereof is connected to one end of a current path of the selection transistor ST2.

The gates of the selection transistors ST1 of the memory groups GP0 to GP(M−1) are respectively connected in common to select gate lines SGD0 to SGD(M−1), and the gates of the selection transistors ST2 are respectively connected in common to select gate lines SGS0 to SGS(M−1). In contrast, the control gates of the memory cell transistors MT0 to MT7 of the same block BLK0 are respectively connected in common to the word lines WL0 to WL7, and control gates of back gate transistors BT are connected in common to a back gate line BG (in the blocks BLK0 to BLK(N−1), respectively BG0 to BG(N−1)).

In other words, the word lines WL0 to WL7 and the back-gate line BG are connected in common between a plurality of memory groups GP of the same block BLK0, whereas the select gate lines SGD and SGS are independent for each memory group GP even in the same block BLK0.

In addition, among the NAND strings 100 which are disposed in a matrix in the memory cell array 10, the other ends of the current paths of the selection transistors ST1 of the NAND strings 100 of the same column are connected in common to any one bit line BL. In other words, the bit line BL is connected in common to the NAND strings 100 between a plurality of blocks BLK. In addition, the other ends of the current paths of the selection transistors ST2 are connected in common to the source line SL. The source line SL is connected in common to the NAND strings 100, for example, between a plurality of memory groups GP.

As described above, the erase operation is performed per a block BLK. In contrast, the read operation or the write operation is performed on a plurality of memory cell transistors MT which are connected in common to any one word line WL in any one memory group GP of any one block BLK. This unit is called a "page". The unit of page may be part of a plurality of memory cell transistors MT which are connected in common to any one word line WL in any one memory group GP of any one block BLK.

A configuration of the memory cell array 10 is disclosed in U.S. patent application Ser. No. 12/407,403, filed on Mar. 19, 2009, entitled "three-dimensional stacked nonvolatile semiconductor memory". In addition, a configuration thereof is disclosed in U.S. patent application Ser. No. 12/406,524, filed on Mar. 18, 2009, entitled "three-dimensional stacked nonvolatile semiconductor memory", U.S. patent application Ser. No. 13/816,799, filed on Sep. 22, 2011, entitled "nonvolatile semiconductor storage device", and U.S. patent application Ser. No. 12/532,030, filed on Mar. 23, 2009, entitled "semiconductor memory and manufacturing method thereof". The overall contents of the Patent Applications are incorporated by reference in the present application.

1.1.3 Memory Cell Array, Sense Amplifier, and Bit Line Connection Unit

Figure 3:
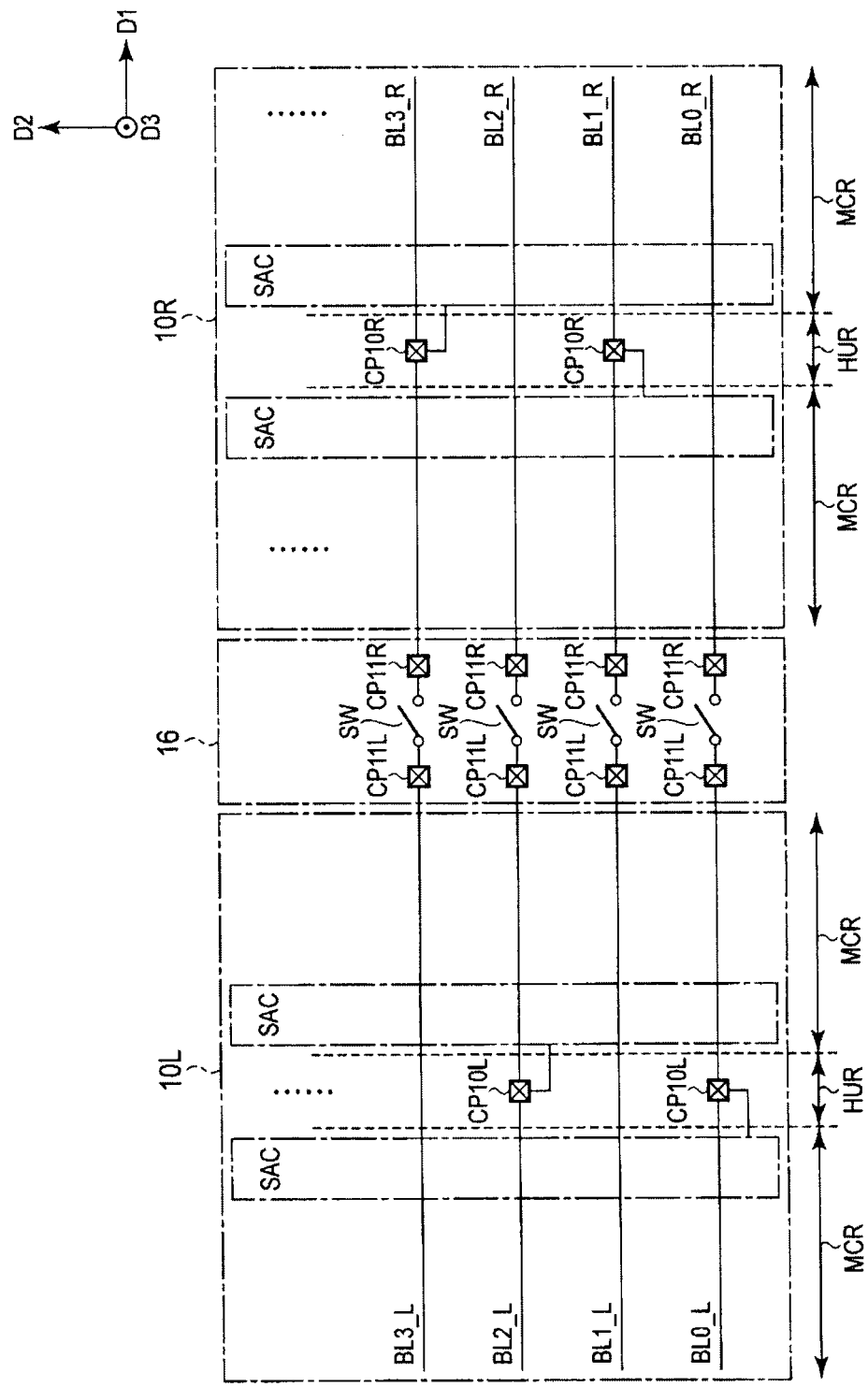
FIG. 3 is a plan view of the memory cell array and a bit line connection unit according to the first embodiment.

Next, an arrangement of the memory cell array 10, the sense amplifier 13, and the bit line connection unit 16 will be described with reference to FIGS. 3 and 4. FIG. 3 is a schematic diagram illustrating a planar arrangement of the memory cell array 10, the sense amplifier 13, and the bit line connection unit 16, and FIG. 4 is a cross-sectional view of FIG. 3.

Figure 4:
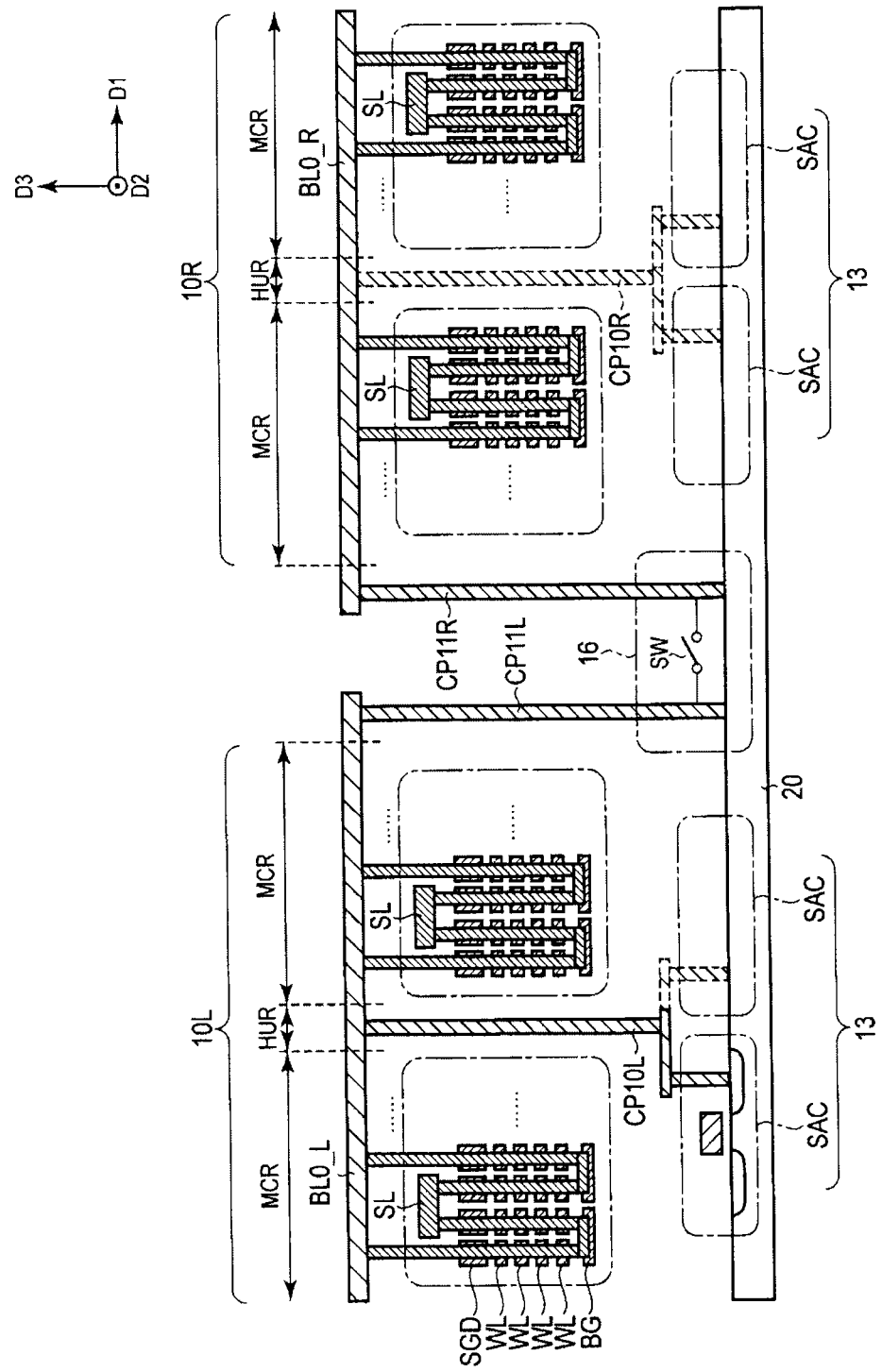
FIG. 4 is a cross-sectional view of the memory cell array and the bit line connection unit according to the first embodiment.

As shown in FIGS. 3 and 4, the memory cell array 10 includes two sub-arrays including a left sub-array 10L and a right sub-array 10R. In addition, the terms "left" and "right" are merely referred to for convenience of description using FIG. 3, and the right and the left may be appropriately changed depending on the viewpoint.

The bit line BL is provided so as to connect the two sub-arrays 10L and 10R, and the memory cell of the sub-array 10L and the memory cell of the sub-array 10R are connected in common to a single bit line BL. In a single bit line BL, a part which is located on the left sub-array 10L and to which the memory cell of the sub-array 10L is connected is referred to as a left bit line BL_L (BL0_L, BL1_L, . . . ). On the other hand, a part which is located on the right sub-array 10R and to which the memory cell of the sub-array 10R is connected is referred to as a right bit line BL_R (BL0_R, BL1_R, . . . ). In addition, in the following, if an even-numbered bit line and an odd-numbered bit line are differentiated from each other, an even-numbered left bit line is indicated by BLe_L, and an odd-numbered left bit line is indicated by BLo_L. Similarly, an even-numbered right bit line is indicated by BLe_R, and an odd-numbered right bit line is indicated by BLo_R. Further, if a left bit line and a right bit line are not differentiated from each other, the left bit line and the right bit line are respectively indicated by BLe and BLo.

Each of the sub-arrays 10L and 10R substantially includes memory cell regions MCR and a hook-up region HUR. The memory cell regions MCR are regions which are provided with the NAND strings 100 described in FIG. 2 and store data. The hook-up region HUR is a region which is provided between the memory cell regions MCR which are adjacent in a bit line direction and connects the bit line BL to the sense amplifier 13.

The sense amplifier 13 includes a plurality of sense amplifier circuits SAC formed on a semiconductor substrate 20. A single sense amplifier circuit SAC is provided for the bit line BL formed by a set of the left bit line BL_L and the right bit line BL_R. Therefore, the sense amplifier circuit SAC is connected to either of BL_L and BL_R of a corresponding bit line BL. In the hook-up regions HUR, contact plugs CP10L and CP10R are provided. The contact plug CP10L connects the left bit line BL_L to a corresponding sense amplifier circuit SAC. In addition, the contact plug CP10R connects the right bit line BL_R to a corresponding sense amplifier circuit SAC.

In the example of FIG. 3, the sense amplifier circuits SAC connected to the even-numbered bit lines BLe are provided in a region located under the left sub-array 10L. On the other hand, the sense amplifier circuits SAC connected to the odd-numbered bit lines BLo are provided in a region located under the right sub-array 10R. Of course, this positional relationship is only an example, and, for example, the sense amplifier circuits SAC connected to the even-numbered bit lines BLe may be provided in a region located under the right sub-array 10R, and the sense amplifier circuits SAC connected to the odd-numbered bit lines BLo may be provided in a region located under the left sub-array 10L. Alternatively, the sense amplifier circuits SAC may be disposed under the sub-array 10L in a certain bit line group, and may be disposed under the sub-array 10R in relation to another bit group, regardless of the even-numbered bit lines BLe and the odd-numbered bit lines BLo.

The bit line connection unit 16 includes a switch SW provided for each bit line BL. The switch SW connects the left bit line BL_L to the right bit line BL_R in a corresponding bit line BL. The bit line connection unit 16 is provided on the semiconductor substrate 20, and the left bit line BL_L is connected to the switch SW via a contact plug CP11L, and the right bit line BL_R is connected to the switch SW via a contact plug CP11R.

1.1.4 Sense Amplifier 13

Next, the sense amplifier 13 will be described in detail. As described above, the sense amplifier 13 includes the sense amplifier circuit SAC provided for each bit line. Each of the sense amplifier circuits SAC senses and amplifies data which is read via a corresponding bit line BL in the read operation. Each of the sense amplifier circuits SAC transfers data to be written via a corresponding bit line BL in the write operation. Further, each of the sense amplifier circuits SAC transfers an erase voltage to a corresponding bit line BL in the erase operation.

Figure 5:
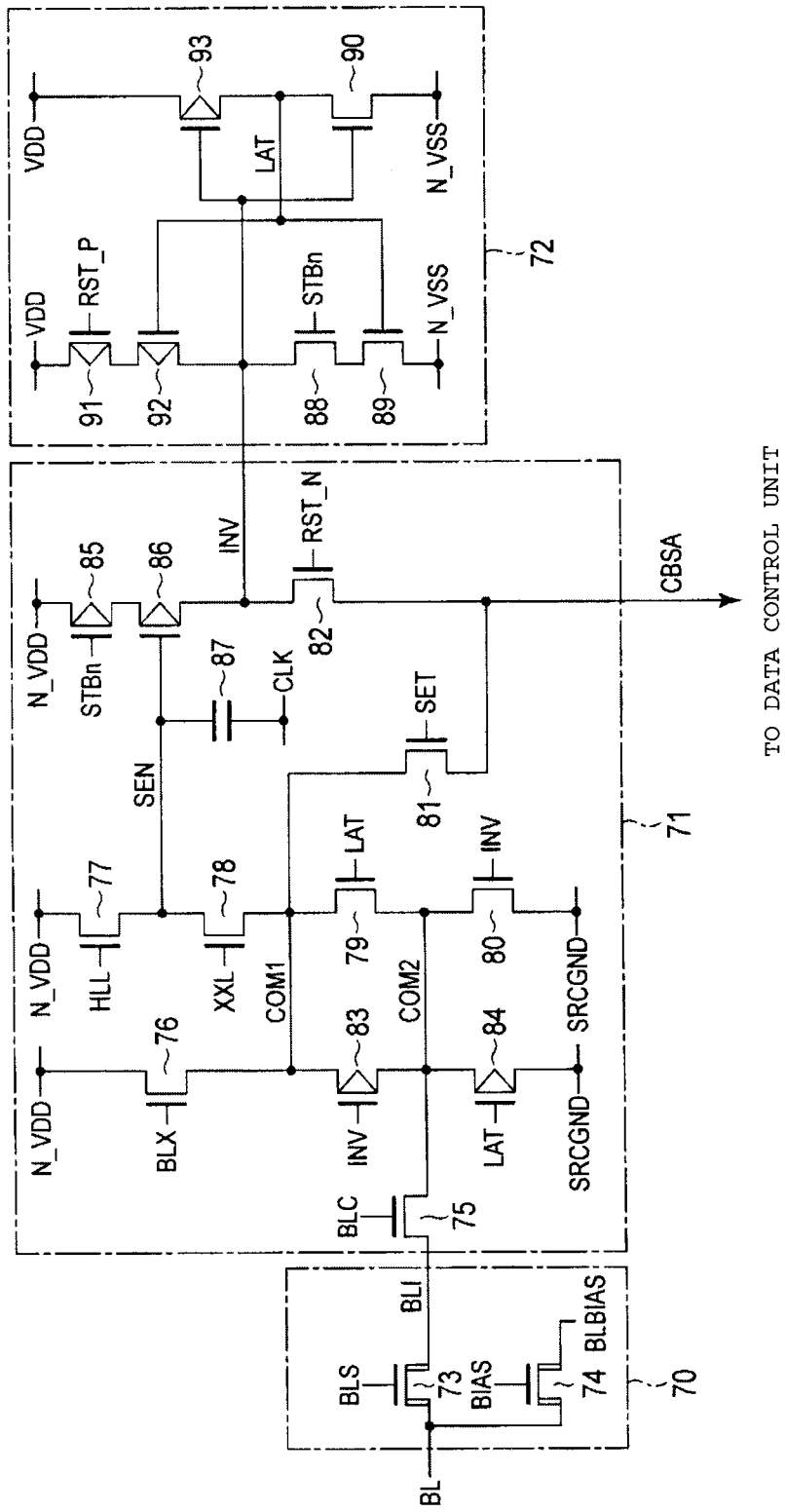
FIG. 5 is a circuit diagram of a sense amplifier according to the first embodiment.

FIG. 5 is a circuit diagram of the sense amplifier circuit SAC. As shown in FIG. 5, the sense amplifier circuit SAC substantially includes a bit line hook-up portion 70, a sense amplifier portion 71, and a data holding portion 72.

The bit line hook-up portion 70 includes n-channel MOS transistors 73 and 74 with a high withstand voltage. In the transistor 73, when a signal BLS is applied to a gate thereof, one end of a current path is connected to a corresponding bit line BL via the contact plug CP10L or CP10R, and the other end thereof is connected to a node BLI. In the transistor 74, when a signal BIAS is applied to a gate thereof, one end of a current path is connected to a corresponding bit line BL, and the other end thereof is connected to a node BLBIAS.

The sense amplifier portion 71 includes n-channel MOS transistors 75 to 82 with a low withstand voltage, p-channel MOS transistors 83 to 86 with a low withstand voltage, and a capacitor element 87.

The MOS transistor 75 has one end of a current path connected to the corresponding node BLI, the other end thereof connected to a node COM2, and a gate to which a signal BLC is applied.

The MOS transistor 84 has one end of a current path connected to the node COM2, the other end thereof connected to a node SRCGND (for example, 0 V), and a gate connected to a node LAT. The MOS transistor 80 has one end of a current path connected to the node COM2, the other end thereof connected to the node SRCGND, and a gate connected to a node INV. The MOS transistor 83 has one end of a current path connected to the node COM2, the other end thereof connected to a node COM1, and a gate connected to the node INV. The MOS transistor 79 has one end of a current path connected to the node COM2, the other end thereof connected to the node COM1, and a gate connected to the node LAT. The MOS transistor 81 has one end of a current path connected to the node COM1, the other end thereof connected to a common bus CBSA, and a gate to which a signal SET is applied. The common bus CBSA is a bus which connects the sense amplifier portion 71 to the data control unit 14. The MOS transistor 76 has one end of a current path connected to a node N_VDD to which a power supply voltage VDD is applied, the other end thereof connected to the node COM1, and a gate to which a signal BLX is applied. The MOS transistor 78 has one end of a current path connected to a node SEN, the other end thereof connected to the node COM1, and a gate to which a signal XXL is applied. The MOS transistor 77 has one end of a current path connected to the node N_VDD, the other end thereof connected to the node SEN, and a gate to which a signal HLL is applied.

The capacitor element 87 has one electrode connected to the node SEN and the other electrode to which a clock CLK is applied.

The MOS transistor 82 has one end of a current path connected to the node INV, the other end thereof connected to the common bus CBSA, and a gate to which a signal RST_N is applied. The MOS transistor 86 has one end of a current path connected to the node INV, and a gate connected to the node SEN. The MOS transistor 85 has one end of a current path connected to the node N_VDD, the other end thereof connected to the other end of the current path of the MOS transistor 86, and a gate to which a signal STBn is applied.

The data holding portion 72 latches data at the node INV which is a connection node of the MOS transistors 82 and 86. In other words, the data holding portion 72 includes n-channel MOS transistors 88 to 90, and p-channel MOS transistors 91 to 93.

The MOS transistor 88 has one end of a current path connected to the node INV, and a gate to which the signal STBn is applied. The MOS transistor 89 has one end of a current path connected to a node N_VSS, the other end thereof connected to the other end of the current path of the MOS transistor 88, and a gate connected to the node LAT. A voltage VSS (for example, 0 V) is applied to the node N_VSS. The MOS transistor 92 has one end of a current path connected to the node INV, and a gate connected to the node LAT. The MOS transistor 91 has one end of a current path connected to the node N_VDD, the other end thereof connected to the other end of the current path of the MOS transistor 92, and a gate to which a signal RST_P is applied. The MOS transistor 90 has one end of a current path connected to the node N_VSS, the other end thereof connected to the node LAT, and a gate connected to the node INV. The MOS transistor 93 has one end of a current path connected to the node N_VDD, the other end thereof connected to the node LAT, and a gate connected to the node INV.

The signals SET and RST_N are turned to an "H" level in a reset operation, and thereby the nodes COM1 and INV are turned to an "L" level (0 V), and the node LAT is turned to an "H" level (VDD). On the other hand, in a normal operation, signals SET and RST_N are turned to an "L" level, and thereby the transistors 81 and 82 are turned off. Further, the signal RST_N is turned to an "H" level when data of the sense amplifier 13 is transferred to the data control unit 14. In addition, the signal RST_P is turned to an "H" level in a reset operation, and is turned to an "L" level in a normal operation.

In the above-described configuration, the signal BLS is turned to an "H" level, and thereby the bit line BL is connected to a corresponding sense amplifier portion 71, in the write operation. In addition, the signal BLC is turned to an "H" level, and thus the transistor 75 is turned on. The signal BIAS is turned to an "L" level, and thus the transistor 74 is turned off. Further, data to be written is transferred to the data holding portion 72 from the data control unit 14. In the sense amplifier 13 corresponding to a selected bit line (a bit line corresponding to a memory cell of which a threshold value should be increased by injecting electric charge), the node INV is set in an "H" level, and the node LAT is set in an "L" level. Therefore, the transistors 83 and 79 are turned off, the transistors 84 and 80 are turned on, and 0 V is given to the selected bit line. In the sense amplifier 13 corresponding to an unselected bit line, the node INV is set in an "L" level, and the node LAT is set in an "H" level. Therefore, the transistors 84 and 80 are turned off, and the transistors 83 and 79 are turned on. As a result, the unselected bit line is charged to VDD by the transistor 76.

Data is read twice, that is, the read operation is performed twice. In the first read operation, the signal BLS is turned to an "H" level, and thereby the bit lines BL are respectively connected to corresponding sense amplifier portions 71 in all the sense amplifiers 13. Further, the signal BLC is turned to an "H" level, and thereby the transistor 75 is turned on. In addition, first, the transistor 76 charges the bit line BL via the current paths of the transistors 83 and 79 and the nodes COM1 and COM2. A voltage of the bit line BL is set to a voltage VBL (for example, 0.5 V) by the transistor 75. Further, the capacitor element 87 is charged by the transistor 77, and thus a voltage of the node SEN increases.

If a selected memory cell is in an ON state, a voltage of the node SEN decreases, and, in turn, the transistor 86 is turned on. In addition, the signal STBn is turned to an "H" level, and thereby the node INV is set in an "H" level, and the node LAT is set in an "L" level. As a result, the transistors 84 and 80 are turned on, and the bit line BL is fixed to 0 V. On the other hand, if a selected memory cell is in an OFF state, a voltage of the node SEN does not decrease, and thus the transistor 86 is turned off. Therefore, the node INV is maintained in an "L" level, and the node LAT is maintained in an "H" level.

The second read operation is performed only for a memory cell that is determined as being in an OFF state in the first read operation. An operation of the sense amplifier 13 corresponding to the bit line is the same as in the first read operation. On the other hand, in relation to the bit line to which a memory cell that is determined as being in an ON state in the first read operation, in a corresponding sense amplifier 13, the transistor 74 is turned on, and the bit line BL is connected to the node BLBIAS and is set to a fixed voltage.

Thereafter, in the sense amplifier 13 selected by the data control unit 14, the transistor 82 is turned on, and data in the data holding portion 72 is transferred to the data control unit 14 via the common bus CBSA.

In addition, in the following description, the signal BLBIAS is referred to as a signal BLBIAS_L in the sense amplifier circuit SAC connected to the left bit line BL_L, and the signal BLBIAS is referred to as a signal BLBIAS_R in the sense amplifier circuit SAC connected to the right bit line BL_R.

Respective control signals applied to the sense amplifier circuits SAC are given, for example, by the control circuit 19.

1.1.5 Bit Line Connection Unit 16

Figure 6:
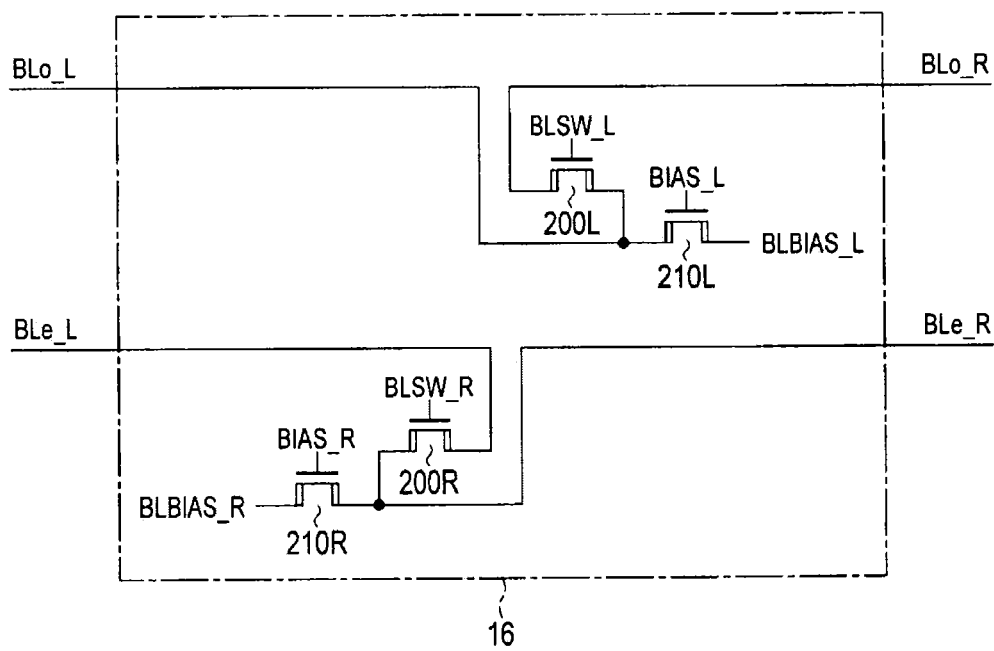
FIG. 6 is a circuit diagram of the bit line connection unit according to the first embodiment.

Next, details of the bit line connection unit 16 will be described with reference to FIG. 6. FIG. 6 is a circuit diagram of the bit line connection unit 16, and shows a configuration of a unit related to any one of even-numbered bit lines BLe and any one of odd-numbered bit lines BLo.

As shown in FIG. 6, the bit line connection unit 16 includes n-channel MOS transistors 200R and 210R correlated with the even-numbered bit line BLe and n-channel MOS transistors 200L and 210L correlated with the odd-numbered bit line BLo. The n-channel MOS transistors 200R, 200L, 210R and 210L are transistors with a high withstand voltage.

The transistor 200R has one end of a current path connected to the bit line BLe_L, the other end thereof connected to the bit line BLe_R, and a gate to which a signal BLSW_R is applied. In addition, the signal BLSW_R is turned to an "H" level, and thereby the transistor 200R connects the bit line BLe_R to the bit line BLe_L. In other words, the bit line BLe_R is connected to a corresponding sense amplifier circuit SAC.

The transistor 210R has one end of a current path connected to the bit line BLe_R, the other end thereof to which a signal BLBIAS_R is given, and a gate to which a signal BIAS_R is applied. In addition, in the erase operation, the signal BIAS_R is turned to an "H" level, and thereby the transistor 210R transfers the signal BLBIAS_R to the bit line BLe_R. The signal BLBIAS_R at this time is an erase voltage VERA.

The transistor 200L has one end of a current path connected to the bit line BLo_R, the other end thereof connected to the bit line BLo_L, and a gate to which a signal BLSW_L is applied. In addition, the signal BLSW_L is turned to an "H" level, and thereby the transistor 200L connects the bit line BLo_L to the bit line BLo_R. In other words, the bit line BLo_L is connected to a corresponding sense amplifier circuit SAC.

The transistor 210L has one end of a current path connected to the bit line BLo_L, the other end thereof to which a signal BLBIAS_L is given, and a gate to which a signal BIAS_L is input. In addition, in the erase operation, the signal BIAS_L is turned to an "H" level, and thereby the transistor 210L transfers the signal BLBIAS_L to the bit line BLo_L. The signal BLBIAS_L at this time is an erase voltage VERA.

Figure 7:
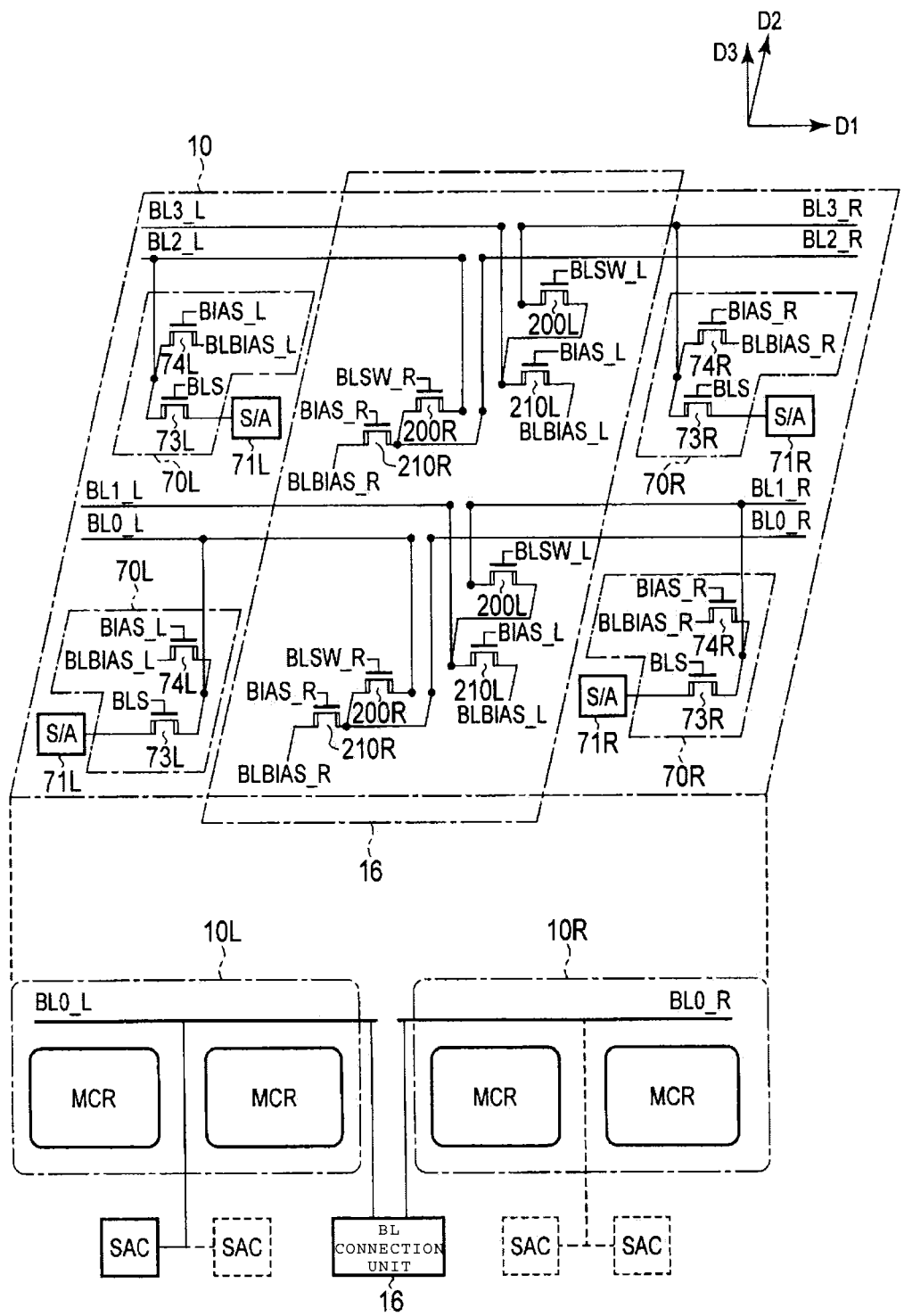
FIG. 7 is a circuit diagram illustrating a positional relationship between the memory cell array, the sense amplifier, and the bit line connection unit according to the first embodiment.

FIG. 7 shows a circuit configuration of the bit line connection unit 16, the memory cell array 10, and the sense amplifier 13 in relation to the bit lines BL0 to BL3, where the upper figure is a perspective view, and the lower figure is a diagram illustrating a cross-sectional configuration.

As described above, the sense amplifier circuits SAC connected to the even-numbered bit lines BLe are disposed under the left sub-array 10L, and the sense amplifier circuits SAC connected to the odd-numbered bit lines BLo are disposed under the right sub-array 10R. In addition, the bit line connection unit 16 is provided between the left sub-array 10L and the right sub-array 10R which are adjacent to each other in the bit line direction D1.

Hereinafter, the bit line hook-up portion 70 and the sense amplifier portion 71 in the sense amplifier circuit SAC connected to the even-numbered bit line BLe are respectively referred to as a bit line hook-up portion 70L and a sense amplifier portion 71L, and the transistors 73 and 74 therein are respectively referred to as transistors 73L and 74L. In addition, the bit line hook-up portion 70 and the sense amplifier portion 71 in the sense amplifier circuit SAC connected to the odd-numbered bit line BLo are respectively referred to as a bit line hook-up portion 70R and a sense amplifier portion 71R, and the transistors 73 and 74 therein are respectively referred to as transistors 73R and 74R.

1.1.6 Row Decoders 11

Figure 8:
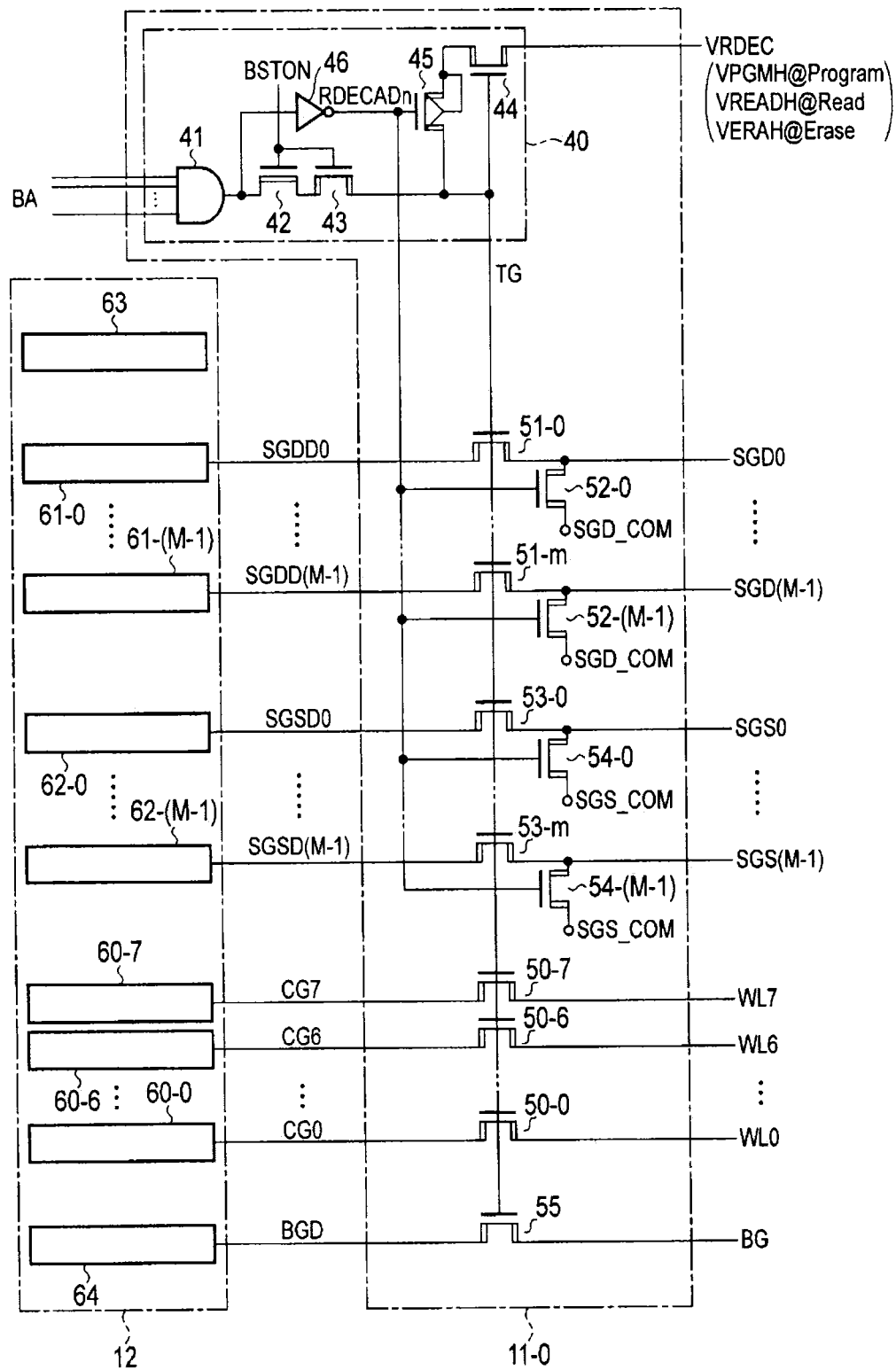
FIG. 8 is a block diagram of a row decoder and a driver circuit according to the first embodiment.

Next, a configuration of the row decoders 11 will be described. The row decoders 11-0 to 11-(N−1) are provided so as to be correlated with the blocks BLK0 to BLK(N−1), respectively, and are provided in order to select or not to select correlated blocks BLK. FIG. 8 shows configurations of the row decoder 11-0 and the row driver 12. In addition, the row decoders 11-1 to 11-3 also have the same configuration as the row decoder 11-0.

As shown in FIG. 8, the row decoder 11-0 includes a block decoder 40, and n-channel enhancement type (E type: a threshold value is positive) MOS transistors 50 to 54 (50-0 to 50-7, 51-0 to 51-(M−1), 52-0 to 52-(M−1), 53-0 to 53-(M−1), and 54-0 to 54-(M−1)) and 55 with a high withstand voltage.

1.1.6.1 Block Decoder 40

As shown in FIG. 8, the block decoder 40 includes an AND gate 41, a low-voltage-resistant n-channel depletion type MOS transistor 42, n-channel depletion type (D type: a threshold value is negative) MOS transistors 43 and 44 with a high withstand voltage, a p-channel E type MOS transistor 45 with a high withstand voltage, and an inverter 46.

The AND gate 41 performs an AND operation on each bit of a block address BA which is given by an external controller or host apparatus. If the block address BA indicates the block BLK0 corresponding to the row decoder 11-0, the AND gate 41 outputs an "H" level.

The inverter 46 inverts the output from the AND gate 41 so as to output a signal RDECADn.

The transistor 42 has one end of a current path connected to the output node of the AND gate 41, and a gate to which a signal BSTON is applied. In addition, the transistor 43 has one end of a current path connected to the other end of the current path of the transistor 42, the other end of the current path connected to a signal line TG, and a gate to which the signal BSTON is applied. The signal BSTON is a signal which is asserted ("H" level) when the block decoder 40 receives address information, and is given by, for example, the control circuit 19.

The transistor 45 has one end of a current path connected to the signal line TG, the other end of the current path connected to the back gate, and a gate to which the signal RDECADn is applied. The transistor 44 has one end of a current path to which a voltage VRDEC is applied, the other end thereof connected to the other end of the current path of the transistor 45, and a gate connected to the signal line TG.

In the read operation, the write operation or the erase operation, if the block address BA matches the block BLK0, the transistors 44 and 45 are turned on, and thereby the signal line TG is turned to an "H" level (the voltage VRDEC). On the other hand, if the block address BA does not match the block BLK0, the MOS transistors 44 and 45 are turned off, and thereby the signal line TG is turned to an "L" level (for example, 0 V or a negative voltage VBB).

1.1.6.2 Transistor 50

Next, the transistor 50 will be described. The transistor 50 is configured to transfer a voltage to a word line WL of a selected block BLK. The transistors 50-0 to 50-7 have first ends of current paths which are respectively connected to the word lines WL0 to WL7 of the corresponding block BLK0, second ends thereof which are respectively connected to signal lines CG0 to CG7, and gates which are connected in common to the signal line TG.

Therefore, for example, in the row decoder 11-0 corresponding to the selected block BLK0, the transistors 50-0 to 50-7 are turned on, and thus the word lines WL0 to WL7 are respectively connected to the signal lines CG0 to CG7. On the other hand, in the row decoders 11-1 to 11-(N−1) corresponding to the unselected blocks BLK1 to BLK(N−1), the transistors 50-0 to 50-7 are turned off, and thus the word lines WL0 to WL7 are respectively disconnected from the signal lines CG0 to CG7.

1.1.6.3 Transistors 51 and 52

Next, the transistors 51 and 52 will be described. The transistors 51 and 52 are configured to transfer a voltage to the select gate line SGD. The transistors 51-0 to 51-(M−1) have first ends of current paths which are respectively connected to the select gate lines SGD0 to SGD(M−1) of the corresponding block BLK0, second ends thereof which are respectively connected to signal lines SGDD0 to SGDD(M−1), and gates which are connected in common to the signal line TG. The transistors 52-0 to 52-(M−1) have first ends of current paths which are respectively connected to the select gate lines SGD0 to SGD(M−1) of the corresponding block BLK0, second ends thereof which are connected to a node SGD_COM, and gates to which the signal RDECADn is applied. A voltage for turning off the selection transistor ST1 such as 0 V or a negative voltage VBB is applied to the node SGD_COM.

Therefore, for example, in the row decoder 11-0 corresponding to the selected block BLK0, the transistors 51-0 to 51-(M−1) are turned on, and the transistors 52-0 to 52-(M−1) are turned off. Thus, the select gate lines SGD0 to SGD(M−1) of the selected block BLK0 are respectively connected to the signal lines SGDD0 to SGDD(M−1).

On the other hand, for example, in the row decoders 11-1 to 11-(N−1) corresponding to the unselected blocks BLK1 to BLK(N−1), the transistors 51-0 to 51-(M−1) are turned off, and the transistors 52-0 to 52-(M−1) are turned on. Therefore, the select gate lines SGD0 to SGD(M−1) of the unselected blocks BLK1 to BLK(N−1) are connected to the node SGD_COM.

1.1.6.4 Transistors 53 and 54

The transistors 53 and 54 are configured to transfer a voltage to the select gate line SGS, and connections and operations thereof are equivalent to replacing the select gate line SGD with the select gate line SGS, the signal lines SGDD0 to SGDD(M−1) with the signal lines SGSD0 to SGSD(M−1), and the node SGD_COM with the node SGS_COM in the transistors 51 and 52. A voltage for turning off the selection transistor ST2 is applied to the node SGS_COM.

In other words, in the row decoder 11-0 corresponding to the selected block BLK0, the transistors 53-0 to 53-(M−1) are turned on, and the transistors 54-0 to 54-(M−1) are turned off. On the other hand, for example, in the row decoders 11-1 to 11-(N−1) corresponding to the unselected blocks BLK1 to BLK(N−1), the transistors 53-0 to 53-(M−1) are turned off, and the transistors 54-0 to 54-(M−1) are turned on.

1.1.6.5 Transistor 55

Next, the transistor 55 will be described. The transistor 55 is configured to transfer a voltage to the back gate line BG. The transistor 55 has one end of a current path connected to the back gate line BG0 of the corresponding block BLK0, the other end thereof connected to a signal line BGD, and a gate connected to the signal line TG.

Therefore, in the row decoder 11-0 corresponding to the selected block BLK0, the transistor 55 is turned on, and, in the row decoders 11-1 to 11-(N−1) corresponding to the unselected blocks BLK1 to BLK(N−1), the transistor 55 is turned off.

1.1.7 Row Driver 12

Next, a configuration of the row driver 12 will be described. The row driver 12 transfers voltages which are necessary to write, read and erase data, to the signal lines CG, SGDD, SGSD and BGD, respectively.

As shown in FIG. 8, the row driver 12 includes CG drivers 60 (60-0 to 60-7), SGD drivers 61 (61-0 to 61-(M−1)), SGS drivers 62 (62-0 to 62-(M−1)), a BG driver 64, and a voltage driver 63.

1.1.7.1 Voltage Driver 63

First, the voltage driver 63 will be described. The voltage driver 63 generates voltages VRDEC and VCGSEL used in the block decoder 40 and the CG drivers 60.

The voltage VRDEC is applied to the block decoder 40. In addition, the block decoder 40 corresponding to the selected block outputs the voltage VRDEC as a signal TG. The voltage VCGSEL is applied to the CG drivers 60. The voltage VCGSEL is used as voltages VPGM, VCGRV, and the like which should be applied to a selected word line in the read operation or the write operation.

1.1.7.2 CG Drivers 60

Next, the CG drivers 60 will be described. The CG drivers 60-0 to 60-7 respectively transfer necessary voltages to the signal lines CG0 to CG7 (the word lines WL to WL7).

The CG drivers 60 corresponding to selected word lines WL transfer the voltage VCGSEL=VPGM to corresponding signal lines CG when a program operation is performed in the write operation. In addition, in the read operation, the voltage VCGSEL=VCGRV is transferred to corresponding signal lines CG. Further, these voltages are transferred to the selected word lines WL via the current paths of the transistors 50 of the row decoders 11.

In addition, the CG drivers 60 corresponding to unselected word lines transfer a voltage VPASS or a voltage VISO (for example, 0 V) to corresponding signal lines CG when a program operation is performed. In the read operation, a voltage VREAD is transferred to corresponding signal lines CG. In addition, these voltages are transferred to the unselected word lines WL via the current paths of the transistors 50 of the row decoders 11.

In addition, in the erase operation, all the CG drivers 60 transfer a voltage VERA_WL (for example, 0.5 V) to corresponding signal lines CG.

Further, the voltages VPASS and VREAD are voltages for turning on the memory cell transistor MT regardless of data held therein, and the voltage VISO is a voltage for turning off the memory cell transistor MT regardless of data held therein.

In addition, if the signal line TG is selected, a voltage of the signal line TG is set to voltages VPGMH, VREADH and VERAH, respectively, in the read operation, the write operation or the erase operation. These voltages are respectively higher than the voltages VPGM, VREAD and VERA_WL, and enable the voltages VPGM, VREAD and VERA_WL to be transferred using the transistor 50.

In addition, the signal line CG0 may be common to the blocks BLK. In other words, the N word lines WL0 in the N blocks BLK0 to BLK(N−1) may be driven by the same CG drivers 60-0 via the transistors 50-0 of the row decoders 11-0 to 11-(N−1). This is also the same for the other signal lines CG1 to CG7, and the lines SGDD, SGSD, BGD, CGDD and CGDS. Hereinafter, this case will be described as an example.

1.1.7.3 SGD Drivers 61

Next, the SGD drivers 61 will be described. The SGD drivers 61-0 to 61-(M−1) respectively transfer necessary voltages to the signal lines SGDD0 to SGDD(M−1) (the select gate lines SGD0 to SGD(M−1)).

If the SGD drivers 61 correspond to the NAND strings 100 including selected cells, the SGD drivers 61 output a voltage VSG. This voltage is transferred to corresponding select gate lines SGD via the current paths of the corresponding transistors 51. The voltage VSG is a voltage for turning on the selection transistor ST1 in the read operation, and for turning on the selection transistor ST1 according to data to be written in the write operation.

In the erase operation, the SGD drivers 61 output a relatively high voltage VERA_GIDL which is necessary to generate gate induced drain leakage (GIDL).

1.1.7.4 SGS Drivers 62

Next, the SGS drivers 62 will be described. The SGS drivers 62-0 to 62-(M−1) respectively transfer necessary voltages to the signal lines SGSD0 to SGSD(M−1) (the select gate lines SGS0 to SGS(M−1)).

If the SGS drivers 62 correspond to the NAND strings 100 including selected cells, the SGS drivers 62 output a voltage VSG in the read operation. This voltage is transferred to corresponding select gate lines SGS via the current paths of the corresponding transistors 53. The voltage VSG is a voltage for turning on the selection transistor ST2 in the read operation. In addition, in the write operation, the transistors 54 are turned on, and thus the negative voltage VBB is transferred to corresponding select gate lines SGS.

In the erase operation, the SGS drivers 62 output the voltage VERA_GIDL.

1.1.7.5 BG Driver 64

Next, the BG driver 64 will be described. The BG driver 64 outputs the voltage VPASS in the write operation, and outputs the voltage VREAD in the read operation. These voltages are transferred to the back gate line BG via the current path of the transistor 55.

1.1.8 Source Line Driver 17

Figure 9:
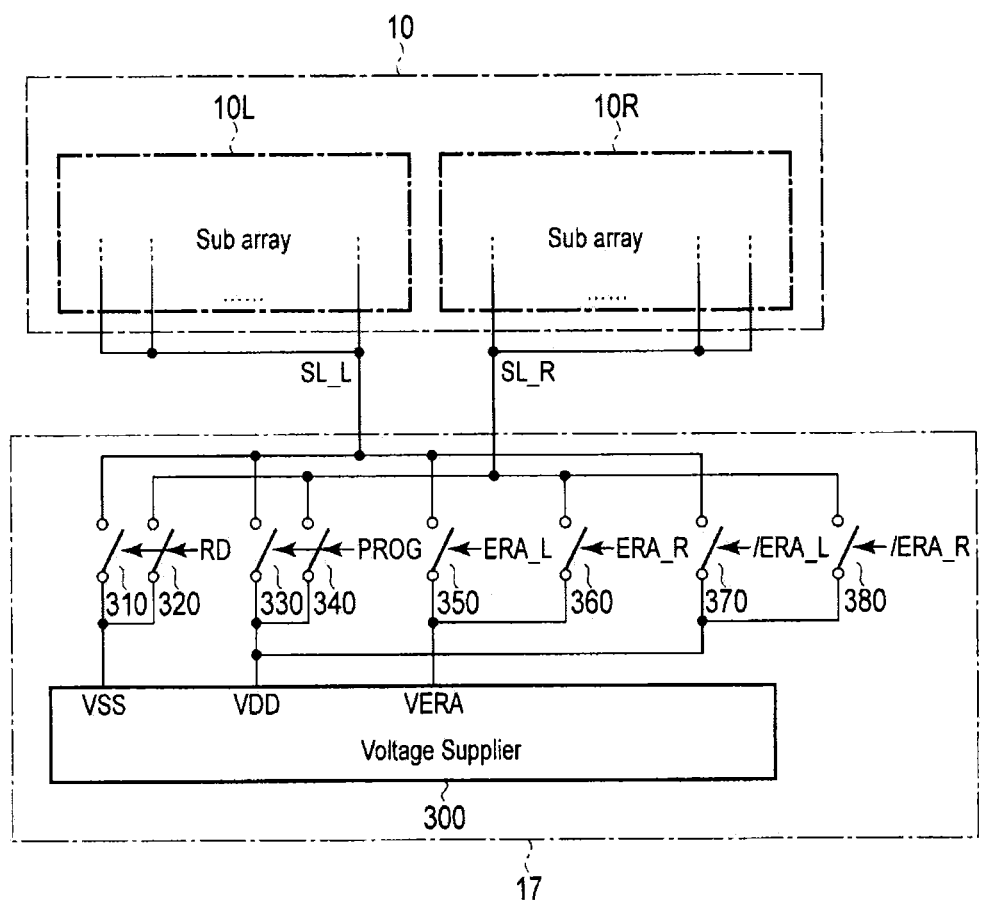
FIG. 9 is a circuit diagram of a source line driver according to the first embodiment.

Next, the source line driver 17 will be described. FIG. 9 is a circuit diagram of the source line driver 17 and the memory cell array 10.

As shown in FIG. 9, the source lines SL are divided for each sub-array. Hereinafter, the source line SL of the left sub-array 10L is referred to as a source line SL_L, and the source line SL of the right sub-array 10R is referred to as a source line SL_R.

The source line driver 17 includes a voltage supplier 300 and switching elements 310 to 380.

The voltage supplier 300 outputs a voltage VSS (for example, 0 V) in the read operation, outputs a voltage VDD (for example, 2.5 V) in the write operation, and outputs voltages VERA and VDD in the erase operation. The voltage VERA is a voltage generated by, for example, the voltage generation circuit 18.

The switching elements 310 and 320 are controlled by a control signal RD. In addition, the switching elements 310 and 320 are turned on in the read operation, so as to transfer the voltage VSS to the source lines SL_L and SL_R.

Switching elements 330 and 340 are controlled by a control signal PROG. In addition, the switching elements 330 and 340 are turned on in the write operation, so as to transfer the voltage VDD to the source lines SL_L and SL_R.

Switching elements 350 and 360 are respectively controlled by control signals ERA_L and ERA_R. The signal ERA_L is turned to an "H" level (asserted) in the erase operation for blocks of the sub-array 10L, and the signal ERA_R is turned to an "H" level in the erase operation for blocks of the sub-array 10R. In addition, the switching element 350 is turned on in the erase operation for blocks of the sub-array 10L, so as to transfer the voltage VERA to the source line SL_L. On the other hand, the switching element 360 is turned on in the erase operation for blocks of the sub-array 10R, so as to transfer the voltage VERA to the source line SL_R.

Switching elements 370 and 380 are respectively controlled by control signals /ERA_L and /ERA_R. In addition, the switching element 370 is turned on in the erase operation for blocks of the sub-array 10R, so as to transfer the voltage VDD to the source line SL_L. On the other hand, the switching element 380 is turned on in the erase operation for blocks of the sub-array 10L, so as to transfer the voltage VDD to the source line SL_R.

1.2 Operation of Semiconductor Memory Device 1

Next, an operation of the NAND type flash memory 1 with the above-described configuration will be described.

1.2.1 Read Operation

First, a read operation will be described.

1.2.1.1 Flow of Read Operation

Figure 10:
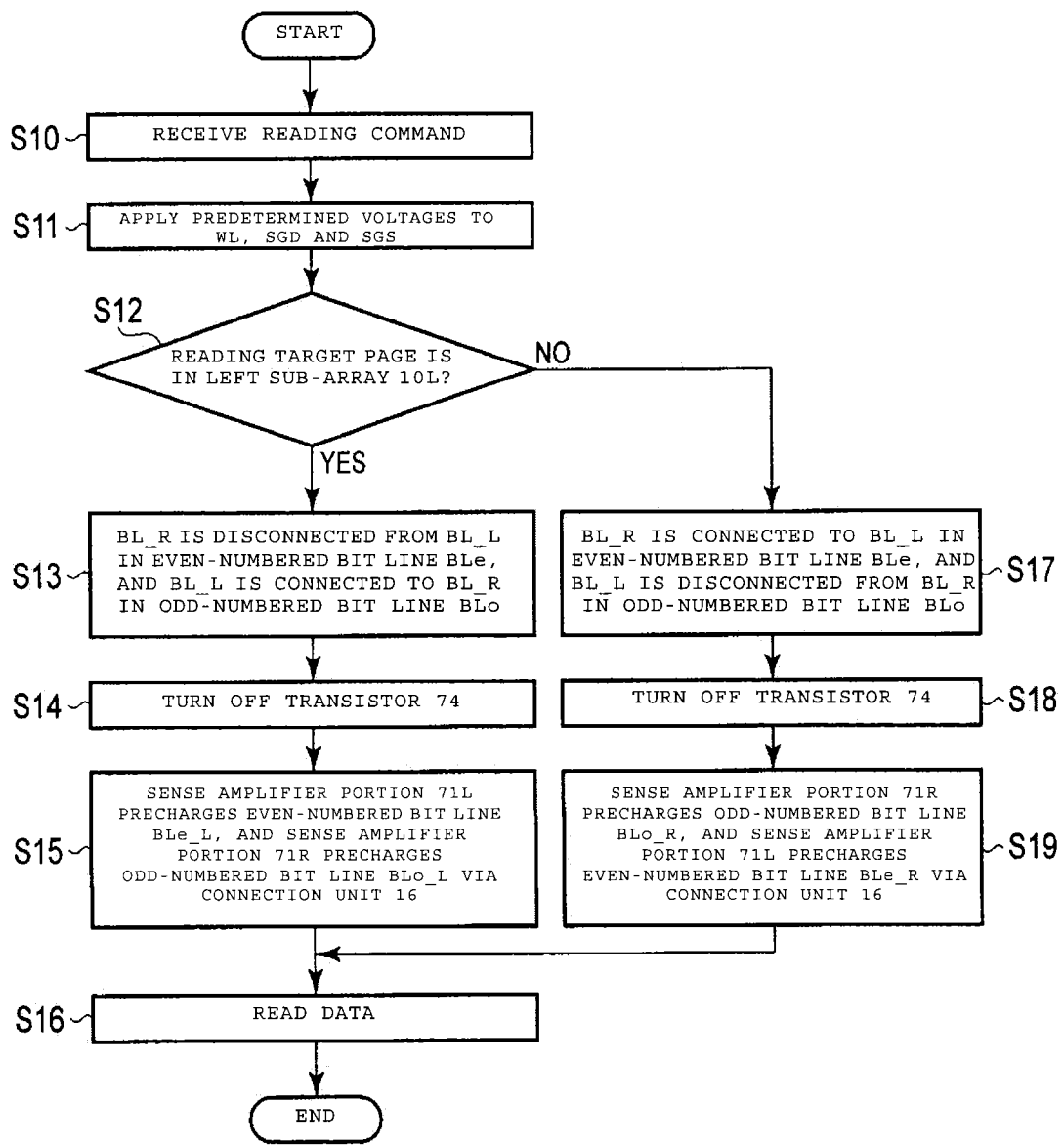
FIG. 10 is a flowchart illustrating a data reading method according to the first embodiment.

FIG. 10 is a flowchart in which attention is paid to a flow of a read operation, particularly to operations of the bit line connection unit 16, and the sense amplifier 13 when precharging is performed.

As shown in FIG. 10, first, the control circuit 19 receives a read command from the external controller or host apparatus (step S10). Then, the row driver 12 and the row decoders 11 apply desired voltages to the word lines WL and the select gate lines SGD and SGS in response to commands from the control circuit 19 (the voltages will be described later in the section 1.2.1.2.) (step S11).

As described above, if read operation is performed in the unit of a page, and a reading target page is in the left sub-array 10L (YES in step S12), the bit line connection unit 16 disconnects the right bit lines BL_R from the left bit lines BL_L in relation to the even-numbered bit lines BLe. In other words, the right bit lines BLe_R are electrically disconnected from the sense amplifier 13. In addition, the bit line connection unit 16 connects the left bit lines BL_L to the right bit lines BL_R in relation to the odd-numbered bit lines BLo. In other words, the left bit lines BLo_L are electrically connected to the sense amplifier circuits SAC (step S13) Further, the bit line connection unit 16 turns off the transistors 210L and 210R.

Successively, the sense amplifier circuits SAC turn off the transistors 74L and 74R (step S14).

Further, the sense amplifier portion 71L precharges the bit line BLe_L via the transistor 73L. In addition, the sense amplifier portion 71R precharges the bit line BLo_L via the transistor 73R, the bit line BLo_R, and the transistor 200L of the connection unit 16 (step S15).

In addition, the sense amplifier portions 71L and 71R sense currents flowing through the bit lines BLe and BLo so as to read data (step S16).

If a reading target page is in the right sub-array 10R in step S12 (NO in step S12), the bit line connection unit 16 connects the left bit lines BL_L to the right bit lines BL_R in relation to the even-numbered bit lines BLe. In other words, the right bit lines BLe_R are electrically connected to the sense amplifier circuits SAC. In addition, the bit line connection unit 16 disconnects the left bit lines BL_L from the right bit lines BL_R in relation to the odd-numbered bit lines BLo. In other words, the left bit lines BLo_L are electrically disconnected from the sense amplifier circuits SAC (step S17). Further, the bit line connection unit 16 turns off the transistors 210L and 210R.

Successively, the sense amplifier circuits SAC turn off the transistors 74L and 74R (step S18).

In addition, the sense amplifier portion 71L precharges the bit line BLe_R via the transistor 73L, the bit line BLe_L, and the transistor 200R of the connection unit 16. Further, the sense amplifier portion 71R precharges the bit lines BLo_R via the transistor 73R (step S19).

In addition, the sense amplifier portions 71L and 71R sense currents flowing through the bit lines BLe and BLo so as to read data (step S16).

1.2.1.2 Voltage Relationship

Figure 11:
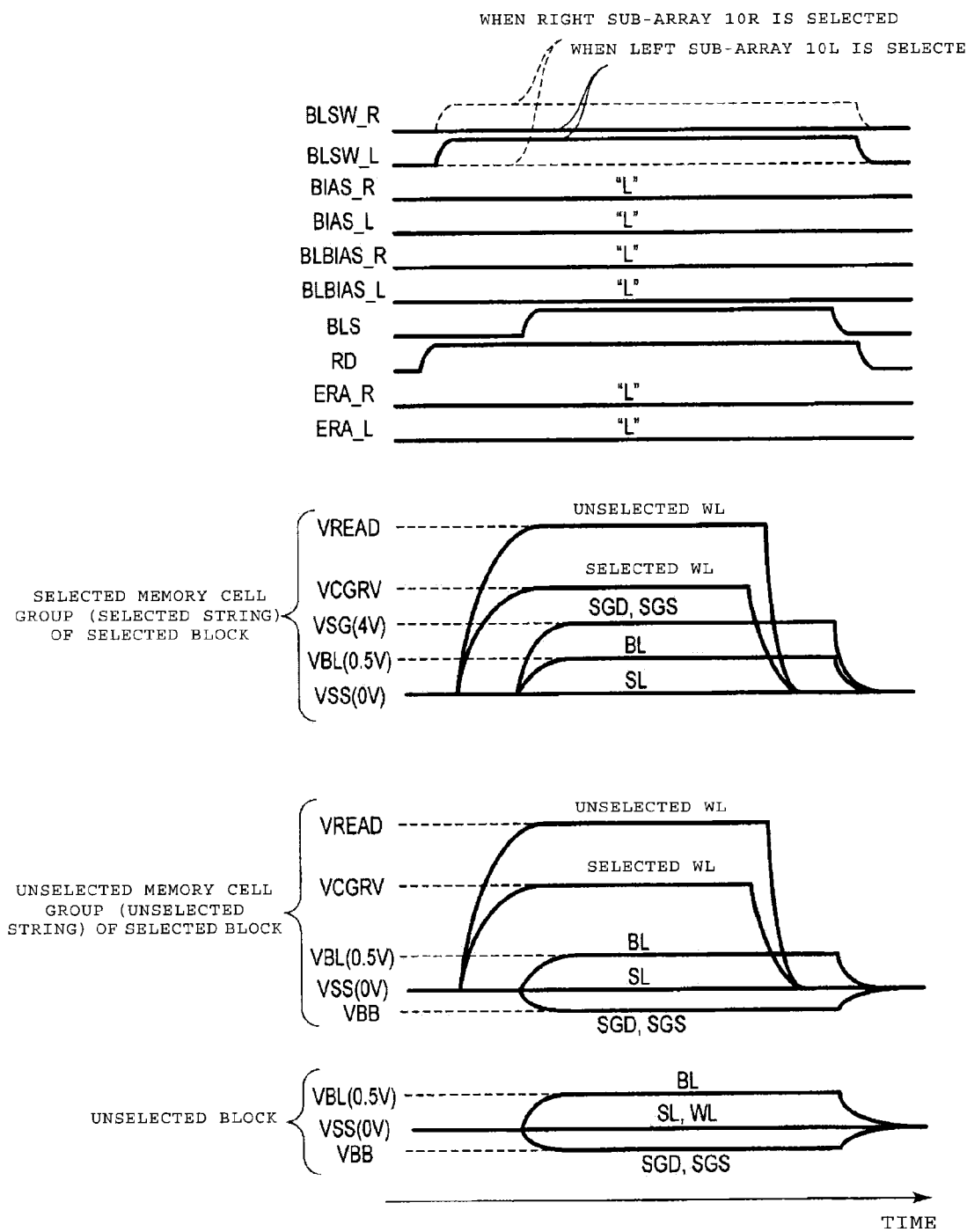
FIG. 11 is a timing chart of various signals in the read operation according to the first embodiment.

Next, a description will be made of a relationship between voltages of the signals and the lines in the read operation. FIG. 11 is a timing chart illustrating voltages of the signals and the lines in the read operation.

As shown in FIG. 11, for example, the signal RD is set to an "H" level, and the signal BLSW_R (when the right sub-array 10R is selected) or BLSW_L (when the left sub-array 10L is selected) is continuously set to an "H" level, by the control circuit 19.

In addition, the CG drivers 60 generate voltages VCGRV and VREAD. The voltage VCGRV is a voltage which should be applied to a selected word line and corresponds to data (threshold level) which is desired to be read. The voltage VREAD is a voltage for turning on the memory cell transistor regardless of data held therein (VREAD>VCGRV).

Since the transistors 50 are turned on in a selected block, the voltages VCGRV and VREAD are transferred to the word lines WL. On the other hand, since the transistors 50 are turned off in an unselected block, the word lines WL becomes floating state.

Next, voltages are transferred to the select gate lines SGD and SGS. In a selected memory group of the selected block, the voltages VSGD and VSGS (for example, 4 V; both of the two are indicated by VSG in FIG. 11) are transferred to the select gate lines SGD and SGS via the transistors 51 and 53. Thereby, the selection transistors ST1 and ST2 are turned on. In an unselected memory group of the selected block, for example, the negative voltage VBB is transferred to the select gate lines SGD and SGS by the transistors 51 and 53. Thereby, the selection transistors ST1 and ST2 are turned off. Further, in the unselected block, the voltage VBB is transferred to the select gate lines SGD and SGS by the transistors 52 and 54. Thereby, the selection transistors ST1 and ST2 are turned off.

In addition, the source line SL is set to the voltage VSS when the transistors 310 and 320 of the source line driver 17 are turned on.

Further, the signal BLS is turned to an "H" level, and thereby, for example, the voltage VBL (for example, 0.5 V) is applied to the bit line BL by the sense amplifier circuit SAC.

In the above-described way, the voltage VCGRV is applied to a control gate of the selected memory cell, and a current path thereof is electrically connected to the bit line BL and the source line SL. If the selected memory cell enters an ON state, a current flows from the bit line BL to the source line SL. The sense amplifier 13 senses this current so as to perform the read operation.

1.2.1.3 Specific Example when Left Sub-Array 10L is Selected

Figure 12:
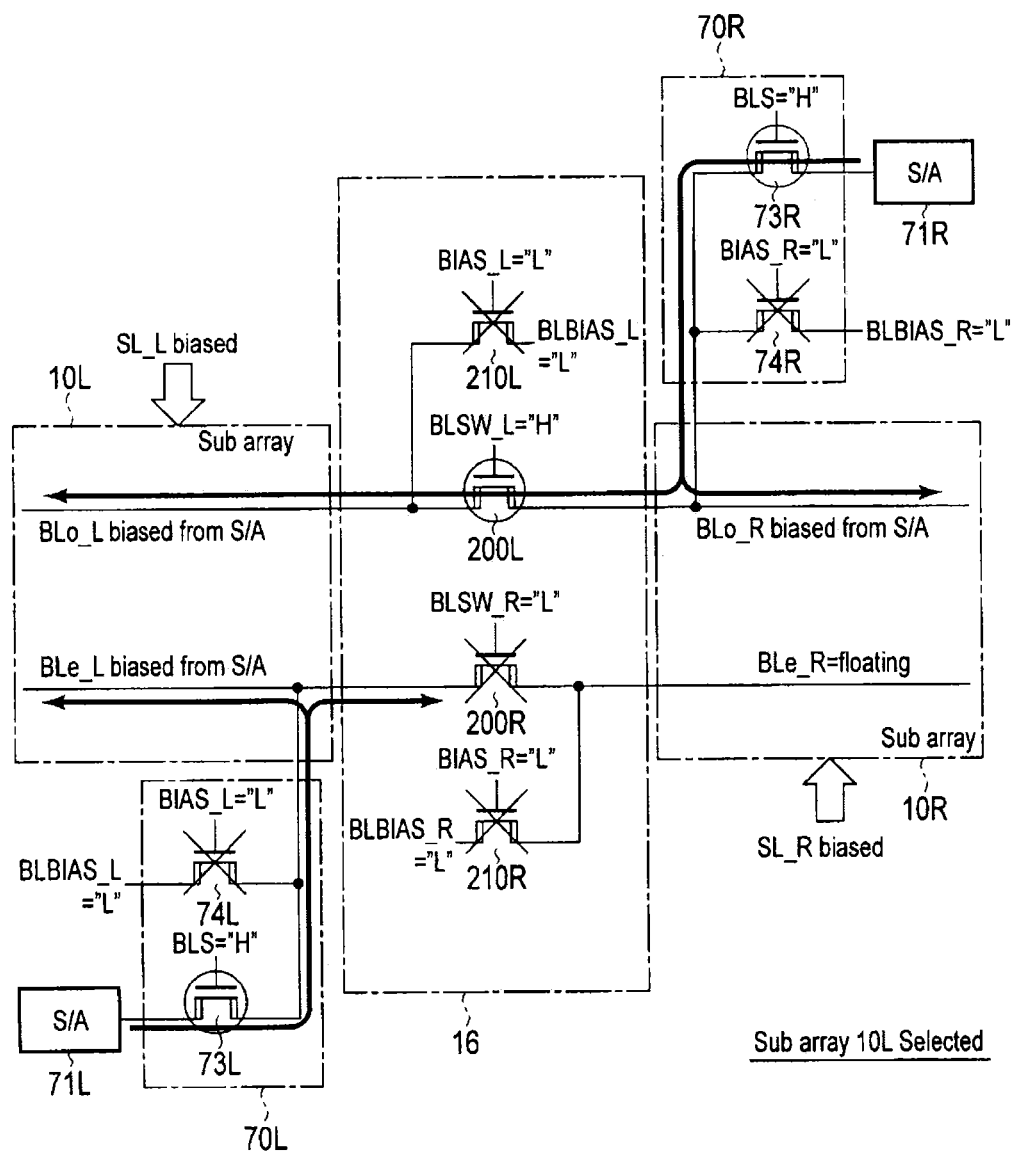
FIG. 12 is a circuit diagram illustrating the memory cell array, the sense amplifier, and the bit line connection unit according to the first embodiment.

Next, with reference to FIG. 12, a detailed description will be made of the bit line connection unit 16 and the sense amplifier circuit SAC in the read operation from the left sub-array 10L. FIG. 12 is a schematic diagram of the memory cell array 10, the bit line connection unit 16, and the sense amplifier circuit SAC. In FIG. 12, a transistor with the ○ mark is turned on, and a transistor with the X mark is turned off.

As shown in FIG. 12, since the transistor 200R is turned off in the even-numbered bit line BLe, the bit line BLe_L is electrically disconnected from the bit line BLe_R. Therefore, the sense amplifier portion 71L precharges the bit line BLe_L and does not precharge the bit line BLe_R. As a result, during a read operation, the bit line BLe_R becomes a floating state.

On the other hand, since the transistor 200L is turned on in the odd-numbered bit line BLo, the bit line BLo_L is electrically connected to the bit line BLo_R. Therefore, the sense amplifier portion 71R can precharge the bit line BLo_R, and can precharge the bit line BLo_L via the transistor 200L.

1.2.1.4 Specific Example when Right Sub-Array 10R is Selected

Figure 13:
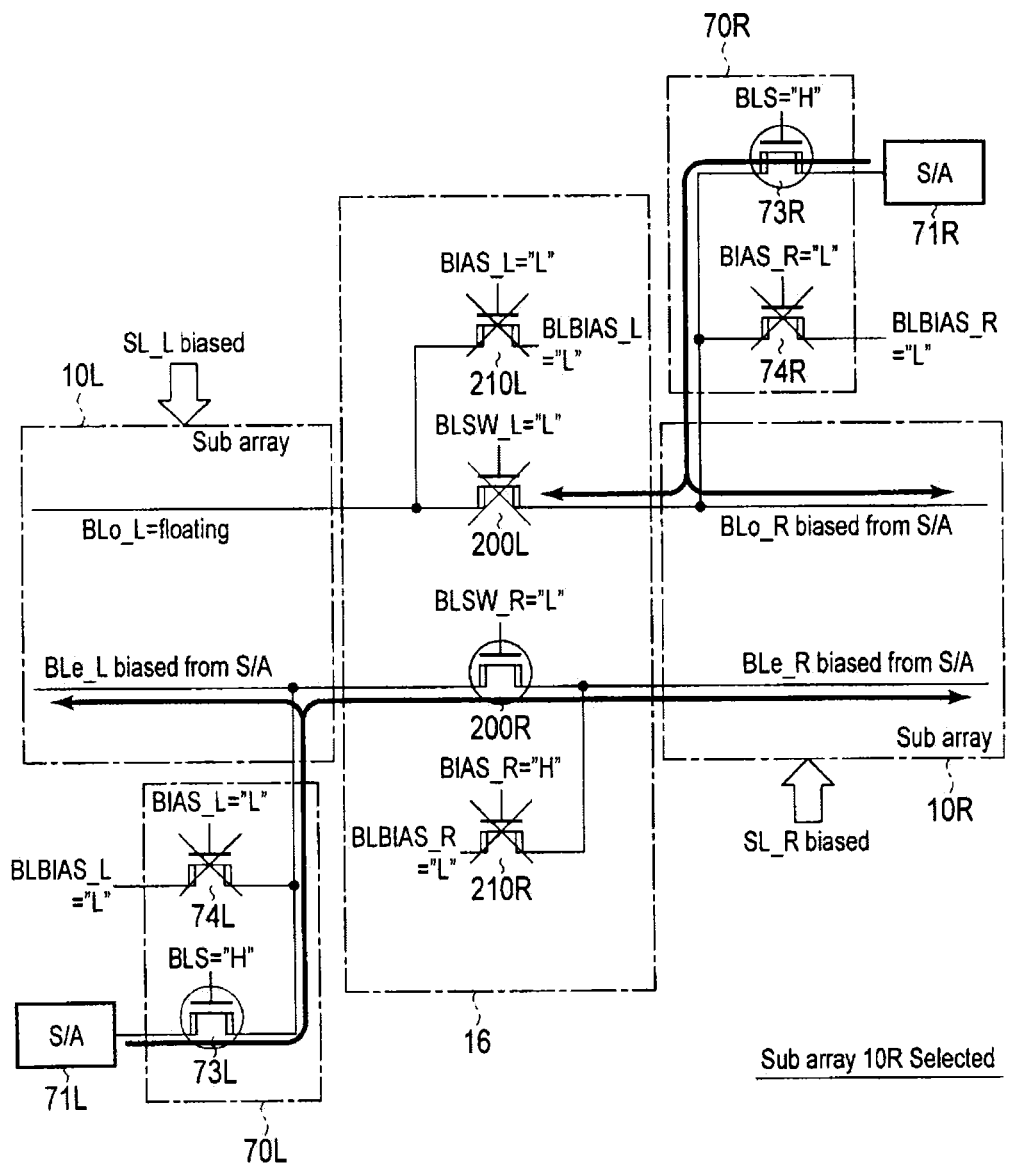
FIG. 13 is a circuit diagram illustrating the memory cell array, the sense amplifier, and the bit line connection unit according to the first embodiment.

Next, with reference to FIG. 13, a detailed description will be made of the bit line connection unit 16 and the sense amplifier circuit SAC in the read operation from the right sub-array 10R. FIG. 13 is a schematic diagram of the memory cell array 10, the bit line connection unit 16, and the sense amplifier circuit SAC. In FIG. 13, a transistor with the ○ mark is turned on, and a transistor with the X mark is turned off.

As shown in FIG. 13, an operation in this example is reverse to the case of FIG. 12.

1.2.2 Write Operation

Next, a data write operation will be described.

1.2.2.1 Flow of Write Operation

Figure 14:
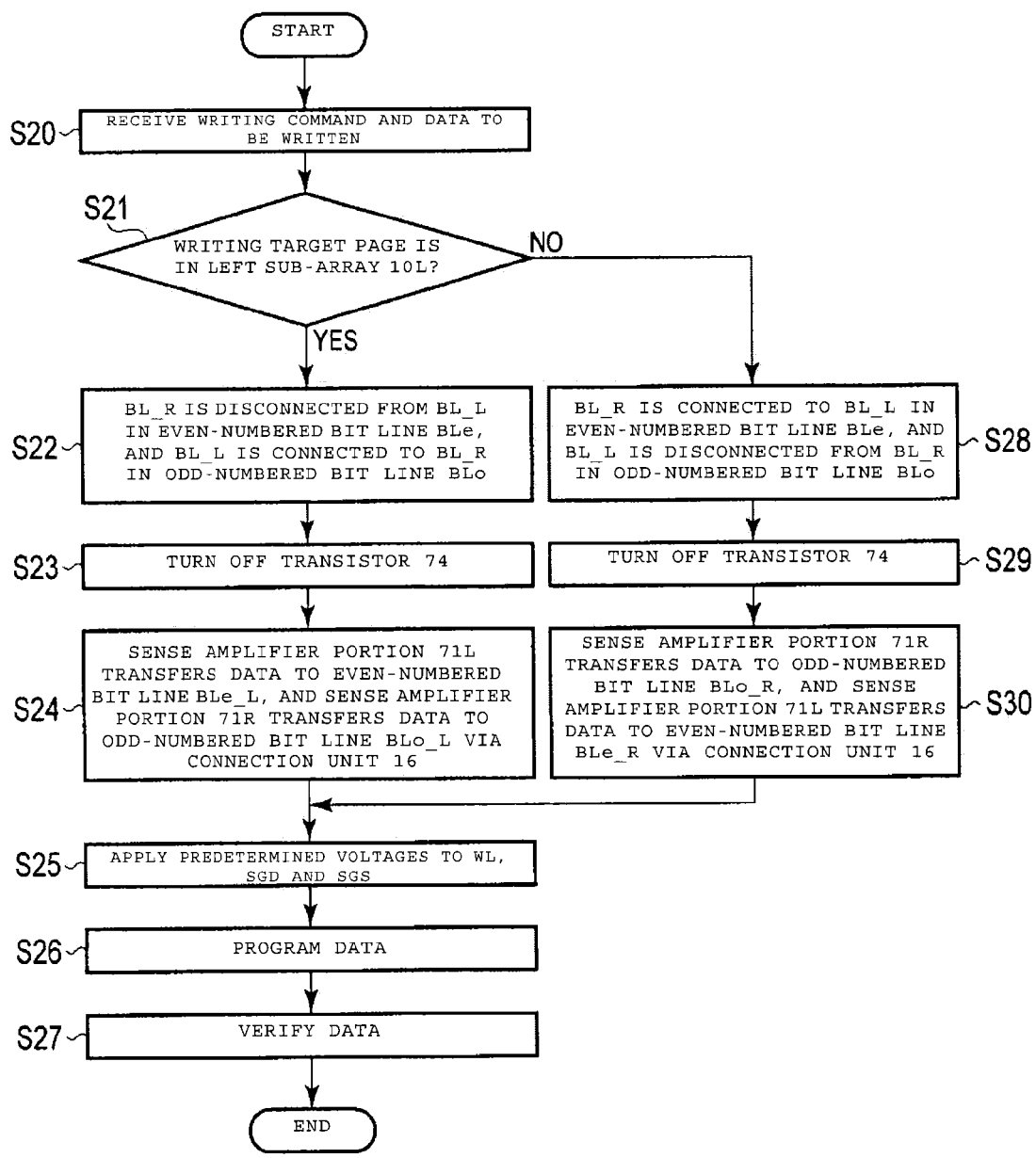
FIG. 14 is a flowchart illustrating a data writing method according to the first embodiment.

FIG. 14 is a flowchart in which attention is paid to a flow of a data write operation, particularly to operations of the bit line connection unit 16, and the sense amplifier 13 when precharging is performed.

As shown in FIG. 14, first, the control circuit 19 receives a write command and data to be written from the external controller or host apparatus (step S20).

As described above, data is written in the unit of a page. If a target page is in the left sub-array 10L (YES in step S21), the bit line connection unit 16 disconnects the right bit lines BLe_R from the left bit lines BLe_L in relation to the even-numbered bit lines BLe. In other words, the right bit lines BLe_R are electrically disconnected from the sense amplifier 13. In addition, the bit line connection unit 16 connects the left bit lines BLo_L to the right bit lines BLo_R in relation to the odd-numbered bit lines BLo. In other words, the left bit lines BLo_L are electrically connected to the sense amplifier circuits SAC (step S22). Further, the bit line connection unit 16 turns off the transistors 210L and 210R.

Successively, the sense amplifier circuits SAC turn off the transistors 74L and 74R (step S23).

Further, the sense amplifier portion 71L transfers data to be written to the bit lines BLe_L via the transistor 73L. That is, a voltage corresponding to the data to be written is applied to the bit line BLe_L. In addition, the sense amplifier portion 71R transfers data to be written to the bit line BLo_L via the transistor 73R, the bit line BLo_R, and the transistor 200L of the connection unit 16 (step S24).

In addition, the row driver 12 and the row decoders 11 apply desired voltages to the word lines WL and the select gate lines SGD and SGS in response to commands from the control circuit 19 (the voltages will be described later in the section 1.2.2.2.) (step S25). As a result, the data is programmed in the left sub-array 10L (step S26). Subsequently, the written data is verified, that is, a verify operation is performed in the write operation (step S27).

If a target page is in the right sub-array 10R in step S21 (NO in step S21), the bit line connection unit 16 connects the right bit lines BLe_R to the left bit lines BLe_L in relation to the even-numbered bit lines BLe. In other words, the right bit lines BLe_R are electrically connected to the sense amplifier circuits SAC. In addition, the bit line connection unit 16 disconnects the left bit lines BLo_L from the right bit lines BLo_R in relation to the odd-numbered bit lines BLo. In other words, the left bit lines BLo_L are electrically disconnected from the sense amplifier circuits SAC (step S28) Further, the bit line connection unit 16 turns off the transistors 210L and 210R.

Successively, the sense amplifier circuits SAC turn off the transistors 74L and 74R (step S29).

In addition, the sense amplifier portion 71L transfers data to be written to the bit line BLe_R via the transistor 73L, the bit line BLe_L, and the transistor 200R of the connection unit 16. Further, the sense amplifier portion 71R transfers data to be written to the bit lines BLo_R via the transistor 73R (step S30). Thereafter, the flow proceeds to step S25.

1.2.2.2 Voltage Relationship

Figure 15:
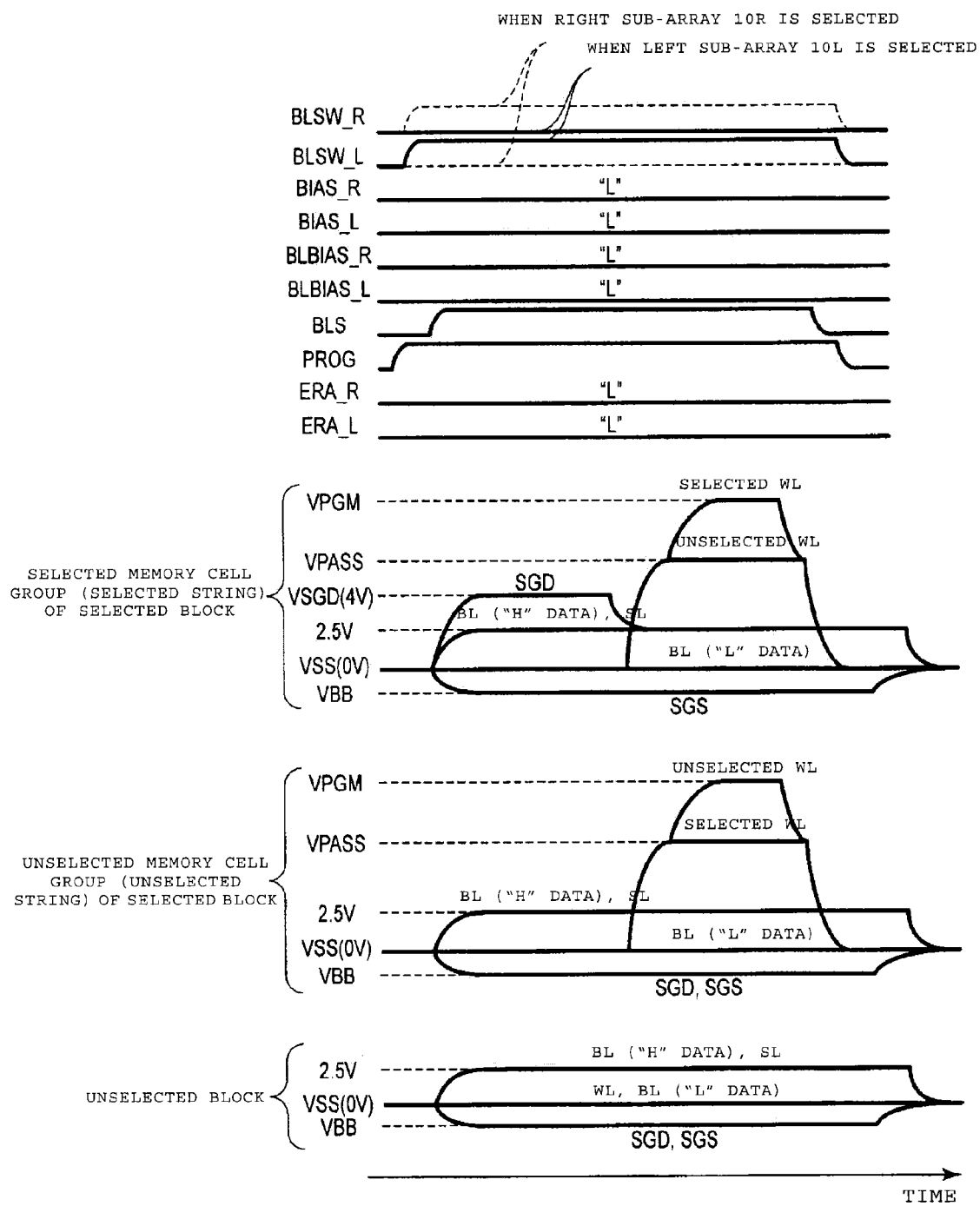
FIG. 15 is a timing chart of various signals in the write operation according to the first embodiment.

Next, a description will be made of a relationship between voltages of the signals and the lines in the program operation. FIG. 15 is a timing chart illustrating voltages of the signals and the lines in the program operation.

As shown in FIG. 15, for example, the signal PROG is set to an "H" level, and the signal BLSW_R or BLSW_L is continuously set to an "H" level, by the control circuit 19.

In addition, the signal BLS is turned to an "H" level, and thereby the sense amplifier 13 transfers data to be written to each bit line BL. If a threshold value is increased by injecting electric charge into the charge storage layer, a signal of an "L" level (for example, VSS=0 V) is applied to the bit line BL, and, otherwise, a signal of an "H" level (for example, VDD=2.5 V) is applied thereto. In addition, the transistors 330 and 340 of the source line driver 17 are turned on, and thus the voltage VDD is applied to the source line SL.

Further, in the row decoder 11, the block decoder 40 decodes the block address BA, and thereby the signal line TG of a selected block is set to an "H" level, and, as a result, the transistors 50, 51, 53 and 55 of the row decoder 11 are turned on. In addition, in the row decoder 11 corresponding to an unselected block, the signal line TG is set to an "L" level (for example, VBB), and thus the transistors 50, 51, 53 and 55 are turned off, and the transistors 52 and 54 are turned on.

Therefore, in the unselected block, the negative voltage VBB is transferred to the select gate lines SGD and SGS by the transistors 52 and 54, and thus both of the selection transistors ST1 and ST2 are turn off.

On the other hand, in a selected block, the voltage VSGD (for example, 4 V) is transferred to the select gate line SGD corresponding to a memory group including a selected page, and the negative voltage VBB is transferred to the select gate line SGS, by the SGD driver 61 and the SGS driver 62. Therefore, the selection transistor ST1 is turned on and the selection transistor ST2 is turned off in the corresponding memory group. The negative voltage VBB is transferred to the select gate lines SGD and SGS corresponding to the other memory groups. Therefore, both of the selection transistors ST1 and ST2 are turned off in these memory groups.

Subsequently, the voltage VSGD is reduced from 4 V to about 2.5 V. This voltage is a voltage for turning on the selection transistor ST1 if "L" data is transferred to the bit line BL, and is a voltage for turning off the selection transistor ST1 if "H" data is transferred thereto.

In addition, the CG drivers 60 transfer voltages to the respective signal lines CG. In other words, the CG driver 60 corresponding to a selected word line transfers the voltage VPGM, and the CG drivers 60 corresponding to unselected word lines transfer the voltage VPASS (or VISO). The voltage VPGM is a high voltage for injecting electric charge into the charge storage layer. In addition, the voltage VPASS is a voltage for turning on the memory cell transistor regardless of data held therein (here, VPASS<VPGM). The voltage VISO is a voltage for turning off the memory cell transistor regardless of data held therein (VISO<VPASS). Then, in the selected block, since the transistors 50 are turned on, these voltages are transferred to the word lines WL0 to WL7. On the other hand, in the unselected block, since the transistors 50 are turned off, these voltages are not transferred to the word lines WL. In other words, the word lines WL0 to WL7 of the unselected block are electrically floated.

In the above-described way, in the selected memory cell, the voltage VPGM is applied to the control gate, and thus a channel is set to 0 V. Thereby, electric charge is injected into the charge storage layer, and thereby a threshold level of the selected memory cell increases. In the unselected memory cell, a channel becomes a floating state, and a voltage thereof increases through coupling with the periphery. Thereby, a threshold level of the selected memory cell does not vary.

Details of operations of the bit line connection unit 16 and the sense amplifier circuits SAC in the program operation in each of the sub-arrays 10L and 10R are the same as the operations described with reference to FIGS. 12 and 13.

1.2.3 Erase Operation

Next, a data erase operation will be described.

1.2.3.1 Flow of Erase Operation

Figure 16:
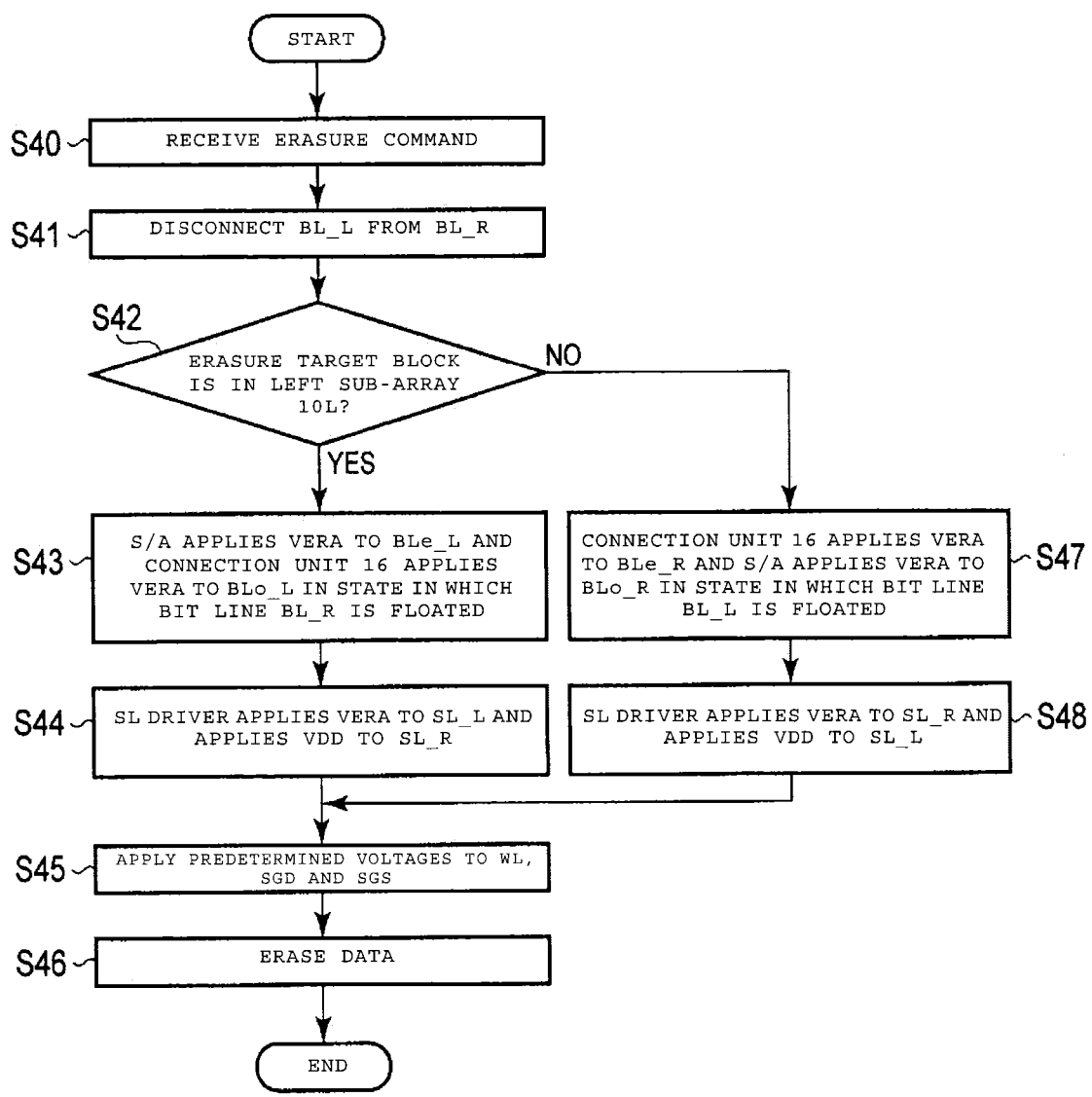
FIG. 16 is a flowchart illustrating a data erasing method according to the first embodiment.

FIG. 16 is a flowchart in which attention is paid to a flow of a data erase operation, particularly to operations of the bit line connection unit 16, and the sense amplifier 13 when precharging is performed.

As shown in FIG. 16, first, the control circuit 19 receives an erase command from the external controller or host apparatus (step S40). Then, the bit line connection unit 16 electrically disconnects the left bit lines BL_L from the right bit lines BL_R in all the bit lines BL regardless of the even-numbered bit lines BLe and the odd-numbered bit lines BLo in response to commands from the control circuit 19 (step S41).

As described above, the erase operation is performed in the unit of a block, but if a target block is in the left sub-array 10L (YES in step S42), the sense amplifier portion 71L applies the voltage VERA to the even-numbered left bit lines BLe_L, and the transistor 210L of the connection unit 16 transfers the voltage VERA to the odd-numbered left bit lines BLo_L (step S43). The right bit lines BLe_R and BLo_R becomes a floating state.

Further, the transistors 350 and 380 are turned on, and thereby the source line driver 17 applies the voltage VERA to the left source lines SL_L and applies the voltage VDD to the right source lines SL_R (step S44).

In addition, the row driver 12 and the row decoders 11 apply desired voltages to the word lines WL and the select gate lines SGD and SGS (the voltages will be described later in the section 1.2.3.2.) (step S45). As a result, data is erased (step S46).

If an target block is in the right sub-array 10R in step S42 (No in step S42), the sense amplifier portion 71R applies the voltage VERA to the odd-numbered right bit lines BLo_R, and the transistor 210R of the connection unit 16 transfers the voltage VERA to the even-numbered right bit lines BLe_R (step S47). The left bit lines BLe_L and BLo_L becomes a floating state.

Further, the transistors 360 and 370 are turned on, and thereby the source line driver 17 applies the voltage VERA to the right source lines SL_R and applies the voltage VDD to the left source lines SL_L (step S48). Successively, the flow proceeds to step S45.

1.2.3.2 Voltage Relationship

Figure 17:
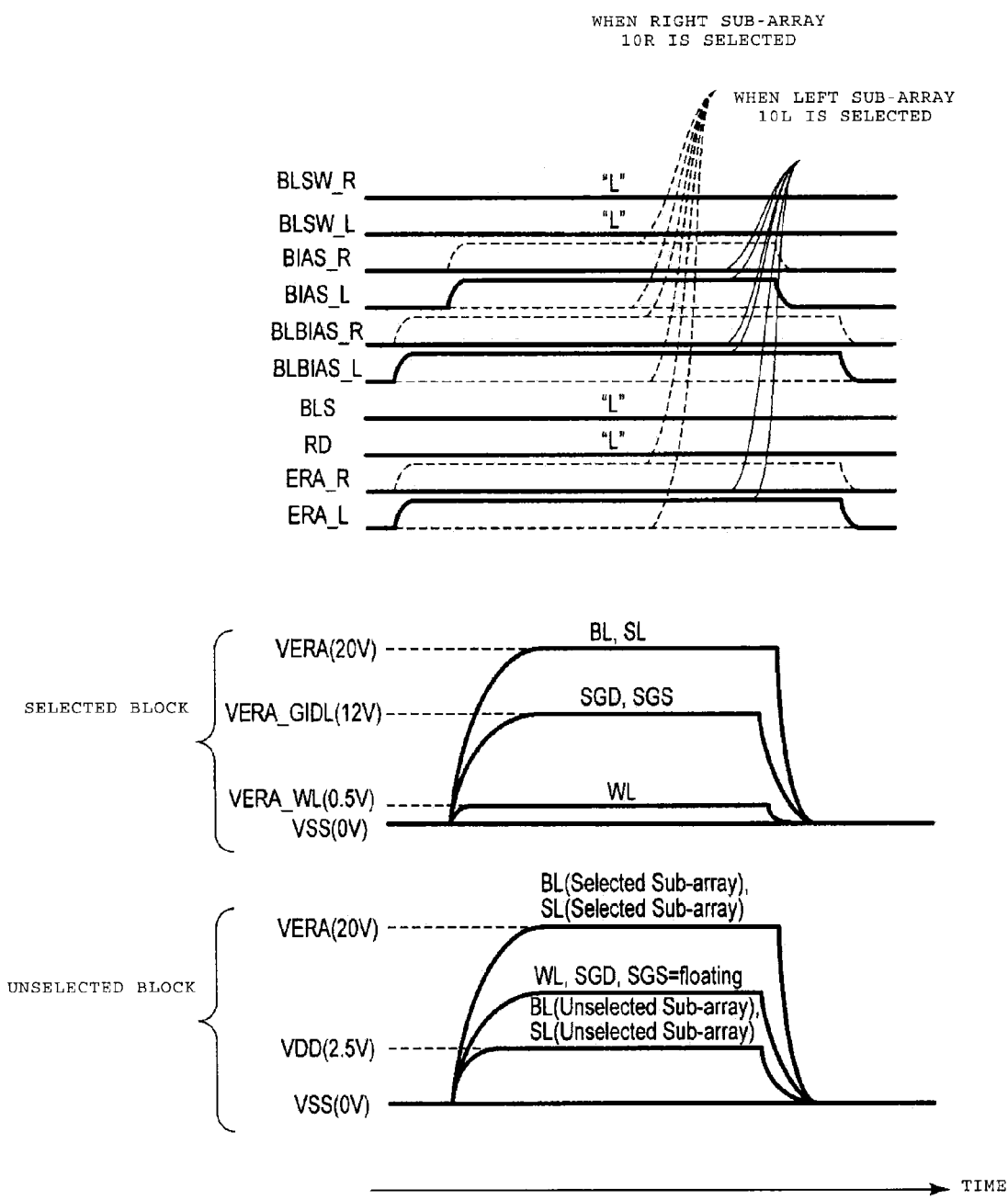
FIG. 17 is a timing chart of various signals in the erase operation according to the first embodiment.

Next, a description will be made of a relationship between voltages of the signals and the lines in the erase operation. FIG. 17 is a timing chart illustrating voltages of the signals and the lines in the erase operation.

As shown in FIG. 17, for example, the signal ERA_R (when the right sub-array 10R is selected) or ERA_L (when the left sub-array 10L is selected) is set to an "H" level, by the control circuit 19. Further, the signal BIAS_R (when the right sub-array 10R is selected) or BIAS_L (when the left sub-array 10L is selected) is set to an "H" level. In addition, the signal BLBIAS_R (when the right sub-array 10R is selected) or BLBIAS_L (when the left sub-array 10L is selected) is set to an "H" level. A voltage of the signal BLBIAS_R or BLBIAS_L which is set to an "H" level is VERA. In addition, during the erase operation, both the signals BLSW_R and BLSW_L are in an "L" level.

In addition, in a selected sub-array, the voltage VERA (for example, 20 V) is applied to the bit line BL by the sense amplifier 13 or the transistor 210 of the bit line connection unit 16. Further, the voltage VERA is applied to the source line SL by the source line driver 17. Furthermore, the voltage VERA_WL (for example, 0.5 V) is applied to all the word lines WL by the CG drivers 60, and the voltage VERA_GIDL (for example, 12 V) is applied to the select gate lines SGD and SGS of the target block by the SGD drivers 61 and the SGS drivers 62. Thereby, gate induced drain leakage (GIDL) occurs in the select gate line ends, and thus data is erased.

In the unselected blocks, the select gate lines SGD and SGS becomes a floating state. For this reason, GIDL does not occur, and thus data is not erased.

Figure 18:
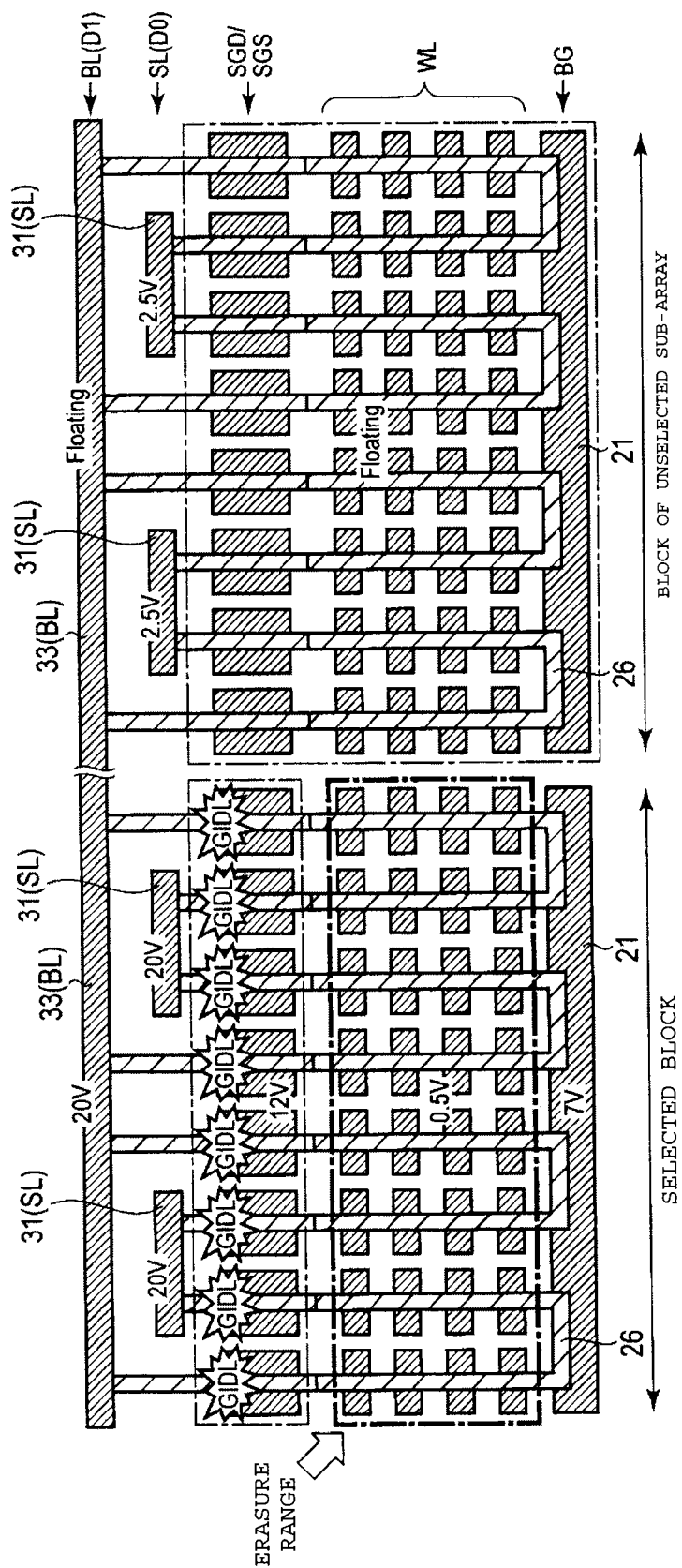
FIG. 18 is a cross-sectional view of the memory cell array according to the first embodiment.

FIG. 18 is a cross-sectional view of the memory cell array 10, and shows a selected block and a block of an unselected sub-array in the erase operation. As shown in FIG. 18, since the bit line of the selected sub-array is electrically disconnected from the bit line of the unselected sub-array, the bit line of the unselected sub-array becomes a floating state.

1.2.3.3 Specific Example when Left Sub-Array 10L is Selected

Figure 19:
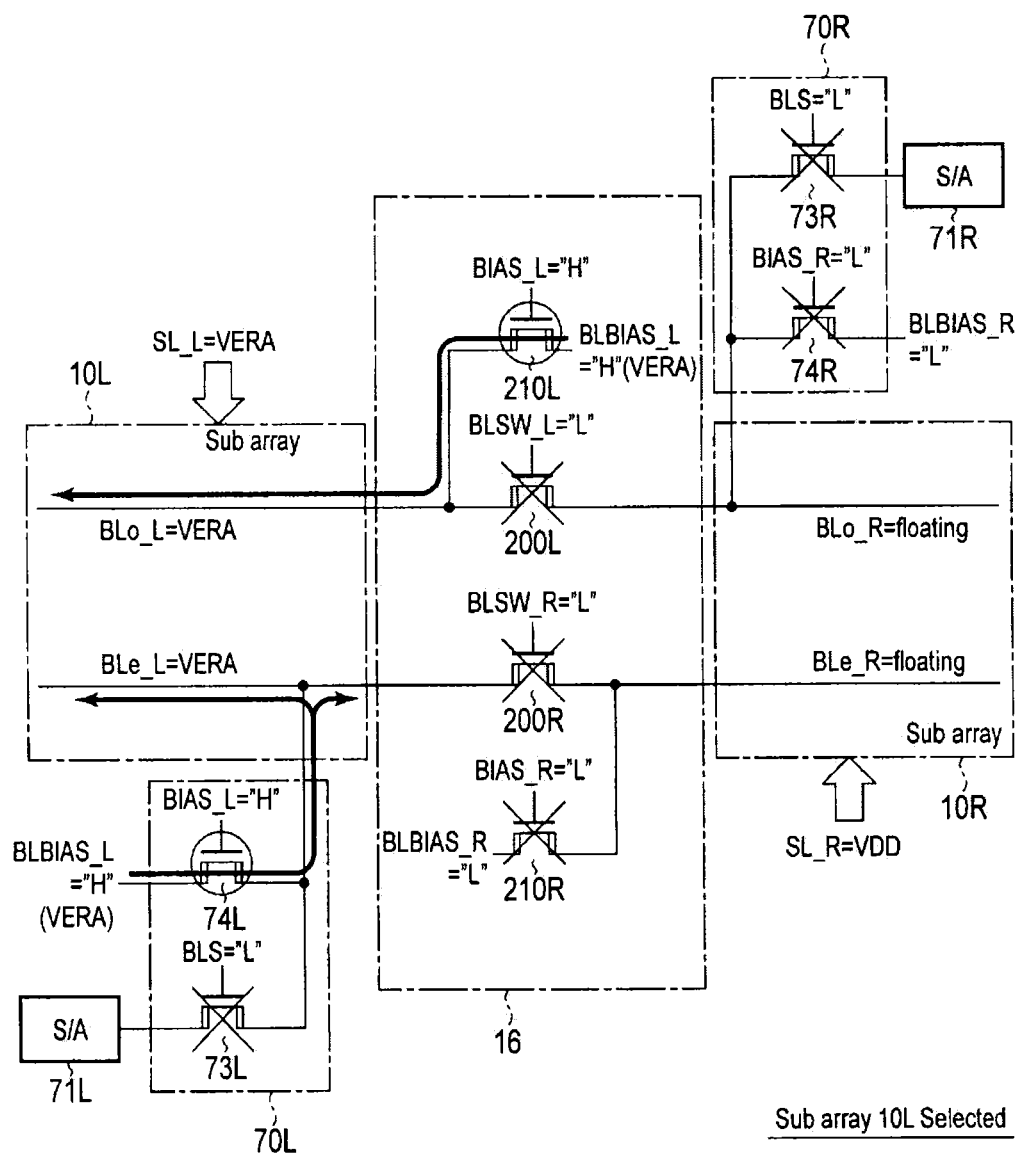
FIG. 19 is a circuit diagram illustrating the memory cell array, the sense amplifier, and the bit line connection unit according to the first embodiment.

Next, with reference to FIG. 19, a detailed description will be made of the bit line connection unit 16 and the sense amplifier circuit SAC in the erase operation for a block of the left sub-array 10L. FIG. 19 is a schematic diagram of the memory cell array 10, the bit line connection unit 16, and the sense amplifier circuit SAC. In FIG. 19, a transistor with the ○ mark is turned on, and a transistor with the X mark is turned off.

First, the even-numbered bit line BLe will be described. As shown in FIG. 19, in relation to the even-numbered bit line BLe, the transistors 200R and 210R are turned off in the bit line connection unit 16. Therefore, the right bit line BLe_R becomes a floating state. In addition, the transistor 74L of the sense amplifier circuit SAC is turned on such that the left bit line BLe_L is charged to the voltage VERA.

In relation to the odd-numbered bit line BLo, the transistor 200L is turned off in the bit line connection unit 16, and the transistors 73R and 74R of the sense amplifier circuit SAC are turned off. Therefore, the right bit line BLo_R becomes a floating state. In addition, the transistor 210L of the bit line connection unit 16 is turned on such that the left bit line BLo_L is charged to the voltage VERA.

In addition, the source line driver 17 applies the erase voltage VERA to the left source line SL_L and applies the voltage VDD lower than the erase voltage to the right source line SL_R.

1.2.3.4 Specific Example when Right Sub-Array 10R is Selected

Figure 20:
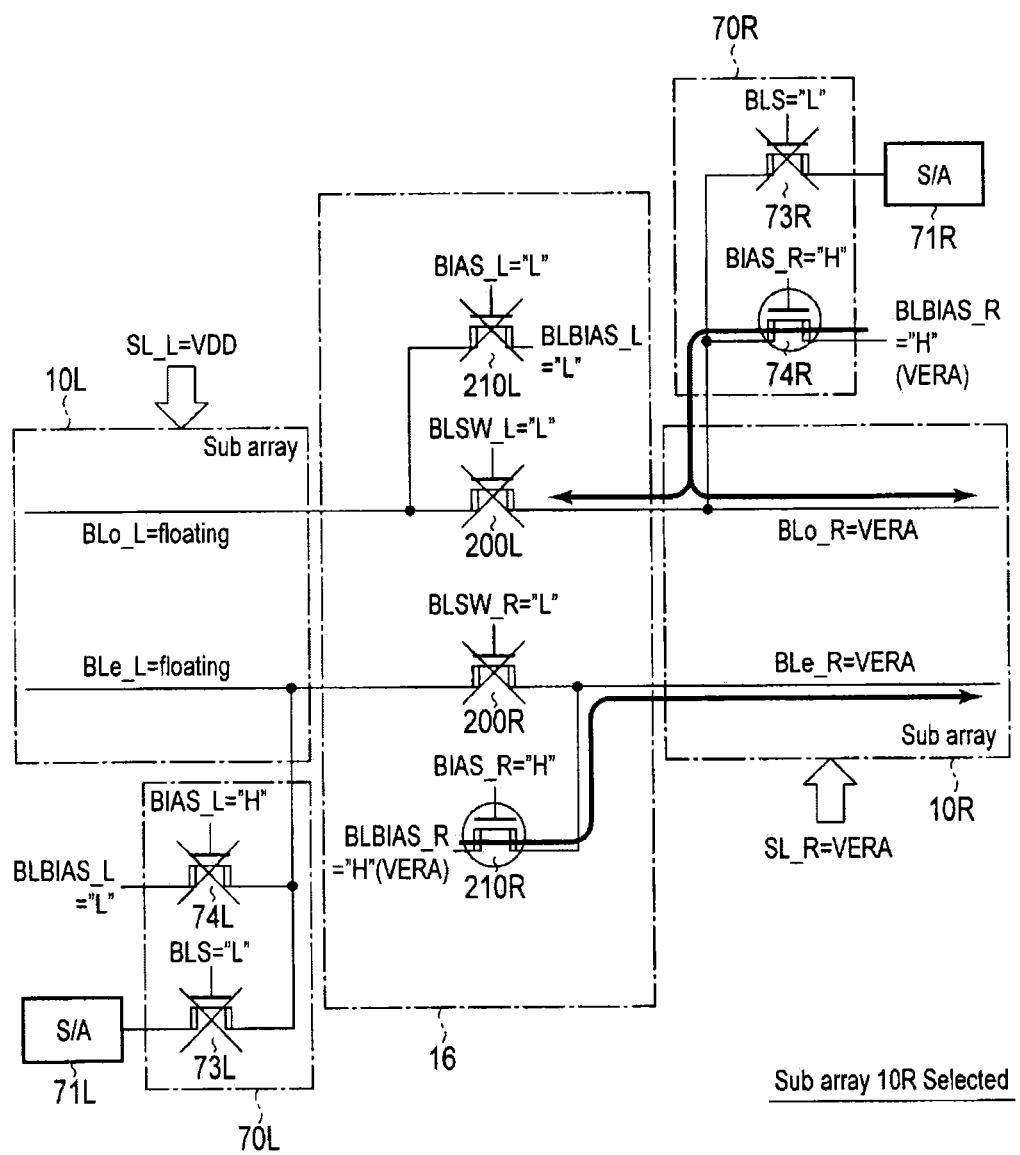
FIG. 20 is a circuit diagram illustrating the memory cell array, the sense amplifier, and the bit line connection unit according to the first embodiment.

Next, with reference to FIG. 20, a detailed description will be made of the bit line connection unit 16 and the sense amplifier circuit SAC in the erase operation for a block of the right sub-array 10R. FIG. 20 is a schematic diagram of the memory cell array 10, the bit line connection unit 16, and the sense amplifier circuit SAC. In FIG. 20, a transistor with the ○ mark is turned on, and a transistor with the X mark is turned off.

As shown in FIG. 20, an operation when the right sub-array 10R is selected is reverse to the operation when the left sub-array 10L is selected.

1.4 Effects According to Present Embodiment

According to the first embodiment, it is possible to improve an operation speed of the NAND type flash memory 1. This effect will be described below.

In the three-dimensional NAND type flash memory described in the embodiment, memory cells become highly dense, and thus parasitic capacitances of the bit line, the word line, the source line, and the like tend to increase as compared with a NAND type flash memory (hereinafter, referred to as a planar NAND flash memory) in which memory cells are arranged in a two-dimensional manner.

In relation to the parasitic capacitance, for example, in terms of word lines, in addition to an adjacent capacitance (this is also present in the planar NAND flash memory) between word lines in a transverse direction, there is present a capacitance between word lines adjacent in a longitudinal direction. In addition, in terms of bit lines, the number of strings connected to a single bit line increases in a two-dimensional plane which is viewed from the top. For this reason, there are cases where parasitic capacitances between a bit line and a plug portion which connects the bit line to a string and between a source line, and a select gate line increase by about twice per unit length as compared with the planar NAND flash memory.

Further, in a layout in which a sense amplifier is disposed under a memory cell array, a chip size is reduced, and thus there is an advantage in that final costs can be reduced. In this case, however, lines are required to be disposed over and under the memory cell array in order to supply signals or power to the lower portion of the memory cell array. In addition, this may also be a cause of increasing a parasitic capacitance of the source line or the bit line.

In relation to this factor, in the configuration according to the present embodiment, the bit lines are divided and controlled by bit line dividing transistors (transistors 200R and 200L), and thereby the memory cell array is divided into an active region where a page to be accessed is present and another inactive region. In addition, only the active region is biased to a necessary voltage, and thus it is possible to reduce a parasitic capacitance component and to thereby achieve high speed related to a column system and reduce current consumption.

More specifically, in the read operation or the write operation, a bit line which is not connected to the sense amplifier in the inactive region becomes a floating state. Therefore, a bit line capacitance effectively becomes ½ or ¾, and thus access speed and current consumption can be improved.

Approximately eighty percent of parasitic capacitances of bit lines is derived from adjacent bit lines. In relation to this fact, for example, in the example of FIG. 12, a bit line capacitance seems to become ½ when viewed from the sense amplifier circuit 71L. In addition, a bit line capacitance seems to become ¾ when viewed from the sense amplifier circuit 71R. Therefore, charging and discharging speed of a bit line can be increased in proportion thereto, and thus current consumption can be reduced.

In addition, in the erase operation, a bit line of the inactive region where there is no erase target block becomes a floating state, and a source line is biased to a voltage lower than an erase voltage. Therefore, capacitances of the bit line and the source line to which the erase voltage should be applied effectively become ½, and thus current consumption can be improved.

For example, in the example of FIG. 19, a region where the erase voltage should be applied to the source line is only the left sub-array 10L, and thus a voltage which should be applied to the source line of the right sub-array 10R may be a lower voltage. In other words, a region where the erase voltage should be applied can be reduced to a half of the related art, and thus current consumption can also be reduced to a half.

In addition, the sense amplifier and the bit line dividing transistors are disposed under the memory cell array. Thereby an area penalty caused by providing the bit line connection unit can be suppressed. Therefore, a chip size can be reduced, and thereby costs can be reduced as a whole.

In addition, the transistors 200L, 200R, 210L and 210R of the bit line connection unit have a gate oxide film which is thicker than, for example, the memory cell transistor or the transistors of the sense amplifier portion 71. Thereby, these transistors can be suppressed from being damaged or characteristics thereof can be suppressed from deteriorating due to application of a high voltage in the erase operation.

2. Second Embodiment

Next, a semiconductor memory device according to the second embodiment will be described. The present embodiment is different from the first embodiment in that a source line of an unselected sub-block becomes a floating state in the erase operation. Hereinafter, only the differences from the first embodiment will be described.

2.1 Configuration of Source Line Driver

Figure 21:
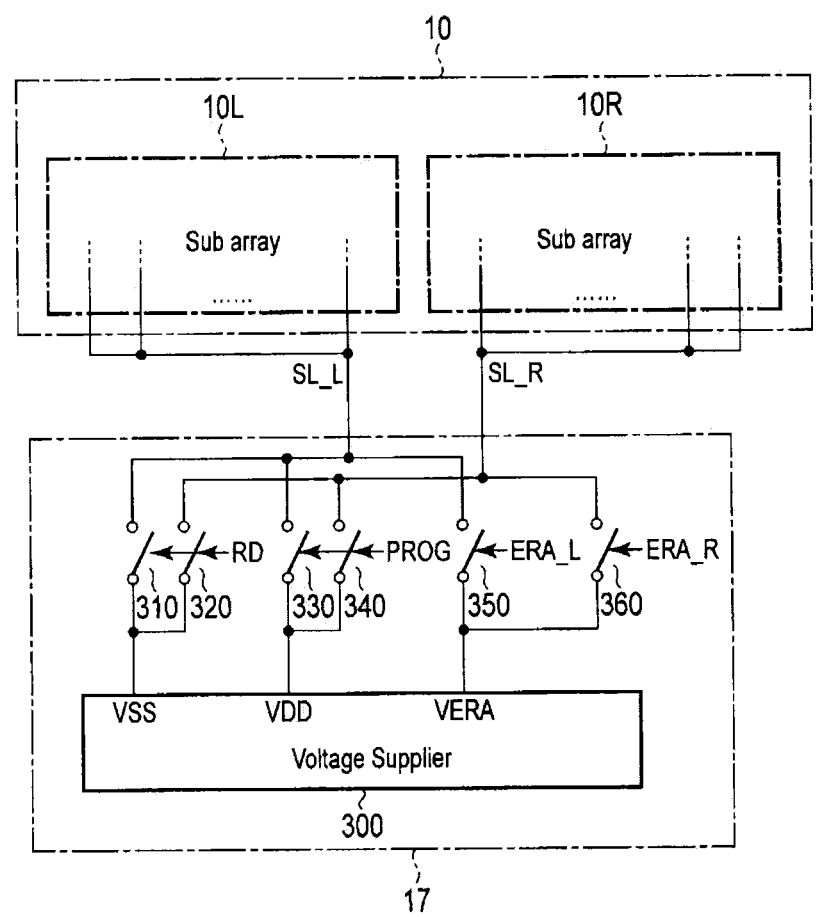
FIG. 21 is a circuit diagram of a source line driver according to a second embodiment.

FIG. 21 is a circuit diagram of a source line driver 17 according to the present embodiment. As shown in FIG. 21, the source line driver 17 according to the present embodiment has a configuration in which the switching elements 370 and 380 are omitted from the configuration of FIG. 9 described in the first embodiment.

2.2 Erase Operation

Figure 22:
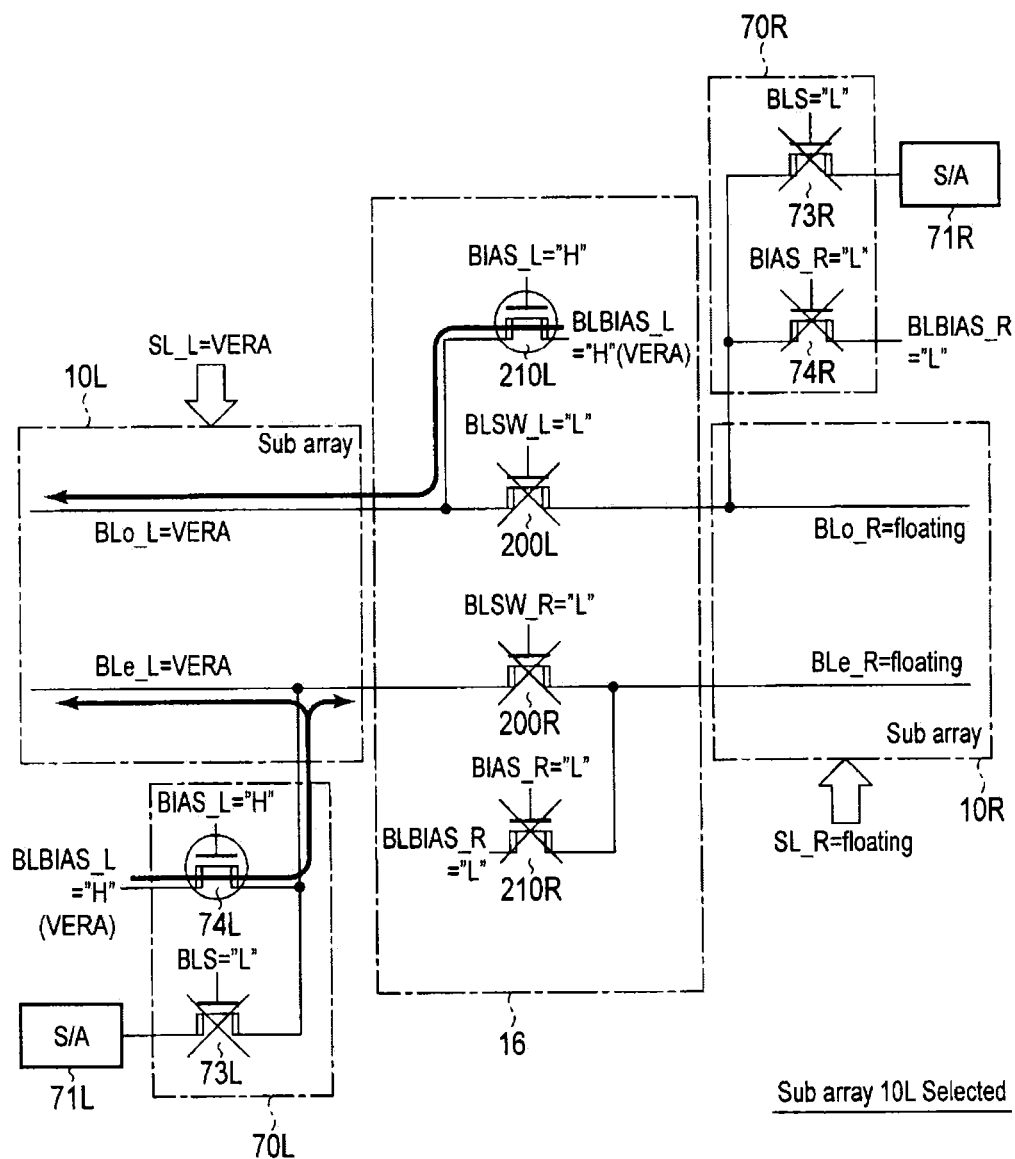
FIG. 22 is a circuit diagram illustrating a memory cell array, a sense amplifier, and a bit line connection unit according to the second embodiment.

Next, an erase operation according to the present embodiment will be described with reference to FIG. 22. FIG. 22 is a circuit diagram of the memory cell array, the sense amplifier, and the bit line connection unit according to the present embodiment, and corresponds to FIG. 19 described in the first embodiment.

As shown in FIG. 22, if a block BLK of the left sub-array 10L is an erase target, the voltage VERA is applied to the left source line SL_L via the transistor 350. However, a voltage is not applied to the right source line SL_R of the unselected sub-array 10R, and thus the source line becomes a floating state.

An operation of a case where a block of the right sub-array 10R is an erase target is reverse thereto, and the voltage VERA is applied to the right source line SL_R via the transistor 360. In addition, the left source line SL_L becomes a floating state.

2.3 Effect According to Present Embodiment

In the configuration according to the present embodiment, a voltage is not supplied to a source line of an inactive region of the memory cell array in the erase operation, such that the source line becomes a floating state. Therefore, current consumption can be reduced further than in the first embodiment.

3. Third Embodiment

Next, a semiconductor memory device according to the third embodiment will be described. The present embodiment is different from the first and second embodiments in terms of a layout of the transistors 200R and 200L of the bit line connection unit 16. Hereinafter, only the differences from the first and second embodiments will be described. In addition, in the following description, if the transistors 200R and 200L are not differentiated from each other, the transistors are referred to as a transistor 200 or transistors 200.

3.1 First Example

Figure 23:
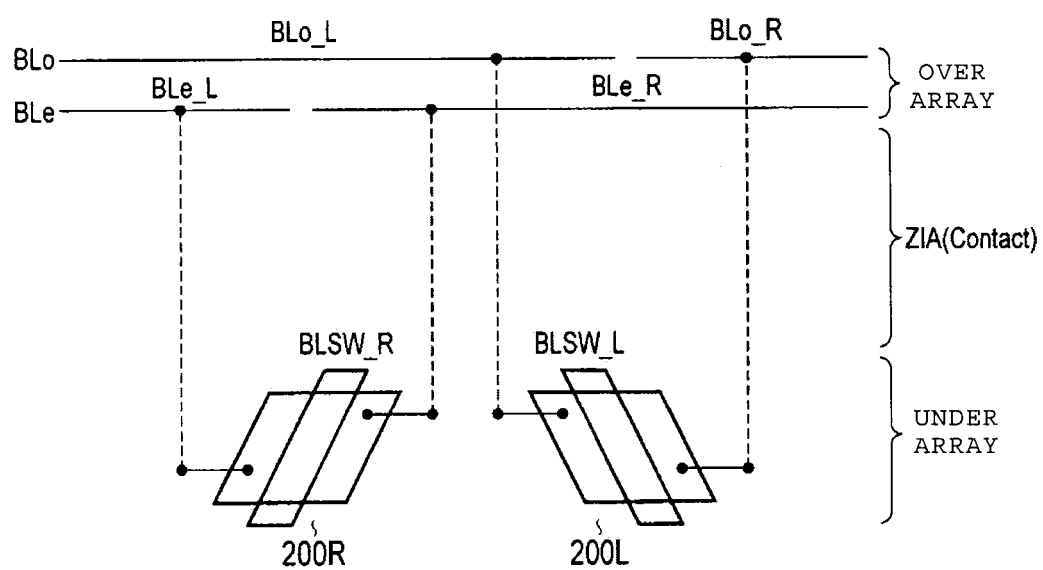
FIG. 23 is a conceptual diagram illustrating a disposition method of a bit line connection unit according to a third embodiment.

First, a first layout example will be described with reference to FIG. 23. FIG. 23 is a schematic diagram illustrating a concept of the first layout.

As shown in FIG. 23, in the first layout example, a contact plug which connects the bit line BL to the source of the transistor 200 is connected to the source region by a metal wire layer under the memory cell array. In addition, a contact plug which connects the bit line BL to the drain region of the transistor 200 is connected to the drain region by a metal wire layer under the memory cell array. Therefore, as shown in FIG. 23, in the transistor 200, both of the source side and the drain side are connected to the bit lines in the longitudinal direction of the gate.

Figure 24:
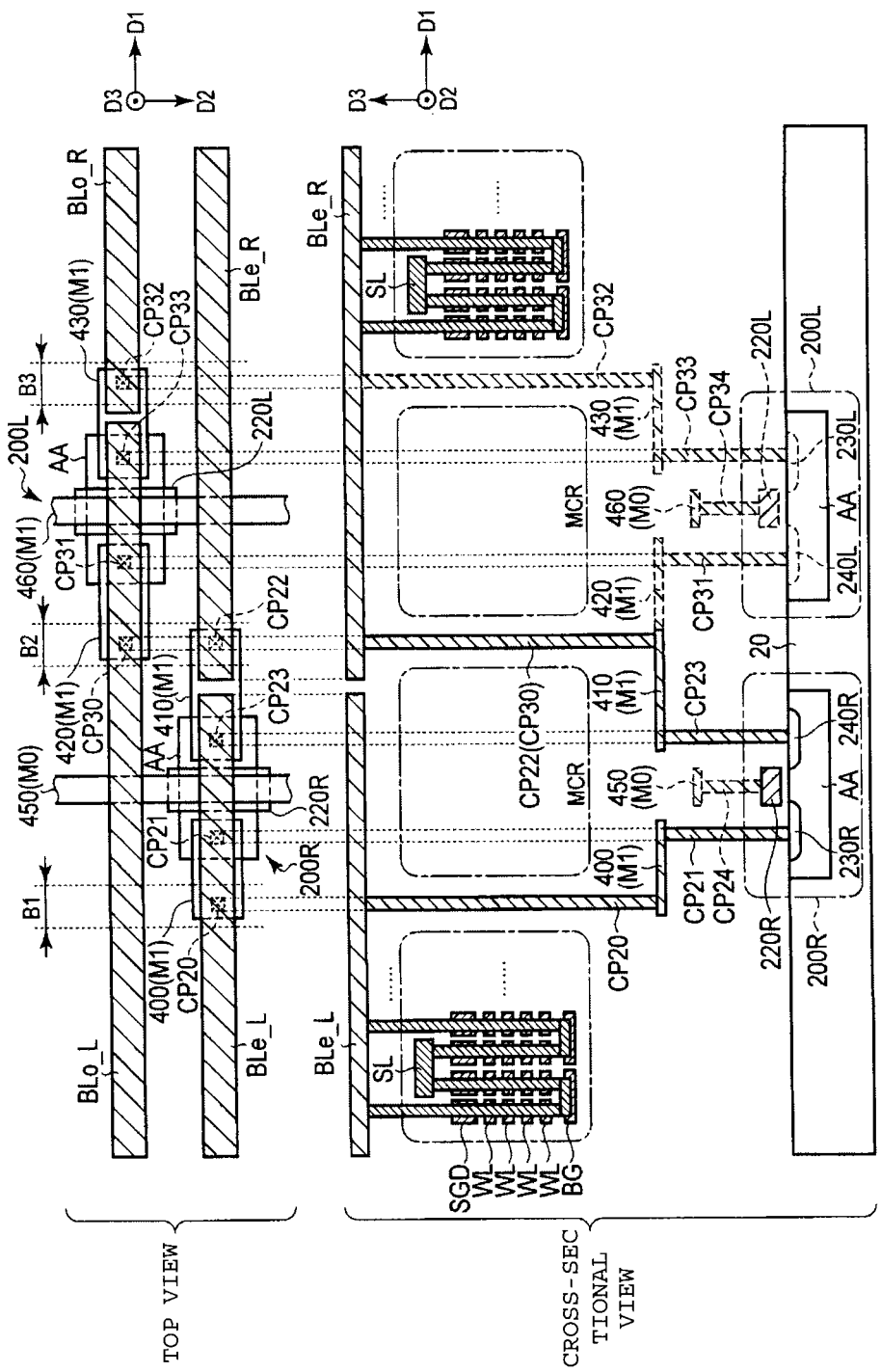
FIG. 24 is a top view and a cross-sectional view of a memory cell array and a bit line connection unit according to the third embodiment.

FIG. 24 is a top view and a cross-sectional view of the memory cell array 10 and the transistor 200 and shows a more specific layout example.

As shown in FIG. 24, the transistors 200R and 200L are formed on element regions AA of the semiconductor substrate 20. An element isolation region (not shown) is formed around the element regions AA, and electrically isolates the element regions from each other.

The transistor 200R includes an impurity diffusion layer 230R which functions as one of a source and a drain, an impurity diffusion layer 240R which functions as the other thereof, and a gate electrode 220R provided with a gate insulating film interposed therebetween.

The gate electrode 220R is connected to a metal wire layer 450 of a first layer (M0 wire) in the lower region of the memory cell array 10 via a contact plug CP24 in a region (not shown). The metal wire layer 450 is provided in a second direction and transfers a signal BLSW_R to a plurality of transistors 200R.

A contact plug CP21 is formed on the diffusion layer 230R, and the contact plug CP21 is connected to a metal wire layer 400 of a second layer (M1 wire) in the lower region of the memory cell array. The metal wire layer 400 is extracted from the region directly on the diffusion layer 230R in a direction opposite to the gate electrode which is located in the first direction, and is further connected to a contact plug CP20. The contact plug CP20 penetrates through a region between the memory cell regions MCR and is connected to a corresponding bit line BLe_L.

A contact plug CP23 is formed on the diffusion layer 240R, and the contact plug CP23 is connected to a metal wire layer 410 of the second layer (M1 wire). The metal wire layer 410 is extracted from the region directly on the diffusion layer 240R in a direction opposite to the gate electrode which is located in the first direction, and is further connected to a contact plug CP22. The contact plug CP22 penetrates through a region (this region is different from the region where the contact plug CP20 is formed) between the memory cell regions MCR and is connected to a corresponding bit line BLe_R.

The transistor 200L also includes impurity diffusion layers 230L and 240L, and a gate electrode 220L in the same manner as the transistor 200R.

The gate electrode 220L is connected to a metal wire layer 460 of the first layer (M0 wire) via a contact plug CP34. The metal wire layer 460 is provided in the second direction and transfers a signal BLSW_L to a plurality of transistors 200L.

A contact plug CP33 is formed on the diffusion layer 230L, and the contact plug CP33 is connected to a metal wire layer 430 of the second layer (M1 wire). The metal wire layer 430 is extracted from the region directly on the diffusion layer 230L in a direction opposite to the gate electrode which is located in the first direction, and is further connected to a contact plug CP32. The contact plug CP32 penetrates through a region (this region is different from the regions where the contact plugs CP20 and CP22 are formed) between the memory cell regions MCR and is connected to a corresponding bit line BLo_R.

A contact plug CP31 is formed on the diffusion layer 240L, and the contact plug CP31 is connected to a metal wire layer 420 of the second layer (M1 wire). The metal wire layer 420 is extracted from the region directly on the diffusion layer 240L in a direction opposite to the gate electrode which is located in the first direction (in other words, extracted toward the region where the contact plug CP22 is formed), and is further connected to a contact plug CP30. The contact plug CP30 penetrates through a region (this region is different from the region where the contact plug CP22 is formed) between the memory cell regions MCR and is connected to a corresponding bit line BLo_L.

According to this layout, regions where the bit lines BL and the transistors 200 are connected in the memory cell array 10 are three regions B1, B2 and B3. In the region B1, the bit line BLe_L is connected to the transistor 200R. In other words, in the region B1, the contact plug CP20 which connects the transistor 200R to the bit line BLe_L is disposed in a line in the second direction. In the region B2, the bit line BLe_R is connected to the transistor 200R, and the bit line BLo_L is connected to the transistor 200L. In other words, in the region B2, the contact plug CP22 which connects the transistor 200R to the bit line BLe_R and the contact plug CP30 which connects the transistor 200L to the bit line BLo_L are disposed in a line in the second direction. In the region B3, the bit line BLo_R is connected to the transistor 200L. In other words, in the region B3, the contact plug CP32 which connects the transistor 200L to the bit line BLo_R is disposed in a line in the second direction.

In addition, the transistor 200R is formed between the regions B1 and B2, and a gate wire 450 of the transistor 200R is provided in this region in the second direction. On the other hand, the transistor 200L is formed between the regions B2 and B3, and a gate wire 460 of the transistor 200L is provided in this region in the second direction.

3.2 Second Example

Figure 25:
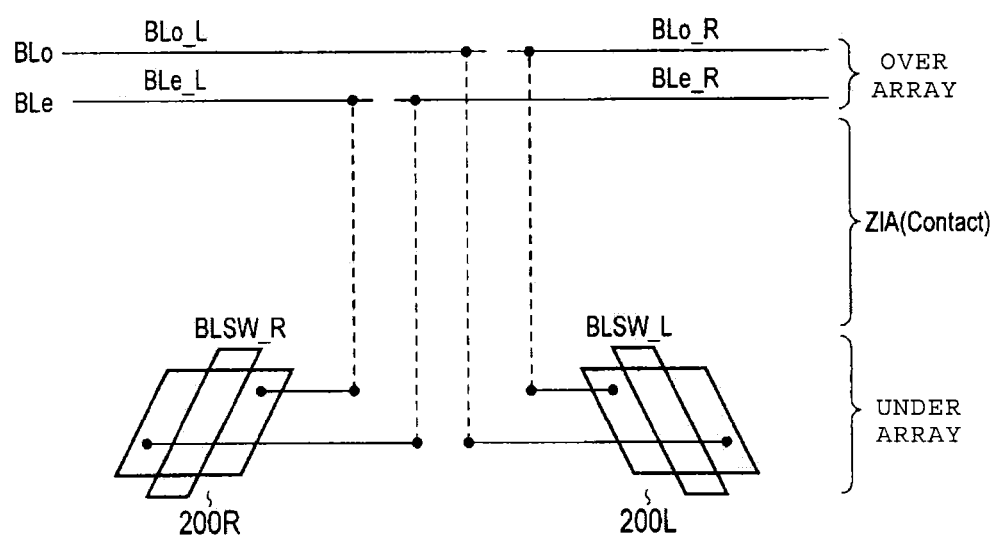
FIG. 25 is a conceptual diagram illustrating a disposition method of the bit line connection unit according to the third embodiment.

Next, a second layout example will be described with reference to FIG. 25. FIG. 25 is a schematic diagram illustrating a concept of the second layout.

As shown in FIG. 25, in the second layout example, wires connected to the sources and the drains of the transistors 200 are all extracted in the same direction. In addition, the respective wires in the extracted regions are connected to a corresponding bit line BL_L or BL_R. In this case, as shown in FIG. 25, contact plugs which connect the transistors 200 to the bit lines BL are disposed such that the transistor 200R and the transistor 200L are opposite to each other with the contact plugs interposed therebetween in the longitudinal direction of the gates.

Figure 26:
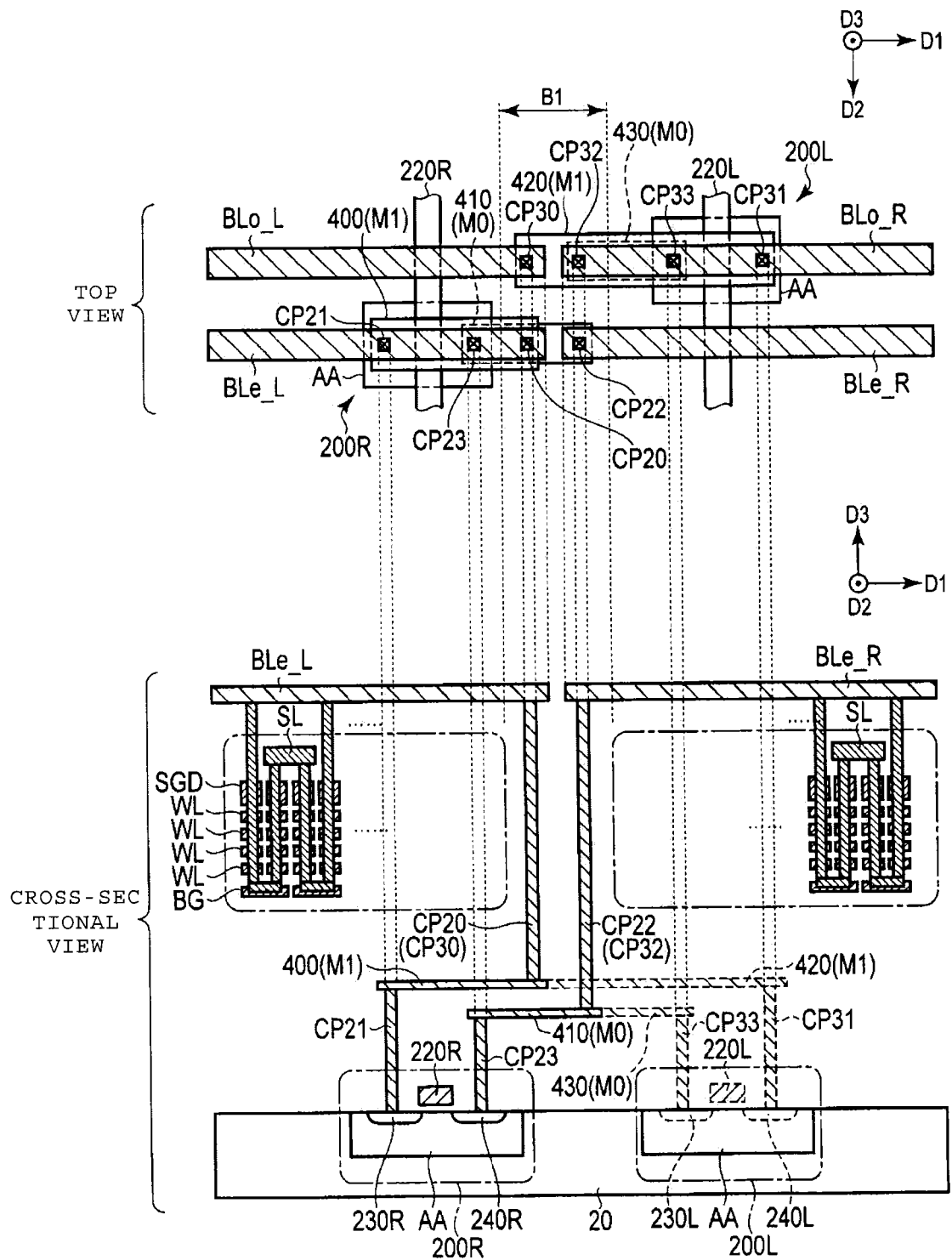
FIG. 26 is a top view and a cross-sectional view of the memory cell array and the bit line connection unit according to the third embodiment.

FIG. 26 is a top view and a cross-sectional view of the memory cell array 10 and the transistor 200 and shows a more specific layout example.

As shown in FIG. 26, the transistors 200R and 200L are formed on element regions AA in the same manner as in the first layout example.

A gate electrode 220R of the transistor 200R is provided in the second direction, is connected in common to a plurality of transistors 200R, and transfers a signal BLSW_R.

A contact plug CP21 formed on the diffusion layer 230R is connected to a metal wire layer 400 of a second layer (M1 wire) in the lower region of the memory cell array. The metal wire layer 400 is extracted from the region directly on the diffusion layer 230R so as to pass over the gate electrode 220R and the diffusion layer 230R in the first direction, and is further connected to a contact plug CP20. The metal wire layer 400 is connected to a corresponding bit line BLe_L via the contact plug CP20.

A contact plug CP23 formed on the diffusion layer 240R is connected to a metal wire layer 410 of the first layer (M0 wire) in the region under the memory cell array. The metal wire layer 410 is extracted from the region directly on the diffusion layer 240R in a direction opposite to the gate electrode 220R which is located in the first direction, and is further connected to a contact plug CP22. The metal wire layer 410 is connected to a corresponding bit line BLe_R via the contact plug CP22.

A gate electrode 220L of the transistor 200L is provided in the second direction, is connected in common to a plurality of transistors 200L, and transfers a signal BLSW_L, in the same manner as the transistor 220R.

A contact plug CP31 formed on the diffusion layer 240L is connected to a metal wire layer 420 of the second layer (M1 wire). The metal wire layer 420 is extracted from the region directly on the diffusion layer 240L so as to pass over the gate electrode 220L and the diffusion layer 230L in the first direction, and is further connected to a contact plug CP30. The metal wire layer 420 is connected to a corresponding bit line BLo_L via the contact plug CP30.

A contact plug CP33 formed on the diffusion layer 230L is connected to a metal wire layer 430 of the first layer (M0 wire). The metal wire layer 430 is extracted from the region directly on the diffusion layer 230L in a direction opposite to the gate electrode 220L which is located in the first direction, and is further connected to a contact plug CP32. The metal wire layer 430 is connected to a corresponding bit line BLo_R via the contact plug CP32.

According to this layout, a region where the bit lines BL and the transistors 200 are connected in the memory cell array 10 is a single region B1. In other words, in the region B1, the contact plug CP20 which connects the transistor 200R to the bit line BLe_L and the contact plug CP30 which connects the transistor 200L to the bit line BLo_L are disposed in a line in the second direction. Further, the contact plug CP22 which connects the transistor 200R to the bit line BLe_R and the contact plug CP32 which connects the transistor 200L to the bit line BLo_Rare disposed in a line in the second direction. In other words, in the region B1, two lines of the contact plugs are provided in the second direction, and a memory cell region MCR is not provided between the lines of the contact plugs.

In addition, the transistors 200R and 200L are provided in the first direction with the region B11 interposed therebetween.

3.3 Effects According to Present Embodiment

As described above, the transistors 200R and 200L of the bit line connection unit 16 can be formed according to the layout described in the present embodiment.

In addition, in the first layout example, the contact plugs (CP20, CP22, CP30, and CP32) connected to the bit lines BL are provided on the source sides and the drain sides of the transistors 200. Therefore, as shown in the top view of FIG. 24, a layout of the metal wire layer under the memory cell array is facilitated. For example, a line and space under the memory cell array can be made, for example, twice (for example, 96 nm) greater than a line and space (for example, 48 nm) of the bit line BL over the memory cell array. In addition, one layer of two-layered metal wire layers can be disposed in the second direction. In addition, this wire can be used as a wire for transferring the signal BLSW or a power supply voltage.

In addition, in the second layout example, contact plugs connected to the bit lines BL are collected at one place. Therefore, as shown in FIG. 26, the number of array break portions may be one (the region B1). In addition, at least one of the regions B1 to B3 may be used as one of hook-up regions HUR.

4. Fourth Embodiment

Next, a semiconductor memory device according to the fourth embodiment will be described. The present embodiment is different from the first to third embodiments in that the memory cell array is divided into two or more sub-arrays, and one sub-array is connected to the data control unit 14 via the other sub-arrays. Hereinafter, only the differences from the first to third embodiments will be described.

4.1 Configuration of NAND Type Flash Memory

First, a configuration of the NAND type flash memory 1 according to the present embodiment will be described.

4.1.1 Overall Configuration

Figure 27:
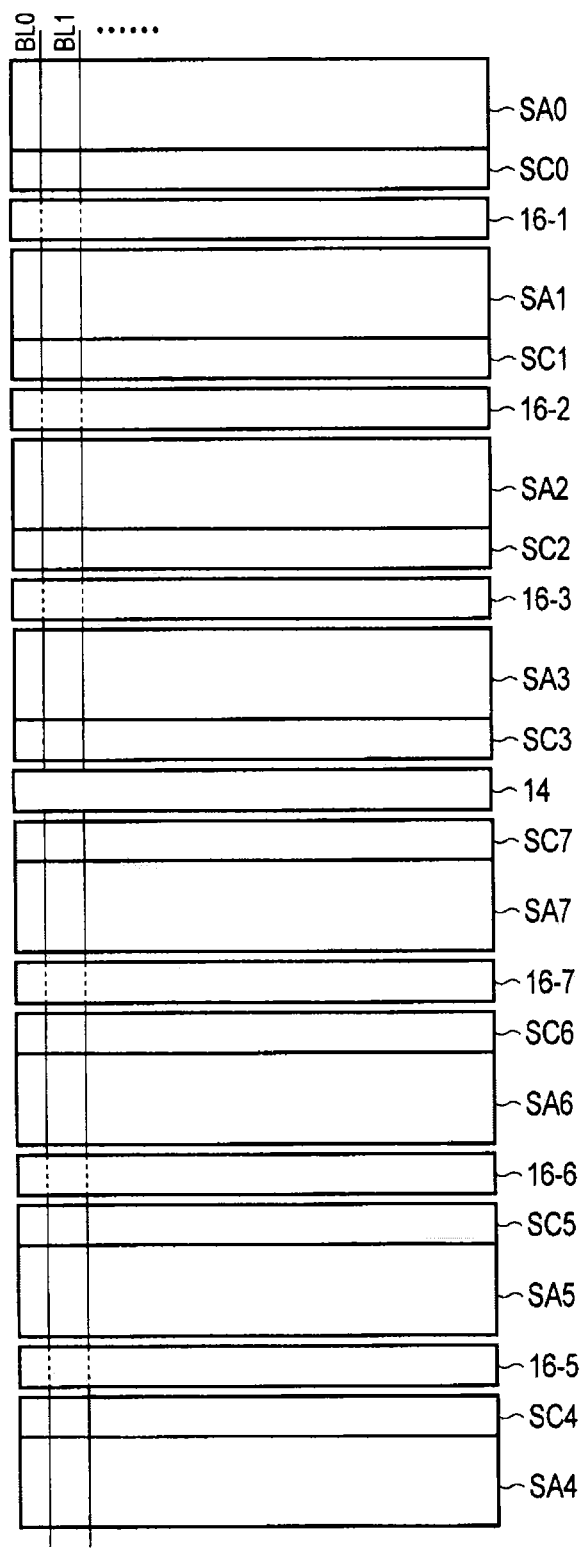
FIG. 27 is a block diagram illustrating a partial region of a semiconductor memory device according to a fourth embodiment.

The NAND type flash memory 1 according to the present embodiment further includes a sub-array control unit SC in the configuration of FIG. 1 described in the first embodiment. FIG. 27 is a block diagram illustrating a partial region of the NAND type flash memory 1 according to the present embodiment, and shows the memory cell array 10, the bit line connection unit 16, and the sub-array control unit SC.

As shown in FIG. 27, the memory cell array 10 is divided into, for example, eight sub-arrays SA (SA0 to SA7), and a corresponding bit line can be connected between adjacent sub-arrays. A configuration of each of the sub-arrays SA is the same as, for example, the configuration of the memory cell regions MCR described with reference to FIG. 4 and the like in the first embodiment. In addition, a region between the respective sub-arrays SA is a hook-up region HUR.

The sub-array control units SC (SC0 to SC7) are provided so as to be correlated with the respective sub-arrays SA. In addition, each of the sub-array control units SC includes the sense amplifier circuits SAC described in the first embodiment, and senses and amplifies data read from the correlated sub-array SA. Further, the sub-array control unit SC transfers data which is sent from the data control unit 14 or data which is sent to the data control unit 14, to an adjacent sub-array SA.

The bit line connection unit 16 connects or disconnects a bit line to or from adjacent sub-arrays SA as necessary.

Figure 28:
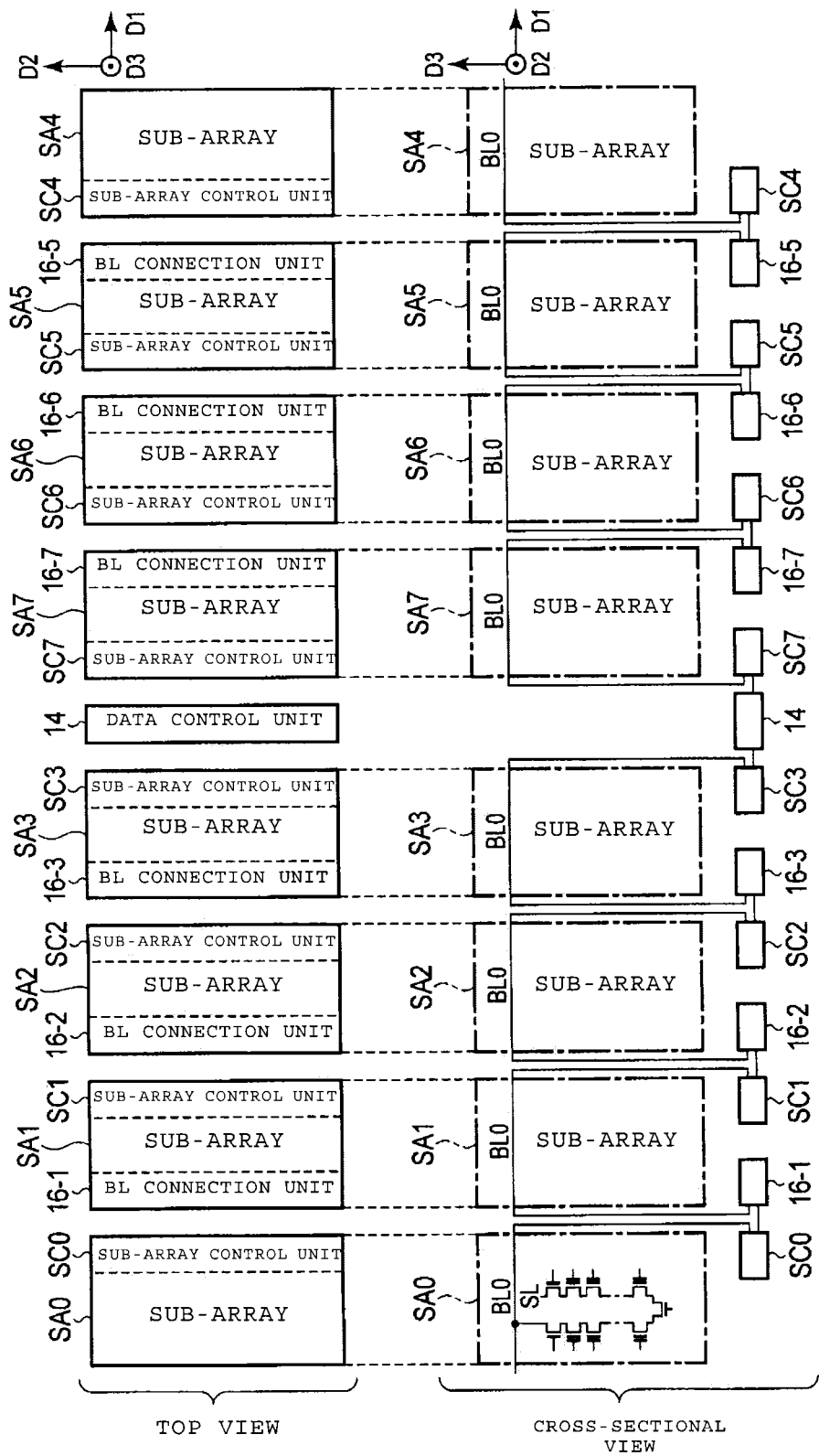
FIG. 28 is a top view and a cross-sectional view of the memory cell array, the bit line connection unit, and a sub-array control portion according to the fourth embodiment.

FIG. 28 is a schematic diagram of top and cross-sectional structures of the sub-arrays SA, the sub-array control units SC, the bit line connection unit 16, and the data control unit 14.

As shown in FIG. 28, the eight sub-arrays SA are arranged with the data control unit 14 interposed therebetween in the first direction. In the example of FIG. 28, the four sub-arrays SA are provided in both sides of the data control unit 14. More specifically, the sub-arrays SA0 to SA3 are provided in order distant from the data control unit 14 on the left side of the data control unit 14, and the sub-arrays SA4 to SA7 are provided on the right side thereof in the same manner.

The sub-array control unit SC is provided under a corresponding sub-array SA. In addition, the sub-array control unit SC is connected to the bit line BL of the corresponding sub-array SA via a contact plug provided in the hook-up region between the sub-arrays SA.

The bit line connection unit 16 is also provided under the sub-array SA. More specifically, in each of the left group of the sub-arrays SA0 to SA3 and the right group of the sub-arrays SA4 to SA7, the bit line BL of the sub-array SAi is connected to the bit line BL of the sub-array SA(i+1) via the bit line connection unit 16-(i+1). An expression of "the bit line connection unit 16-(i+1)" means (i+1)th bit line connection unit 16. The sub-arrays SA3 and SA7 adjacent to the data control unit 14 are connected to the data control unit 14 without using the bit line connection unit 16.

4.1.2 Sub-Array Control Unit SC

Figure 29:
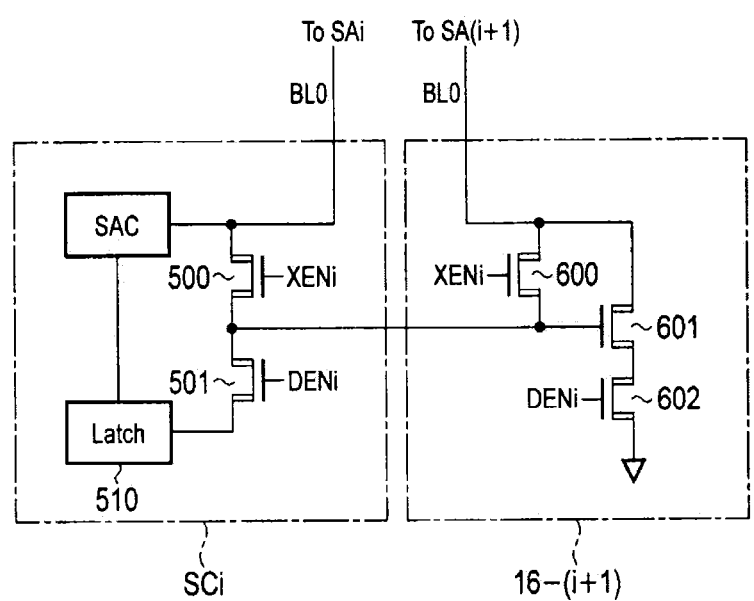
FIG. 29 is a circuit diagram of the bit line connection unit and the sub-array control portion according to the fourth embodiment.

Next, the sub-array control unit SC will be described in detail. FIG. 29 is a circuit diagram of the sub-array control unit SC and the bit line connection unit 16, and shows the sub-array control unit SCi and the bit line connection unit 16-(i+1) provided between the bit line BL of the sub-array SAi and the bit line BL of the sub-array SA(i+1).

As shown in FIG. 29, the sub-array control unit SCi includes a sense amplifier circuit SAC, a latch circuit 510, and n-channel MOS transistors 500 and 501 with a high withstand voltage.

The sense amplifier circuit SAC is the same as described with reference to FIG. 5 in the first embodiment. In addition, the sense amplifier circuit SAC of the sub-array control unit SCi senses and amplifies data read from the sub-array SAi. In addition, in the write operation, the sense amplifier circuit SAC transfers data to be written to the sub-array SAi, and applies a desired voltage corresponding to the data to be written, to the bit line BL of the sub-array SAi.

The latch circuit 510 temporarily holds data which is sensed and amplified by a corresponding sense amplifier circuit SAC in the read operation. In addition, in the write operation, the latch circuit 510 temporarily holds data to be written, transferred from the data control unit 14.

The transistor 500 has one end of a current path connected to the bit line BL of the corresponding sub-array SAi, the other end thereof connected to one end of a current path of the transistor 501, and a gate to which a signal XENi is applied.

The transistor 501 has the other end of the current path connected to the latch circuit 510 and a gate to which a signal DENi is applied.

In the above-described configuration, the signals XENi and DENi are applied by, for example, the control circuit 19. In addition, when read data is transferred to the data control unit 14, if data is read from the sub-array SAi, the signals XENi and DENi are respectively set to an "L" level and an "H" level, if data is read from the sub-array SA(i−j), the signals XENi and DENi are respectively set to an "H" level and an "L" level, and if data is read from the sub-array SA(i+j), the signals XENi and DENi are respectively set to an "L" level and an "L" level. Here, j is a natural number equal to or more than 1.

In addition, when data to be written is transferred from the data control unit 14, if data is written in the sub-array SAi or SA(i−j), the signals XENi and DENi are respectively set to an "H" level and an "L" level, and if data is written in the sub-array SA(i+j), the signals XENi and DENi are respectively set to an "L" level and an "L" level.

4.1.3 Bit Line Connection Unit 16

Next, details of the bit line connection unit 16 will be described with reference to FIG. 29.

Each bit line connection unit 16 includes n-channel MOS transistors 600 to 602 with a high withstand voltage. In addition, hereinafter, a case of the bit line connection unit 16-(i+1) will be described as an example.

The transistor 600 has one end of a current path connected to the bit line BL of the sub-array SA(i+1), the other end thereof connected to the connection node of the transistors 500 and 501 of the sub-array control unit SCi, and a gate to which the signal XENi is applied.

The transistor 601 has one end of a current path connected to the bit line BL of the sub-array SA(i+1), the other end thereof connected to one end of a current path of the transistor 602, and a gate connected to the connection node of the transistors 500 and 501 of the sub-array control unit SCi.

The transistor 602 has the other end of the current path connected to the ground, and a gate to which the signal DENi is applied.

4.2 Operation of NAND Type Flash Memory

Next, an operation of the NAND type flash memory 1 according to the present embodiment will be described below by paying attention to operations of the sub-array control unit SC and the bit line connection unit 16.

4.2.1 Write Operation

First, a write operation will be described.

4.2.1.1 Flow of Write Operation

Figure 30:
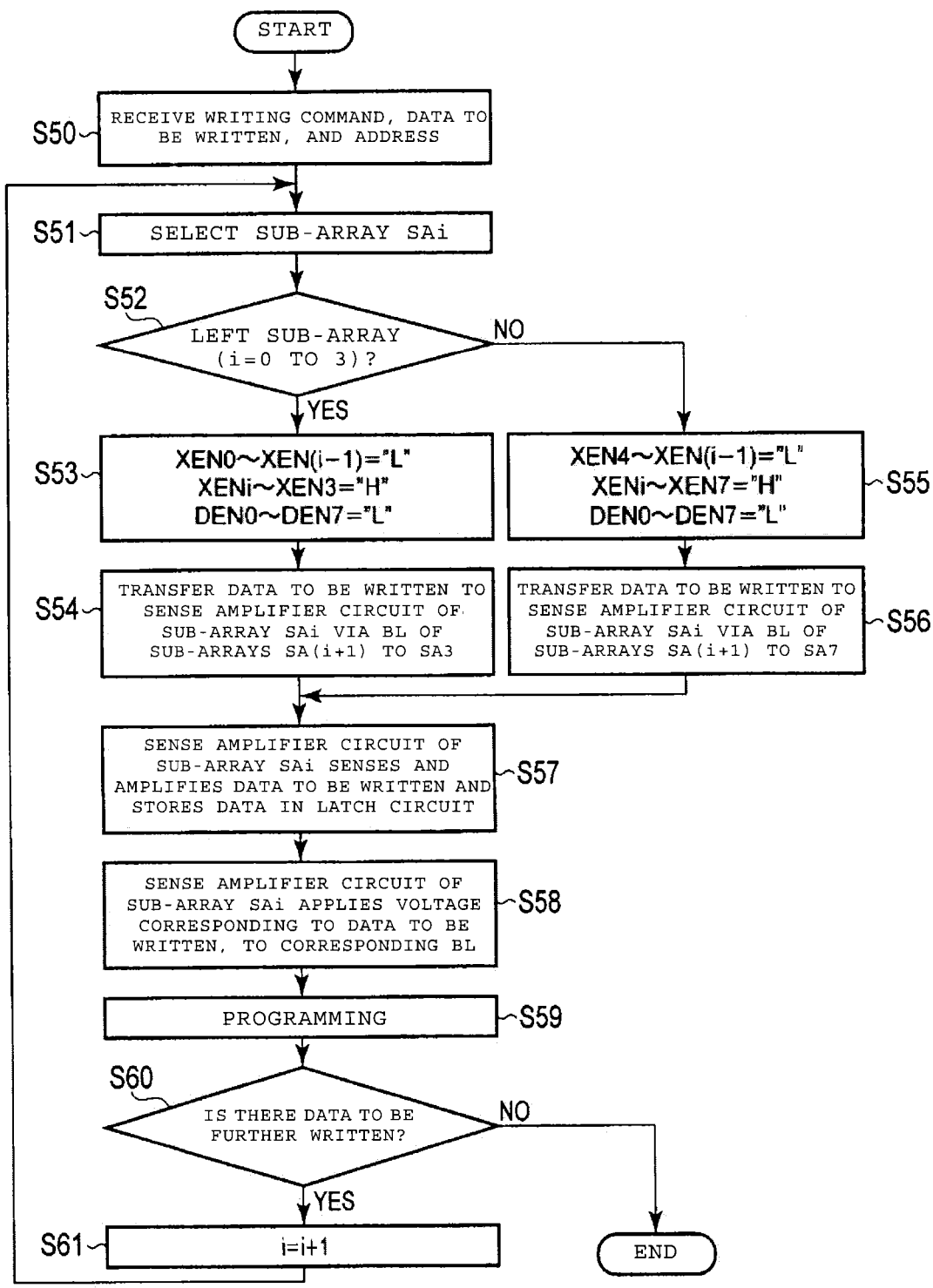
FIG. 30 is a flowchart illustrating a data writing method according to the fourth embodiment.

FIG. 30 is a flowchart illustrating a flow of a process when the write operation is performed.

As shown in FIG. 30, first, the control circuit 19 receives a write command, data to be written, and an address from the controller or the host apparatus (step S50). In addition, the sub-array SAi is selected as a target sub-array (step S51). The sub-array SAi selected in this step is a sub-array SAi (any one page of the sub-array SAi) corresponding to the address received in step S50.

If the selected sub-array SAi is a left sub-array, that is, any one of the sub-arrays SA0 to SA3 (any one of i=0 to 3) (YES in step S52), the control circuit 19 sets the signals XEN0 to XEN(i−1) to an "L" level and sets the signals XENi to XEN3 to an "H" level (here, if i=0, all of XEN0 to XEN3 are set to an "H" level) in step S53. In addition, the signals XEN4 to XEN7 related to the unselected sub-arrays are set to an "L" level. Further, the control circuit 19 sets the signals DEN0 to DEN7 to an "L" level.

Thereby, the data control unit 14 transfers the data to be written to the sense amplifier circuit SAC of the sub-array SAi via the bit lines BL of the sub-arrays SA(i+1) to SA3 (step S54).

On the other hand, if the selected sub-array SAi is a right sub-array, that is, any one of the sub-arrays SA4 to SA7 (any one of i=4 to 7) (NO in step S52), the control circuit 19 sets the signals XEN4 to XEN(i−1) to an "L" level and sets the signals XENi to XEN7 to an "H" level (here, if i=4, all of XEN4 to XEN7 are set to an "H" level) in step S55. In addition, the signals XEN0 to XEN3 related to the unselected sub-arrays are set to an "L" level. Further, the control circuit 19 sets the signals DEN0 to DEN7 to an "L" level.

Thereby, the data control unit 14 transfers the data to be written to the sense amplifier circuit SAC of the sub-array SAi via the bit lines BL of the sub-arrays SA(i+1) to SA7 (step S56).

After steps S54 and S56, the sense amplifier circuit SAC of the sub-array SAi senses and amplifies the transferred data to be written and stores the data in the latch circuit 510 (step S57). Successively, the sense amplifier circuit SAC transfers the data to be written, stored in the latch circuit 510, to the bit line BL of the corresponding sub-array SAi (step S58). In other words, a voltage corresponding to the data to be written is applied to each bit line BL.

Further, as described with reference to FIG. 15 in the first embodiment, desired voltages are applied to the word lines WL, and the select gate lines SGD and SGS, and thereby the data is programmed (step S59).

As a result of step S59, if data is written in all necessary pages (NO in step S60), the write operation finishes (a verification operation is not shown in FIG. 30).

If data is required to be further written in other pages (YES in step S60), i is set to i+1, and the next sub-array SA is selected (step S61). In other words, if the sub-array selected until then is any one of the sub-arrays SA0 to SA2 and SA4 to SA6, each of the sub-arrays SA1 to SA3 and SA5 to SA7 which are adjacent thereto and are closer to the data control unit 14 than the sub-arrays SA0 to SA2 and SA4 to SA6 is selected. If a sub-array selected until then is the sub-array SA3, the sub-array SA4 is selected which is the most distant from the data control unit 14 in the right sub-arrays. If a sub-array selected until then is the sub-array SA7, the writing finishes, or a vacant sub-array is selected which is the most distant from the data control unit 14 in other memory cell arrays. In addition, the operations from step S51 are repeatedly performed.

4.2.1.2 Specific Example of Write Operation

Figure 31:
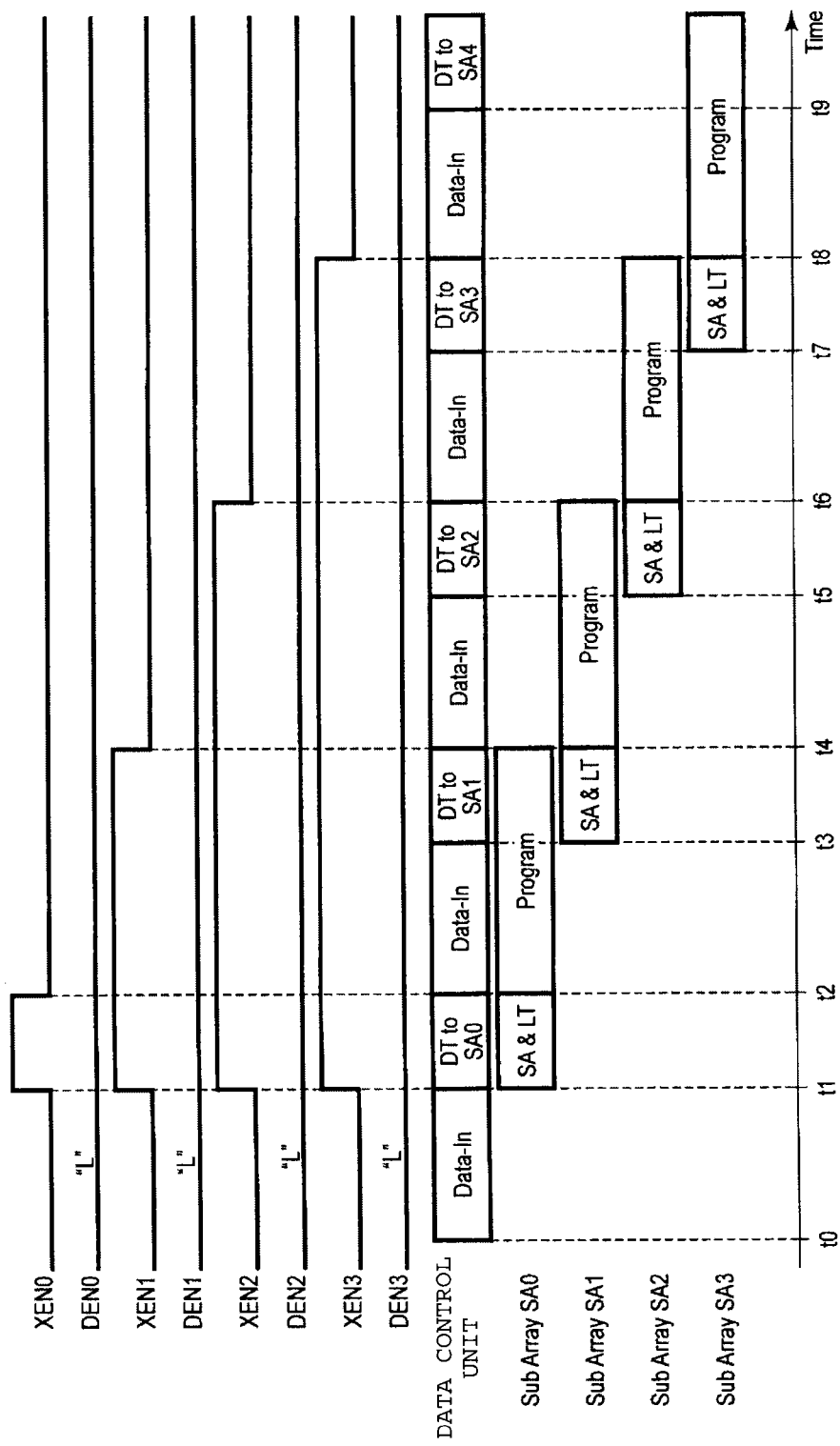
FIG. 31 is a timing chart illustrating various signals and processes in the write operation according to the fourth embodiment.
Figure 32:
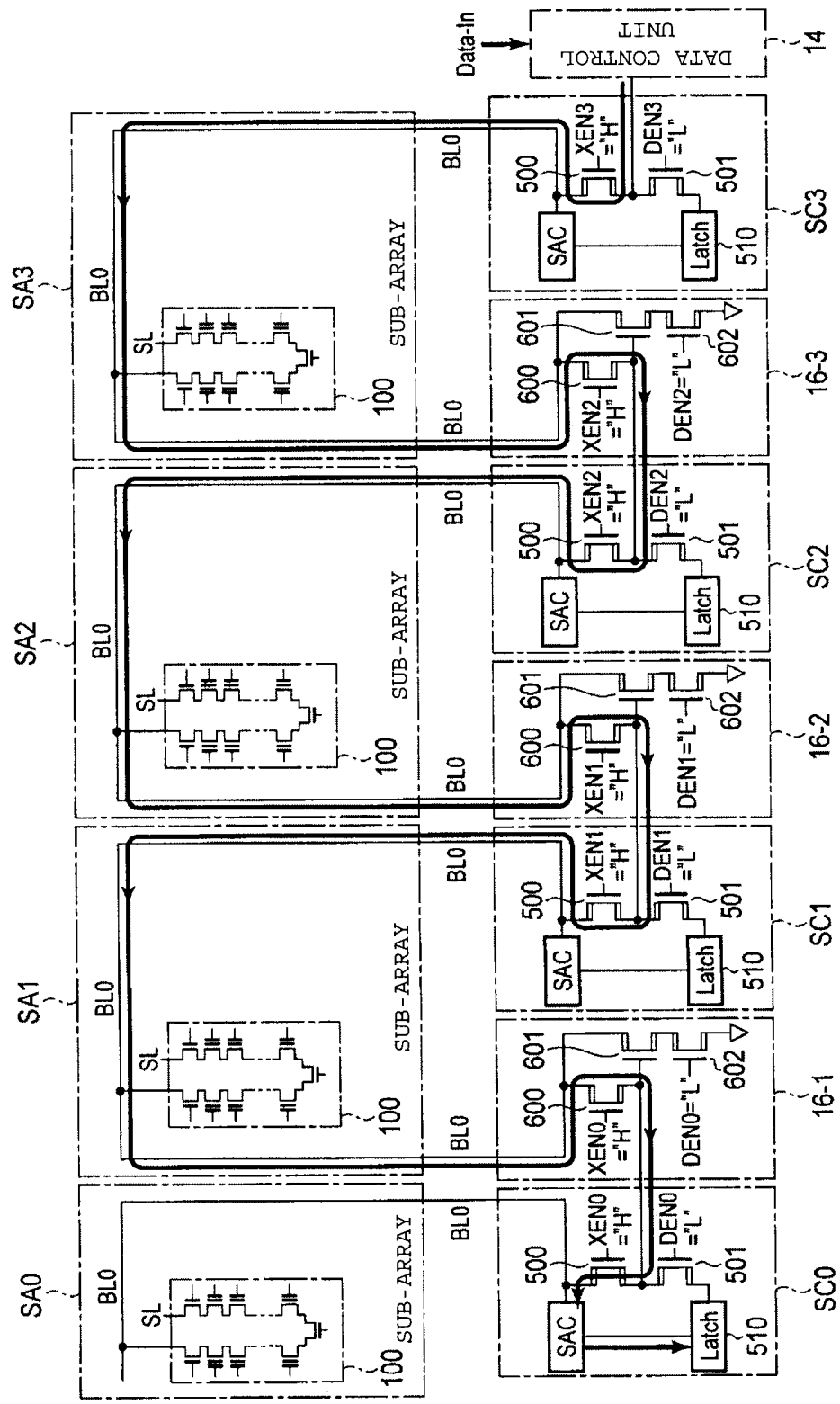
FIG. 32 is a circuit diagram of the memory cell array, the bit line connection unit, and the sub-array control portion according to the fourth embodiment.
Figure 33:
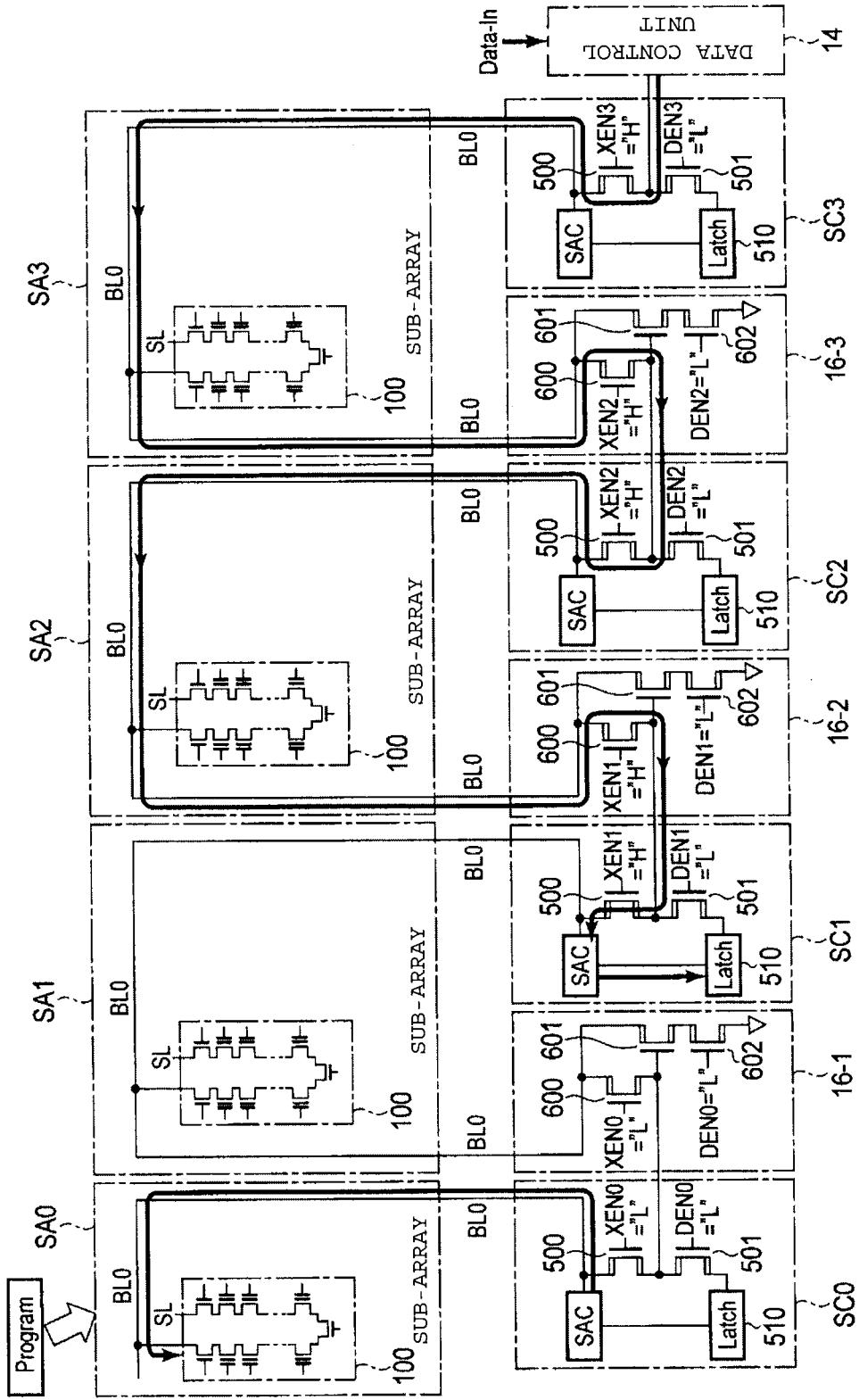
FIG. 33 is a circuit diagram of the memory cell array, the bit line connection unit, and the sub-array control portion according to the fourth embodiment.
Figure 34:
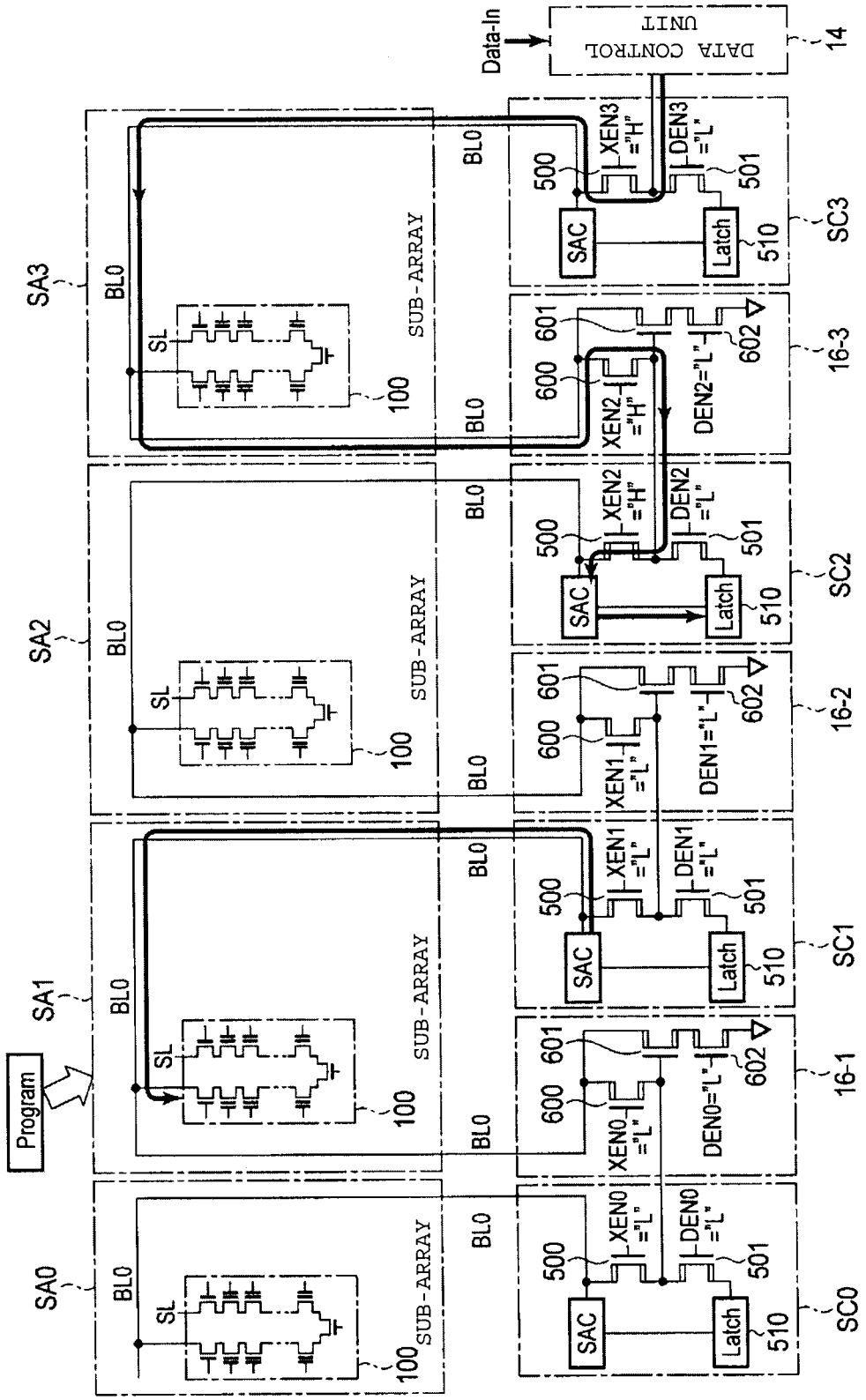
FIG. 34 is a circuit diagram of the memory cell array, the bit line connection unit, and the sub-array control portion according to the fourth embodiment.

A specific example of the write operation will be described with reference to FIGS. 31 to 34, particularly, by paying attention to an operation in which data is transferred from the data control unit 14 to the sub-array SAi and an order of sub-arrays SAi to be selected. FIGS. 31 to 34 show a state in which a left sub-array is selected, and FIG. 31 is a timing chart illustrating logical levels of the respective control signals XEN and DEN, and operations of the data control unit 14 and the sub-arrays SA0 to SA3. In addition, FIGS. 32 to 34 are circuit diagrams of the sub-arrays SA0 to SA3, the sub-array control units SC0 to SC3, and the bit line connection units 16-1 to 16-3.

First, as shown in FIG. 31, at the time t0, data to be written is input to the data control unit 14 from the controller or the host apparatus ("Data-In" in FIG. 31 indicates this operation).

Next, the control circuit 19 sets the signals XEN0 to XEN3 to an "H" level at the time t1. The signals DEN0 to DEN3 are in an "L" level. As a result, as shown in FIG. 32, the transistors 500 of the sub-array control units SC0 to SC3 are turned on, and the transistors 600 of the bit line connection units 16-1 to 16-3 are turned on. Thereby, the data control unit 14 is electrically connected to the bit line BL of the sub-array SAG. In addition, the data control unit 14 transfers the data to be written to the bit line BL of the sub-array SAG, so as to drive the bit line BL ("DT to SA0" in FIG. 31 indicates this operation).

Then, the sense amplifier circuit SAC of the sub-array control unit SC0 senses and amplifies the data transferred to the bit line BL, and stores the data in the latch circuit 510 ("SA & LT" in FIG. 31 indicates this operation). If the storage in the latch circuit 510 is completed, the signal XEN0 is turned from an "H" level to an "L" level. Thereby, the bit line BL of the sub-array SA0 is electrically disconnected from the bit lines BL of the other sub-arrays and the data control unit 14. The signals XEN1 to XEN3 are maintained in an "H" level.

Subsequently, as shown in FIGS. 31 and 33, at the time t2, in the sub-array SA0, a program operation is performed according to the data transferred to the sub-array control unit SC0 (the times t2 to t3).

In addition, data which should be written next is input to the data control unit 14 at the same time as the program operation for the sub-array SA0. At this time, the transistors 500 of the sub-array control units SC1 to SC3 are turned on, and the transistors 600 of the bit line connection units 16-2 to 16-3 are turned on. Thereby, the data control unit 14 is electrically connected to the bit line BL of the sub-array SA1.

In addition, the data control unit 14 transfers the data to be written to the bit line BL of the sub-array SA1, so as to drive the bit line BL ("DT to SA1" in FIG. 31 indicates this operation). In addition, the sub-array SA0 is electrically disconnected from the sub-array SA1, and thus the operation of transferring the data to the sub-array SA1 does not exert an adverse effect on the sub-array SA0 in which the program operation is in progress.

In addition, at the time t3, the sense amplifier circuit SAC of the sub-array control unit SC1 senses and amplifies the data transferred to the bit line BL, and stores the data in the latch circuit 510. If the storage in the latch circuit 510 is completed, the signal XEN1 is turned from an "H" level to an "L" level. The signals XEN2 and XEN3 are maintained in an "H" level.

Subsequently, as shown in FIGS. 31 and 34, at the time t4, in the sub-array SA1, a program operation is performed according to the data transferred to the sub-array control unit SC1 (the time t4 to t6).

In addition, data which should be written next is input to the data control unit 14 at the same time as the program operation for the sub-array SA1. At this time, the transistors 500 of the sub-array control units SC2 and SC3 are turned on, and the transistor 600 of the bit line connection unit 16-3 is turned on. Thereby, the data control unit 14 is electrically connected to the bit line BL of the sub-array SA2. In addition, the data control unit 14 transfers the data to be written to the bit line BL of the sub-array SA2, so as to drive the bit line BL ("DT to SA2" in FIG. 31 indicates this operation). In addition, the sub-arrays SA0 and SA1 are electrically disconnected from the sub-array SA2, and thus the operation of transferring the data to the sub-array SA2 does not exert an adverse effect on the sub-array SA1 in which the program operation is in progress.

In addition, at the time t5, the sense amplifier circuit SAC of the sub-array control unit SC2 senses and amplifies the data transferred to the bit line BL, and stores the data in the latch circuit 510. If the storage in the latch circuit 510 is completed, the signal XEN2 is turned from an "H" level to an "L" level. The signal XEN3 is maintained in an "H" level.

The same applies to the subsequent operations, and, at the time t6, programming starts in the sub-array SA2 (the times t6 to t8), and data to be written next is transferred to the sub-array SA3. Data is written in the sub-arrays SA4 to SA7 in the subsequent operations as necessary. In this case, at the time t8 of FIG. 31, the signals XEN4 to XEN7 may be maintained in an "H" level.

4.2.2 Read Operation

Next, a read operation will be described.

4.2.2.1 Flow of Read Operation

Figure 35:
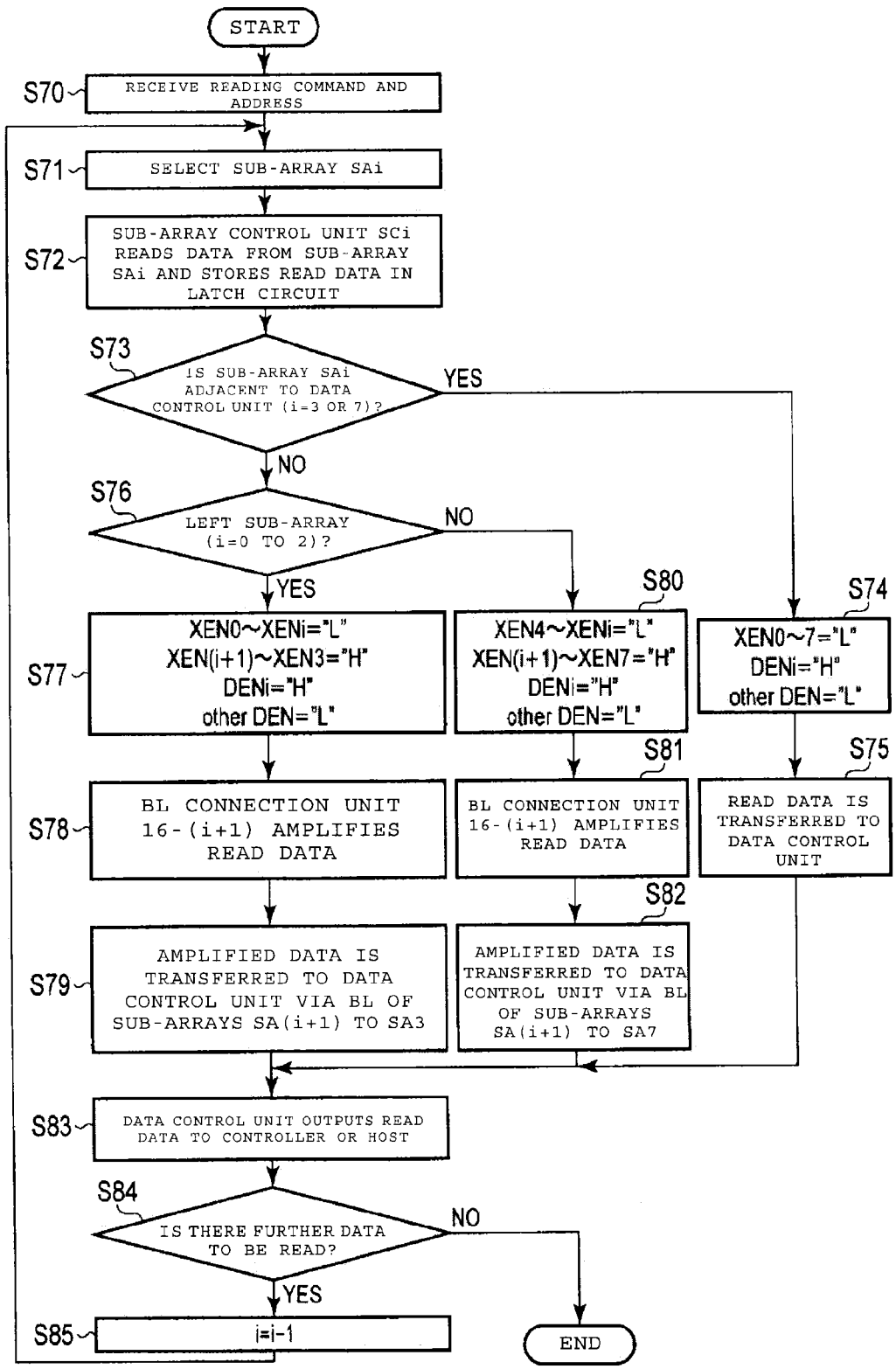
FIG. 35 is a flowchart illustrating a data reading method according to the fourth embodiment.

FIG. 35 is a flowchart illustrating a flow of a process when the read operation is performed.

As shown in FIG. 35, first, the control circuit 19 receives a read command, and an address from a controller or a host apparatus (step S70). In addition, the sub-array SAi is selected as a target sub-array (step S71). The sub-array SAi selected in this step is a sub-array SAi (any one page of the sub-array SAi) corresponding to the received address.

Successively, in response to a command of the control circuit 19, the sub-array control unit SCi reads data from the sub-array SAi, senses and amplifies the read data, and stores the data in the latch circuit 510 (step S72). More specifically, this operation is the same as described with reference to FIG. 11 in the first embodiment. In other words, the sense amplifier circuit SAC of the sub-array control unit SCi precharges the bit line BL of the sub-array SAi. In addition, desired voltages are applied to the word lines WL, the select gate lines SGD and SGS, or the like, and thereby data is read to the bit line BL. Further, in this step, both of the signals XEN and DEN are in an "L" level.

Next, if the sub-array SAi from which data is read is adjacent to the data control unit 14, that is, i=3 or 7 in the example of FIGS. 27 and 28 (YES in step S73), the control circuit 19 sets the signals XEN0 to XEN7 to an "L" level, sets the signal DENi to an "H" level, and sets the signals DEN0 to DEN(i−1) and DEN(i+1) to DEN7 to an "L" level (step S74).

Thereby, the sub-array control unit SCi transfers the read data to the data control unit 14 from the latch circuit 510 (step S75).

If the sub-array SAi is not adjacent to the data control unit 14 (NO in step S73) and the selected sub-array SAi is the left sub-array (YES in step S76), that is, any one of the sub-arrays SA0 to SA2 (any one of i=0 to 2), the control circuit 19 sets the signals XEN0 to XEN(i−1) to an "L" level and sets the signals XENi to XEN3 to an "H" level in step S77. In addition, the signals XEN4 to XEN7 related to the unselected sub-arrays are set to an "L" level. Further, the control circuit 19 sets the signal DENi to an "H" level, and sets the signals DEN0 to DEN(i−1) and DEN(i+1) to DEN7 to an "L" level.

The signal DENi is turned to an "H" level, and thereby the bit line connection unit 16-(i+1) amplifies the data read from the sub-array control unit SCi (step S78). In other words, in the bit line connection unit 16-(i+1), the transistor 602 is turned on. Therefore, if the read data which is in an "H" level is held in the latch circuit 510, the transistor 601 is turned on, and thus a current flows from the data control unit 14 to the ground voltage node via the bit lines BL of the sub-arrays SA(i+1) to SA3 and the current paths of the transistors 601 and 602. On the other hand, a current does not flow if the data in an "L" level is held.

The read data which is amplified by the transistors 601 and 602 is transferred to the data control unit 14 via the bit lines BL of the sub-arrays SA(i+1) to SA3 (step S79).

In addition, if the sub-array SAi is not adjacent to the data control unit 14 (NO in step S73) and the selected sub-array SAi is the right sub-array (NO in step S76), that is, any one of the sub-arrays SA5 to SA7 (any one of i=5 to 7), the control circuit 19 sets the signals XEN4 to XENi to an "L" level and sets the signals XEN(i+1) to XEN7 to an "H" level in step S80. In addition, the signals XEN0 to XEN3 related to the unselected sub-arrays are set to an "L" level. Further, the control circuit 19 sets the signal DENi to an "H" level, and sets the other signals DEN0 to DEN(i−1) and DEN(i+1) to DEN7 to an "L" level.

The signal DENi is turned to an "H" level, and thereby the bit line connection unit 16-(i+1) amplifies the data read from the sub-array control unit SCi (step S81). In other words, in the bit line connection unit 16-(i+1), the transistor 602 is turned on. Therefore, if the read data which is in an "H" level is held in the latch circuit 510, the transistor 601 is turned on, and thus a current flows from the data control unit 14 to the ground voltage node via the bit lines BL of the sub-arrays SA(i+1) to SA7 and the current paths of the transistors 601 and 602. On the other hand, a current does not flow if the data in an "L" level is held.

The read data which is amplified by the transistors 601 and 602 is transferred to the data control unit 14 via the bit lines BL of the sub-arrays SA(i+1) to SA7 (step S82).

After steps S75, S79 and S82, the data control unit 14 outputs the read data to the controller or the host apparatus via the input and output circuit 15 (step S83).

As a result of the above steps, if data is read from all necessary pages (NO in step S84), the read operation finishes.

If data is further required to be read from other pages (YES in step S84), i is set to i−1, and the next sub-array SA is selected (step S85). In other words, if the sub-array selected until then is any one of the sub-arrays SA1 to SA3 and SA5 to SA7, each of the sub-arrays SA0 to SA2 and SA4 to SA6 which are adjacent thereto and are more distant from the data control unit 14 than the sub-arrays SA1 to SA3 and SA5 to SA7 is selected. If a sub-array selected until then is the sub-array SA0, the sub-array SA7 is selected which is the closest to the data control unit 14 in the right sub-arrays. If a sub-array selected until then is the sub-array SA4, the reading finishes, or a vacant sub-array is selected which is the closest to the data control unit 14 in other memory cell arrays. In addition, the operations from step S71 are repeatedly performed.

4.2.2.2 Specific Example of Read Operation

Figure 36:
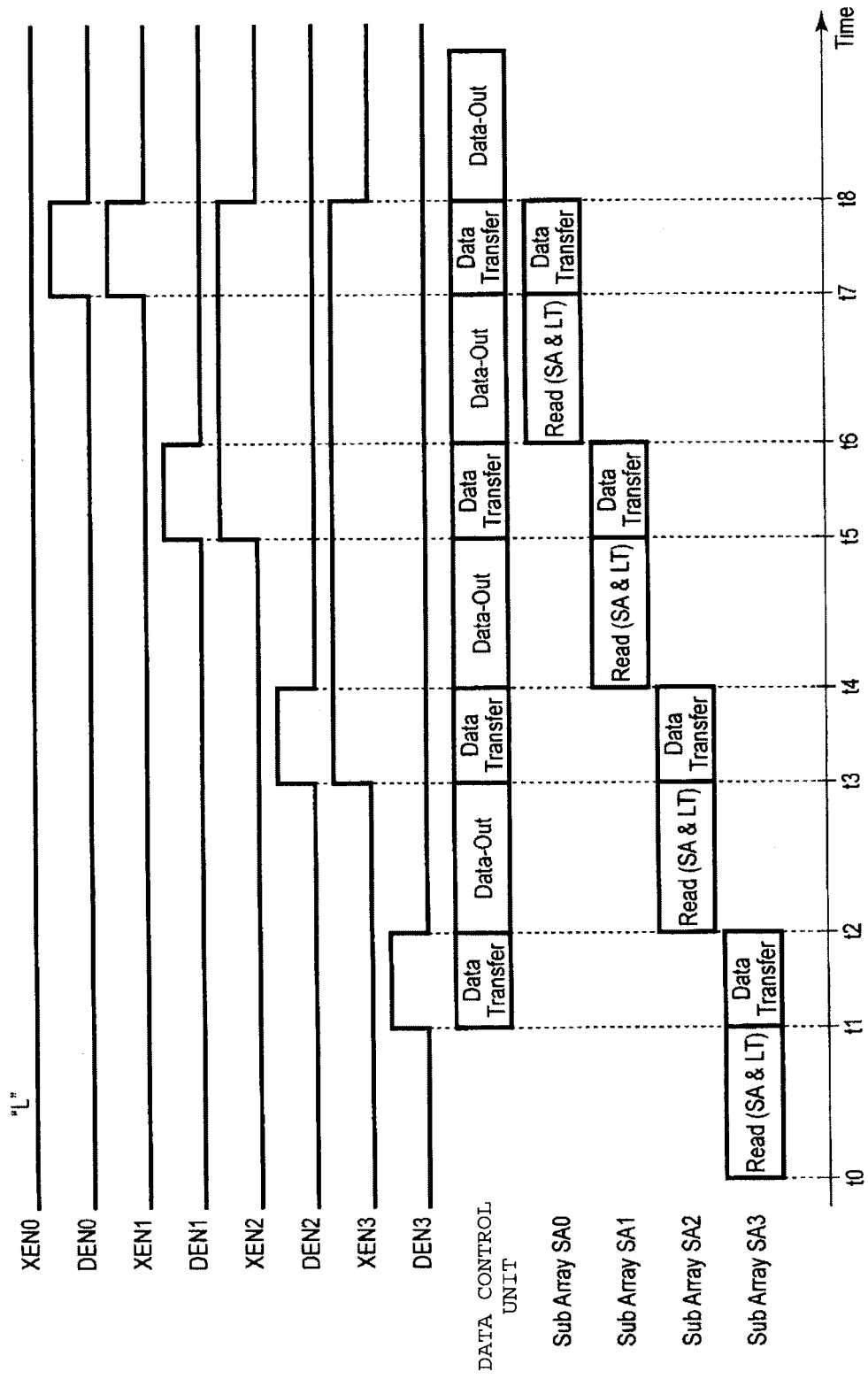
FIG. 36 is a timing chart illustrating various signals and processes in the read operation according to the fourth embodiment.
Figure 37:
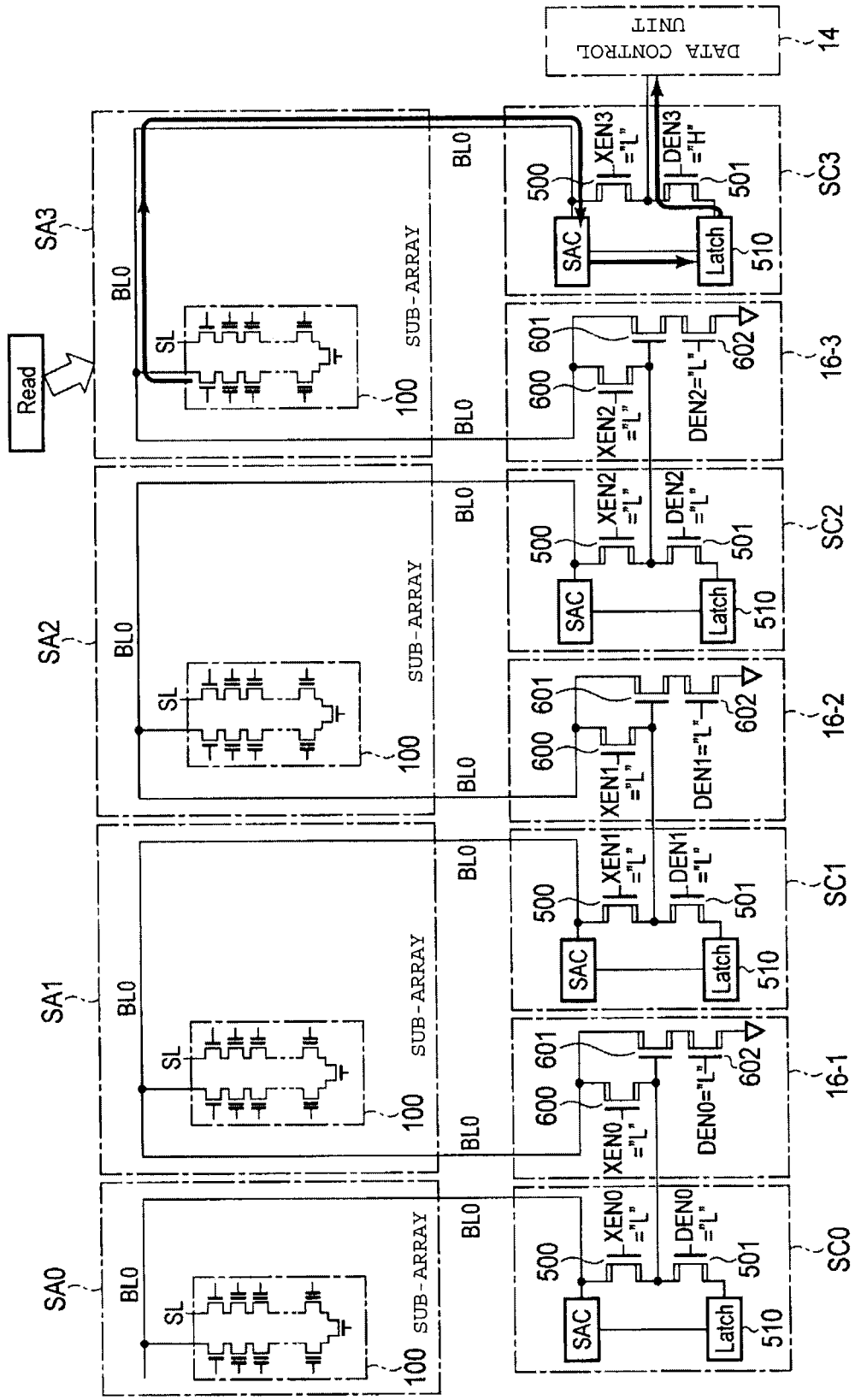
FIG. 37 is a circuit diagram of the memory cell array, the bit line connection unit, and the sub-array control portion according to the fourth embodiment.
Figure 38:
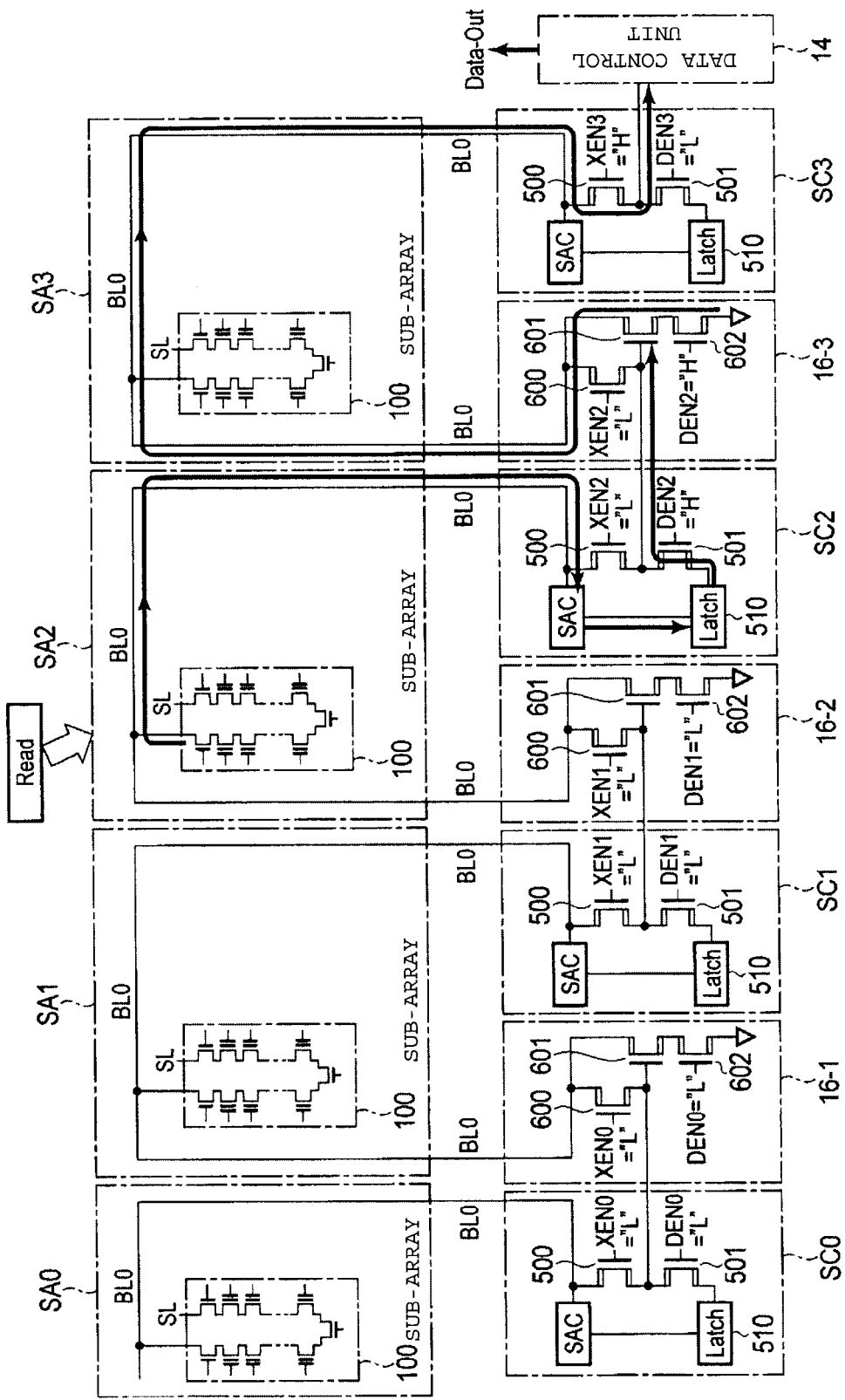
FIG. 38 is a circuit diagram of the memory cell array, the bit line connection unit, and the sub-array control portion according to the fourth embodiment.
Figure 39:
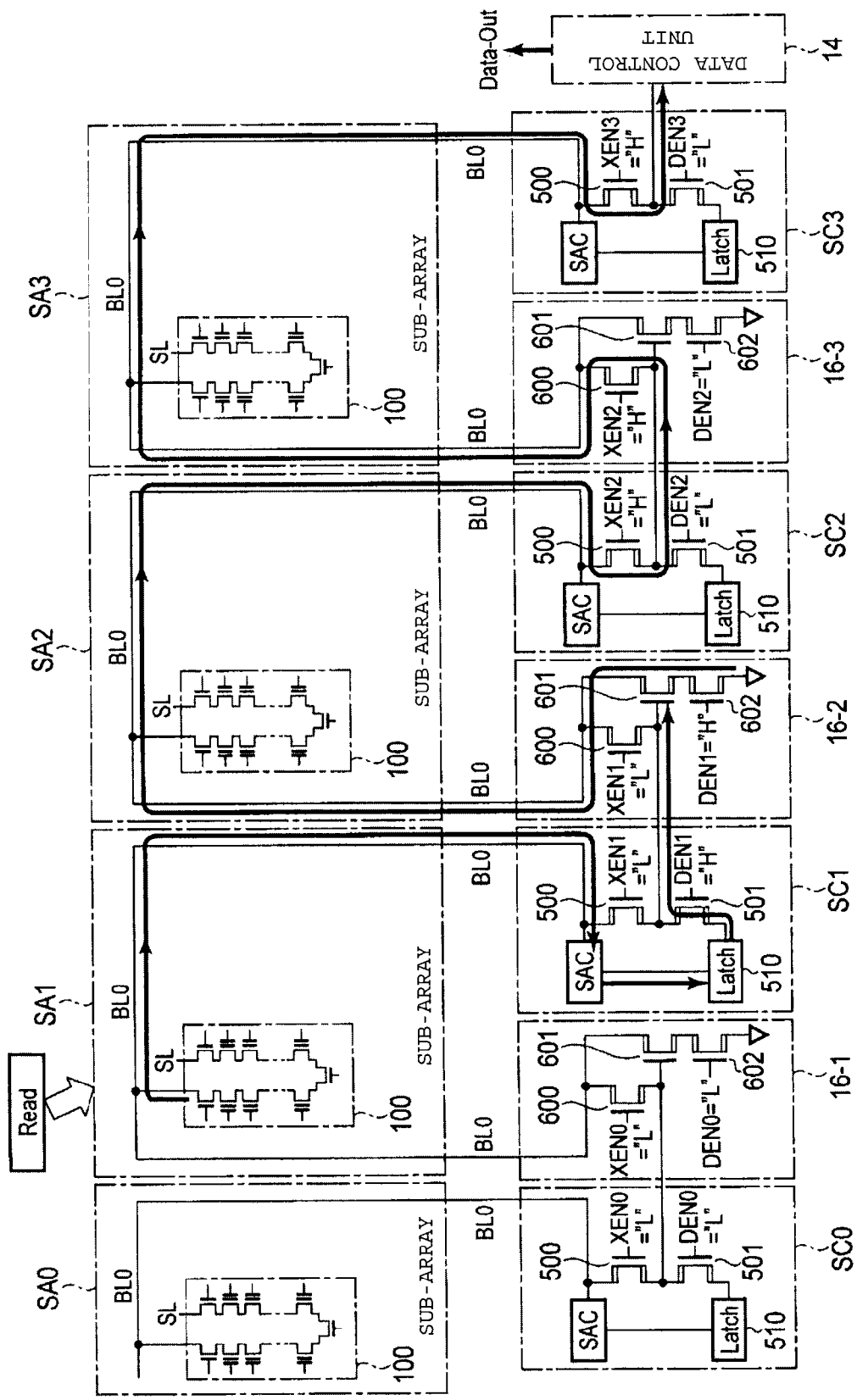
FIG. 39 is a circuit diagram of the memory cell array, the bit line connection unit, and the sub-array control portion according to the fourth embodiment.

A specific example of the read operation will be described with reference to FIGS. 36 to 39, particularly, by paying attention to an operation in which data is transferred from the sub-array SAi to the data control unit 14 and an order of sub-arrays SAi to be selected. FIGS. 36 to 39 show a state in which a left sub-array is selected, and FIG. 36 is a timing chart illustrating logical levels of the respective control signals XEN and DEN, and operations of the data control unit 14 and the sub-arrays SA0 to SA3. In addition, FIGS. 37 to 39 are circuit diagrams of the sub-arrays SA0 to SA3, the sub-array control units SC0 to SC3, and the bit line connection units 16-1 to 16-3.

First, as shown in FIGS. 36 and 37, at the time t0, data is read from the sub-array SA3 which is the closest to the data control unit 14. In addition, in the sub-array control unit SC3, the data is sensed and amplified, and the read data is stored in the latch circuit 510 ("SA & LT" in FIG. 36 indicates this operation).

Next, at the time t1, the control circuit 19 sets the signal DEN3 to an "H" level. As a result, as shown in FIG. 37, the transistor 501 of the sub-array control unit SC3 is turned on. Thereby, the data in the latch circuit 510 is transferred to the data control unit 14.

Next, at the time t2, the control circuit 19 sets the signal DEN3 to an "L" level. Successively, as shown in FIG. 38, data is read from the sub-array SA2 which is more distant from the data control unit 14 than the sub-array SA3. The read data is stored in the latch circuit 510 of the sub-array SA2.

Next, at the time t3, the control circuit 19 sets the signals DEN2 and XEN3 to an "H" level. As a result, as shown in FIG. 38, the transistor 501 of the sub-array control unit SC2 is turned on. In addition, the transistor 602 of the bit line connection unit 16-3 is turned on. Thereby, the transistor 601 is turned on according to the read data, and thus the read data is transferred to the data control unit 14 via the transistors 601 and 602 of the bit line connection unit 16-3, the bit line BL of the sub-array SA3, and the transistor 500 of the sub-array control unit SC3.

Next, at the time t4, the control circuit 19 sets the signal DEN2 to an "L" level. The signal XEN3 is maintained in an "H" level. Successively, as shown in FIG. 39, data is read from the sub-array SA1 which is more distant from the data control unit 14 than the sub-array SA2. The read data is stored in the latch circuit 510 of the sub-array SA1.

Next, at the time t5, the control circuit 19 sets the signals DEN1 and XEN2 to an "H" level. As a result, as shown in FIG. 39, the transistor 501 of the sub-array control unit SC1 is turned on. In addition, the transistor 602 of the bit line connection unit 16-2 is turned on. The transistor 500 is turned on in the sub-array control unit SC2, and the transistor 602 is turned off and the transistor 600 is turned on in the bit line connection unit 16-3.

Thereby, the transistor 601 of the bit line connection unit 16-2 is turned on according to the read data, and thus the read data is transferred to the data control unit 14 via the transistors 601 and 602 of the bit line connection unit 16-2, the bit line BL of the sub-array SA2, and the transistor 500 of the sub-array control unit SC2, the transistor 600 of the bit line connection unit 16-3, the bit line BL of the sub-array SA3, and the transistor 500 of the sub-array control unit SC3.

The same applies to the subsequent operation, and data is read from the sub-array SA0. This data is amplified by the bit line connection unit 16-1, and is transferred to the data control unit 14 via the bit lines BL of the sub-arrays SA1 to SA3.

4.3 Effects According to Present Embodiment

In the configuration according to the present embodiment, an operation speed of the NAND type flash memory can be improved, and current consumption can be reduced. Hereinafter, these effects will be described.

As a technique for continuously achieving miniaturization and large capacity, a three-dimensional stacked memory as described in detail in the first embodiment is examined. In addition, if a memory cell array is not merely stacked in multiple layers, but multiple layers can be collectively processed, a bit cost can be reduced.

In addition, one of features of the three-dimensional stacked memory is that a memory cell array can be formed over circuits of a semiconductor substrate. A cell occupancy rate (a rate of the memory cell array taking up the chip area) can be increased by disposing peripheral circuits under the memory cell array, and this is an essential technique for reducing a bit cost.

In terms of the cell occupancy rate, the number of memory cell arrays is particularly one. However, a signal from a memory cell becomes a micro-level due to the miniaturization, and thus a level of the signal is further reduced in a case of a multi-level cell (MLC). In a large memory cell array, the number of memory cells connected to a single bit line is large, and thus a capacitance of the bit line is large, and a resistance thereof increases. For this reason, the time required for a read operation for amplifying a micro-signal on the bit line is lengthened. Meanwhile, since a memory has a large capacity, and a data amount processed by an application increases, a reduction in read operation speed is not allowable. In addition, in order to achieve high-speed reading, it is necessary that a memory cell array be divided into a plurality of sub-arrays, and a sense amplifier or a data transmission unit be provided in each sub-array, but a cell occupancy rate is reduced to that extent.

In addition, as described above, in the three-dimensional stacked memory, peripheral circuits such as a sense amplifier are disposed under the memory cell array, and thus a reduction in the cell occupancy rate can be reduced to the minimum. However, due to costs and restrictions in terms of processes, the lower part of the memory cell array is an environment in which a low resistance global wire is not easy to use, and data is not easy to transfer to outside of the array at high speed. In the three-dimensional stacked memory, a large number of bits are integrated in the same area, and thus a signal from a memory cell is generally small. For this reason, the number of divided memory cell arrays is required to be further increased. As a result, if a data transmission circuit for each sub-array is disposed outside the memory cell array in order to perform a high-speed operation, an increase in the area according thereto easily cancels out cost reduction obtained by stacking the memory cell array.

In relation to this matter, in the configuration according to the present embodiment, a memory cell array is divided into a plurality of sub-arrays, and thereby a read operation can be performed at high speed, and an increase in the area due to a data transmission circuit disposed outside the memory cell array can be suppressed.

In other words, for example, as shown in FIGS. 27 and 28, the memory cell array is divided into eight sub-arrays. Therefore, in the read operation, only a bit line BL of a sub-array SA which is a reading target may be precharged and discharged, and precharging and discharging of the other sub-arrays SA are not necessary. Therefore, a read operation can be performed at high speed, and power consumption can be reduced.

In addition, the sense amplifier and the bit line connection unit 16 are disposed under the sub-array SA, and thereby an increase in the area caused by dividing the memory cell array can be suppressed. Further, the data control unit 14 which transfers data between the memory cell array and a controller or a host apparatus is disposed at the center of the sub-array group which is arranged in the bit line direction as shown in FIG. 28, and thus the data control unit 14 is shared by the sub-arrays SA.

In addition, when a sub-array SA which is not adjacent to the data control unit 14 is accessed, the bit line connection unit 16 and the sub-array control unit SC electrically connect the bit lines BL of sub-arrays SA located between the accessed sub-array SA and the data control unit 14. Further, data is transferred between the accessed sub-array SA and the data control unit 14 via the connected bit lines BL.

Thereby, the arrangement as shown in FIG. 28 is possible, and thus the area occupied by the data control unit 14 can be suppressed to the minimum.

In addition, according to the present embodiment, data read from a sub-array SA which is not adjacent to the data control unit 14 is amplified by an adjacent bit line connection unit 16, and the amplified data is transferred to the data control unit 14. More specifically, for example, in a case of FIG. 38, the transistor 601 of the bit line connection unit 16-3 is turned on according to data read from the sub-array SA2, and thus a current flows from the data control unit 14 to the ground voltage via the bit line BL of the sub-array SA3. At this time, the transistor 601 driving the bit line BL is a normal MOS transistor (this has the size (for example, a gate width) larger than a transistor of the memory cell and has a greater current driving force than the transistor of the memory cell) formed on the semiconductor substrate unlike in the memory cell. Therefore, a current for driving the bit line BL is considerably larger than a cell current flowing through the memory cell, and contributes to improvement in operation reliability.

In addition, in the method according to the present embodiment, as shown in FIG. 31, programming operations in a plurality of sub-arrays SA do not overlap each other. In other words, programming for a certain sub-array is performed after programming for another sub-array finishes. This is also the same for reading, and, as shown in FIG. 36, read operations in a plurality of sub-arrays SA do not overlap each other. In other words, reading for a certain sub-array is performed after reading for another sub-array finishes.

A plurality of sub-arrays are not operated together, and thereby peak performances which a variety of internal power supply circuits included in the NAND type flash memory 1 are required to have can be reduced. For this reason, the circuit area and peak current consumption of the NAND type flash memory 1 can be reduced.

Of course, if there is no particular problem in terms of the circuit area or power consumption, a plurality of sub-arrays may be operated together. A programming operation may be simultaneously performed on two or more sub-arrays in FIG. 31, and data may be simultaneously read from two or more sub-arrays in FIG. 36. Thereby, a write operation and a read operation can be performed at higher speed.

Further, according to the present embodiment, if the amplitude of a bit line voltage is sufficiently large (for example, 0 V to VDD) in the read operation, data which is sensed by each sense amplifier circuit SAC can be transferred to the data control unit 14 from the latch circuit 510 as it is. In other words, the latch circuit of the data control unit 14 can receive a signal as it is, specifically, without amplifying the signal. Therefore, a circuit operation can be performed more simply. In addition, if the amplitude of a bit line voltage is small or data is read by a current sensor in order to suppress power consumption, preferably, a signal amplifying circuit (the same circuit as the sense amplifier portion 71) is provided in the data control unit 14, and a signal transferred from the latch circuit 510 is amplified and is then stored in a latch circuit of the data control unit 14.

5. Fifth Embodiment

Next, a semiconductor memory device according to the fifth embodiment will be described. The present embodiment is different from the fourth embodiment in that data transferred from each latch circuit 510 is sensed and amplified by the sub-array control unit SC adjacent to the data control unit 14. Hereinafter, only the differences from the fourth embodiment will be described.

5.1 Read Operation

Figure 40:
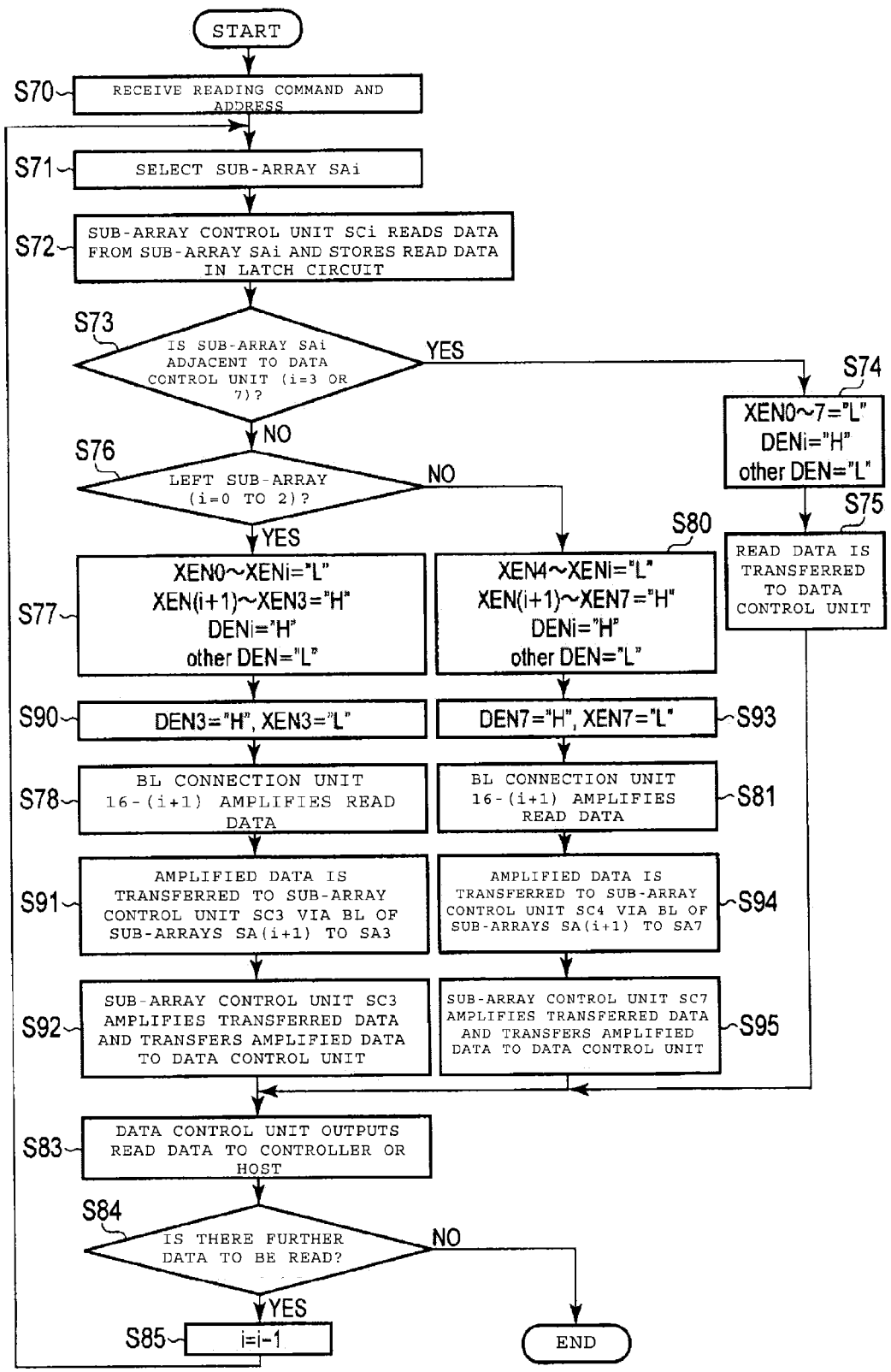
FIG. 40 is a flowchart illustrating a data reading method according to a fifth embodiment.

A read operation according to the present embodiment will be described with reference to FIG. 40. FIG. 40 is a flowchart illustrating a data reading method according to the present embodiment.

As shown in FIG. 40, in this method, if a left sub-array SAi which is not adjacent to the data control unit is selected, the signals DEN3 and XEN3 are respectively set to an "H" level and an "L" level as compared with FIG. 35 described in the fourth embodiment (step S90). Thereby, data (current) amplified by the bit line connection unit 16-(i+1) is transferred to the sub-array control unit SC3 via the bit lines BL of the sub-arrays SA(i+1) to SA3 (step S91). In addition, the sense amplifier circuit SAC of the sub-array control unit SC3 senses and amplifies the current, and transfers a result thereof to the data control unit 14 (step S92).

More specifically, first, the signals DENi and XEN(i+1) to XEN2 are set to an "H" level (if i=2, only the signal DEN2 is set to an "H" level). Thereby, data read from the sub-array SAi is transferred to the sub-array SA3 via the sub-arrays SA(i+1) to SA2, and is sensed and amplified by the sub-array control unit SC3, and a result thereof is stored in the latch circuit 510.

Next, the signal DENi is set to an "L" level, and the signal DEN3 is set to an "H" level. Thereby, the data in the latch circuit 510 of the sub-array control unit SC3 is transferred to the data control unit 14.

On the other hand, if a right sub-array SAi which is not adjacent to the data control unit is selected, the signals DEN7 and XEN7 are respectively set to an "H" level and an "L" level (step S93). Thereby, data (current) amplified by the bit line connection unit 16-(i+1) is transferred to the sub-array control unit SC7 via the bit lines BL of the sub-arrays SA(i+1) to SA4 (step S94). In addition, the sense amplifier circuit SAC of the sub-array control unit SC7 senses and amplifies the current, and transfers a result thereof to the data control unit 14 (step S95).

More specifically, first, the signals DENi and XEN(i+1) to XEN6 are set to an "H" level (if i=6, only the signal DEN6 is set to an "H" level). Thereby, data read from the sub-array SAi is transferred to the sub-array SA7 via the sub-arrays SA(i+1) to SA6, and is sensed and amplified by the sub-array control unit SC7, and a result thereof is stored in the latch circuit 510.

Next, the signal DENi is set to an "L" level, and the signal DEN7 is set to an "H" level. Thereby, the data in the latch circuit 510 of the sub-array control unit SC7 is transferred to the data control unit 14.

5.2 Specific Example of Read Operation

Figure 41:
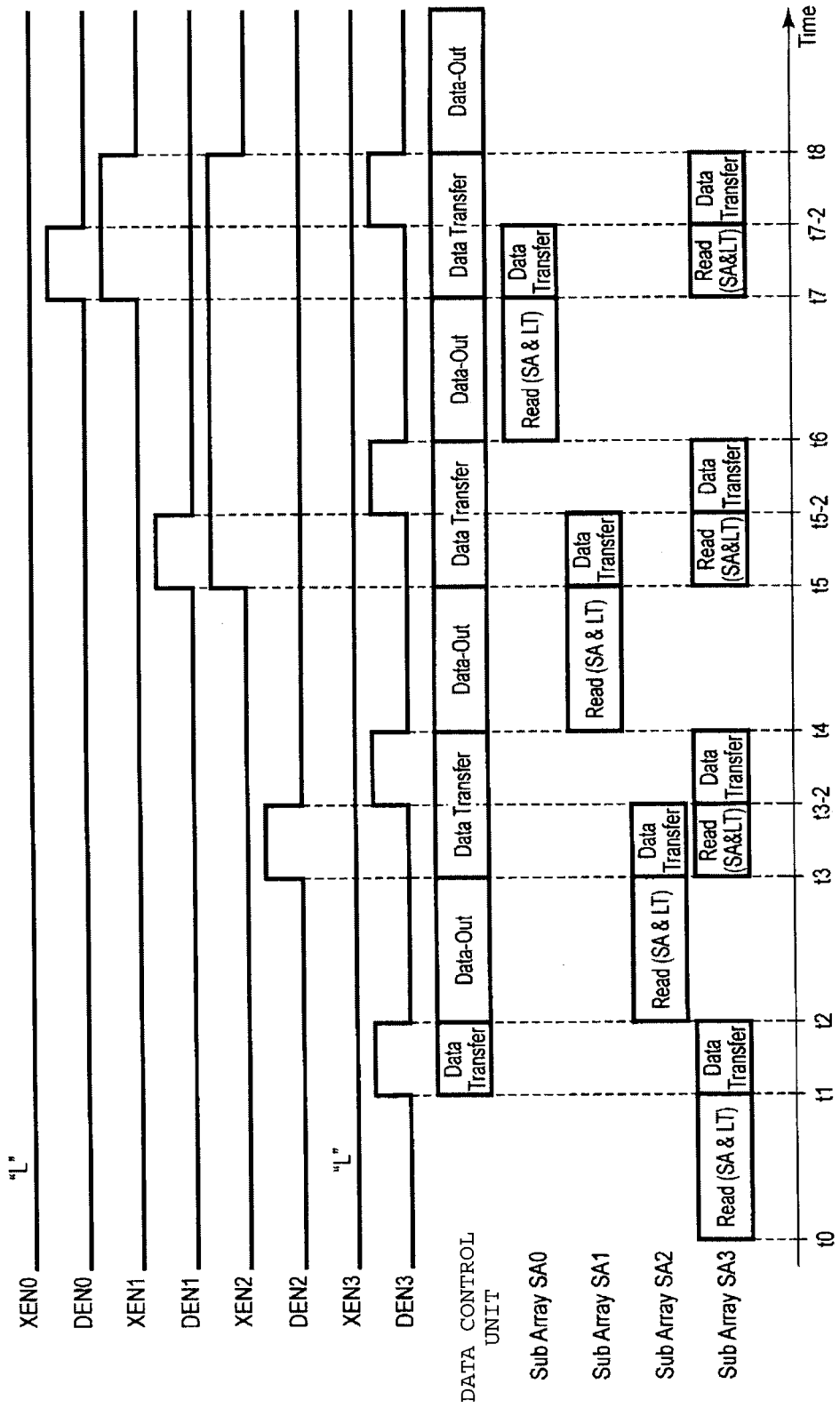
FIG. 41 is a timing chart illustrating various signals and processes in the read operation according to the fifth embodiment.
Figure 42:
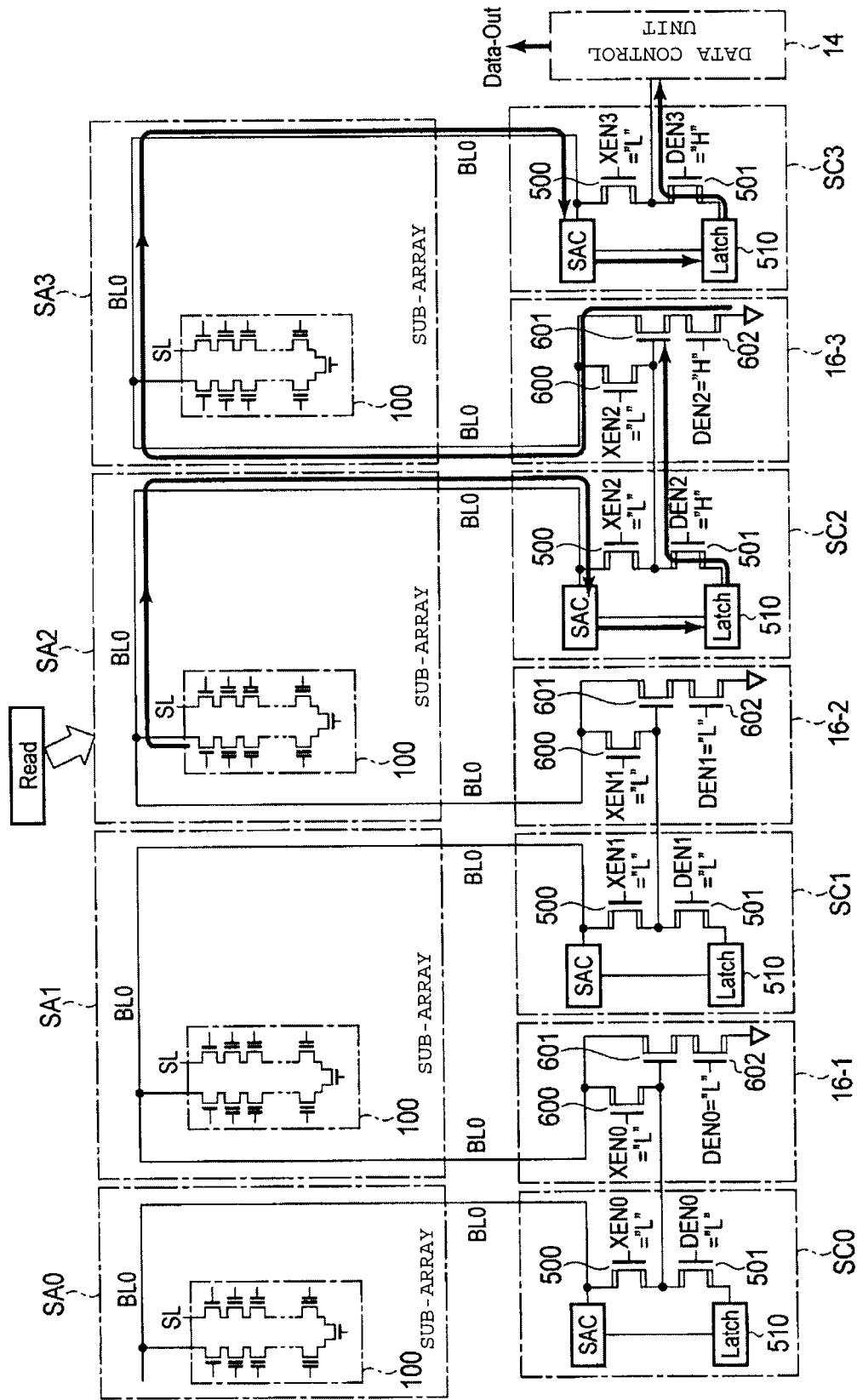
FIG. 42 is a circuit diagram of a memory cell array, a bit line connection unit, and a sub-array control portion according to the fifth embodiment.
Figure 43:
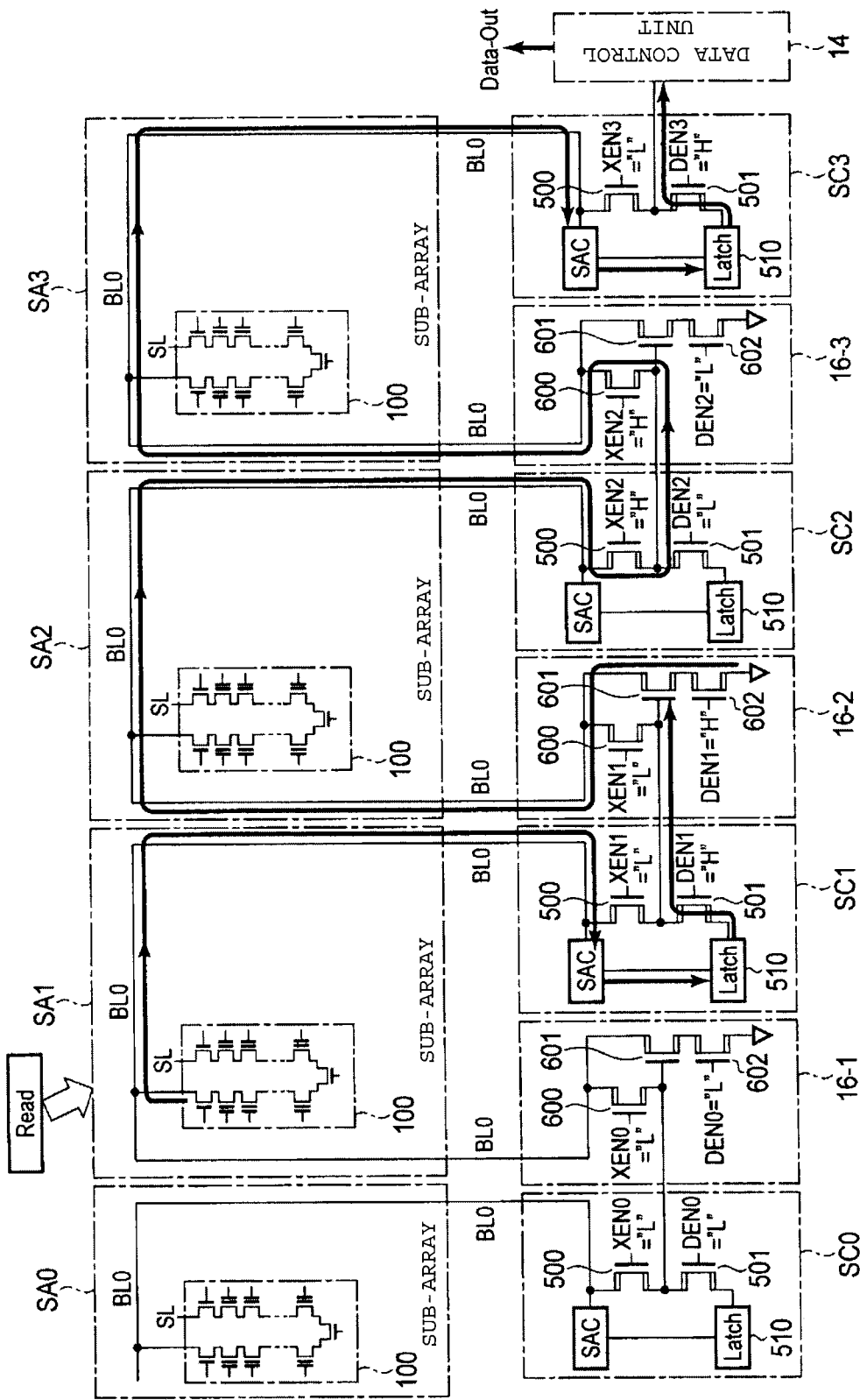
FIG. 43 is a circuit diagram of the memory cell array, the bit line connection unit, and the sub-array control portion according to the fifth embodiment.

Next, a specific example of the read operation according to the present embodiment will be described with reference to FIGS. 41 to 43. FIGS. 41 to 43 show a state in which a left sub-array is selected, and FIG. 41 is a timing chart illustrating logical levels of the respective control signals XEN and DEN, and operations of the data control unit 14 and the sub-arrays SA0 to SA3. In addition, FIGS. 42 and 43 are circuit diagrams of the sub-arrays SA0 to SA3, the sub-array control units SC0 to SC3, and the bit line connection units 16-1 to 16-3.

As shown in FIG. 41, the present embodiment is different from the fourth embodiment described with reference to FIG. 36 in that the signal XEN3 of the sub-array control unit SC3 which is the closest to the data control unit 14 is in an "L" level at all times, and the signal DEN3 is turned to an "H" level at all times when data is transferred from each sub-array SA to the data control unit 14.

Reading of data is the same as described in the fourth embodiment, and starts from the sub-array SA3 which is the closest to the data control unit 14. This operation is the same as described with reference to FIG. 37 in the fourth embodiment.

Next, at the time t2, data is read from the sub-array SA2. This state is shown in FIG. 42. When the data read from the sub-array SA2 is transferred to the data control unit 14, the signal XEN3 is in an "L" level. For this reason, the current of the bit line BL of the sub-array SA3 does not directly flow to the data control unit 14. Alternatively, the sense amplifier circuit SAC of the sub-array control unit SC3 senses and amplifies the current flowing through the bit line BL, and transfers a result thereof to the latch circuit 510. In addition, when the signal DEN3 is turned to an "H" level, the data in the latch circuit 510 is transferred to the data control unit 14.

In other words, first, during the period of the times t3 to t3-2, the data read from the sub-array SA2 is amplified when the DEN2 is turned to an "H" level, and is transferred to the sub-array SA3. In addition, the sense amplifier circuit SAC of the sub-array control unit SC3 reads the transferred data which is stored in the corresponding latch circuit 510. Subsequently, at the time t3-2, the signal DEN2 is turned to an "L" level, the signal DEN3 is turned to an "H" level, and thereby the data stored in the latch circuit 510 is transferred to the data control unit 14.

The same applies to a case of reading data from the other sub-arrays SA. FIG. 43 shows a state in which data is read from the sub-array SA1. Also in this case, the signal XEN3 is set to an "L" level, and the signal DEN3 is set to an "H" level. Therefore, a current which is driven by the transistor 601 of the bit line connection unit 16-2 is sensed and amplified by the sense amplifier circuit SAC of the sub-array control unit SC3. In addition, a result thereof is stored in the latch circuit 510 and is then transferred to the data control unit 14.

In other words, first, during the period of the times t5 to t5-2, the data read from the sub-array SA1 is amplified when the signal DEN1 is turned to an "H" level, and is transferred to the sub-array SA3 when the signal XEN is turned to an "H" level. In addition, the sense amplifier circuit SAC of the sub-array control unit SC3 reads the transferred data which is stored in the corresponding latch circuit 510. Subsequently, at the time t5-2, the signal DEN1 is turned to an "L" level, the signal DEN3 is turned to an "H" level, and thereby the data stored in the latch circuit 510 is transferred to the data control unit 14.

5.3 Effects According to Present Embodiment

As described above, the reading method described in the fourth embodiment may be modified as in the present embodiment.

As described in the fourth embodiment, a current driven by the transistor 601 is much larger than a cell current. Thereby, the time required for the sense amplifier circuit SAC of the sub-array control unit SC3 to sense and amplify the current may be very short.

In other words, in the present embodiment, if a data reading target sub-array is not adjacent to the data control unit 14, a read operation is performed in two steps. In the first step, data read from a reading target sub-array SAi is sensed and amplified by the sense amplifier circuit SAC of the sub-array control unit SCi corresponding to the sub-array, and is stored in the latch circuit 510. In the next step, a current which is driven by the transistor 601 according to the data stored in the latch circuit 510 in the first step is sensed and amplified by a sub-array control unit SC(i+k). Here, k is a natural number, and (i+k) is, for example, a number of a sub-array adjacent to the data control unit 14, and, in a case of this example, i+k=3 or 7. This sensing operation can be performed at very high speed. In addition, this sensing result is transferred to the data control unit 14.

In addition, according to the present embodiment, even if the amplitude of a bit line voltage is small or reading is performed through current sensing, a signal amplifying circuit is not required to be provided in the data control unit 14 as described in the fourth embodiment. Therefore, a circuit configuration can be simplified.

6. Sixth Embodiment

Next, a semiconductor memory device according to the sixth embodiment will be described. The present embodiment is different from the fourth embodiment in that left and right sub-arrays SA are accessed together. Hereinafter, only the differences from the fourth embodiment will be described.

6.1 Read Operation

Figure 44:
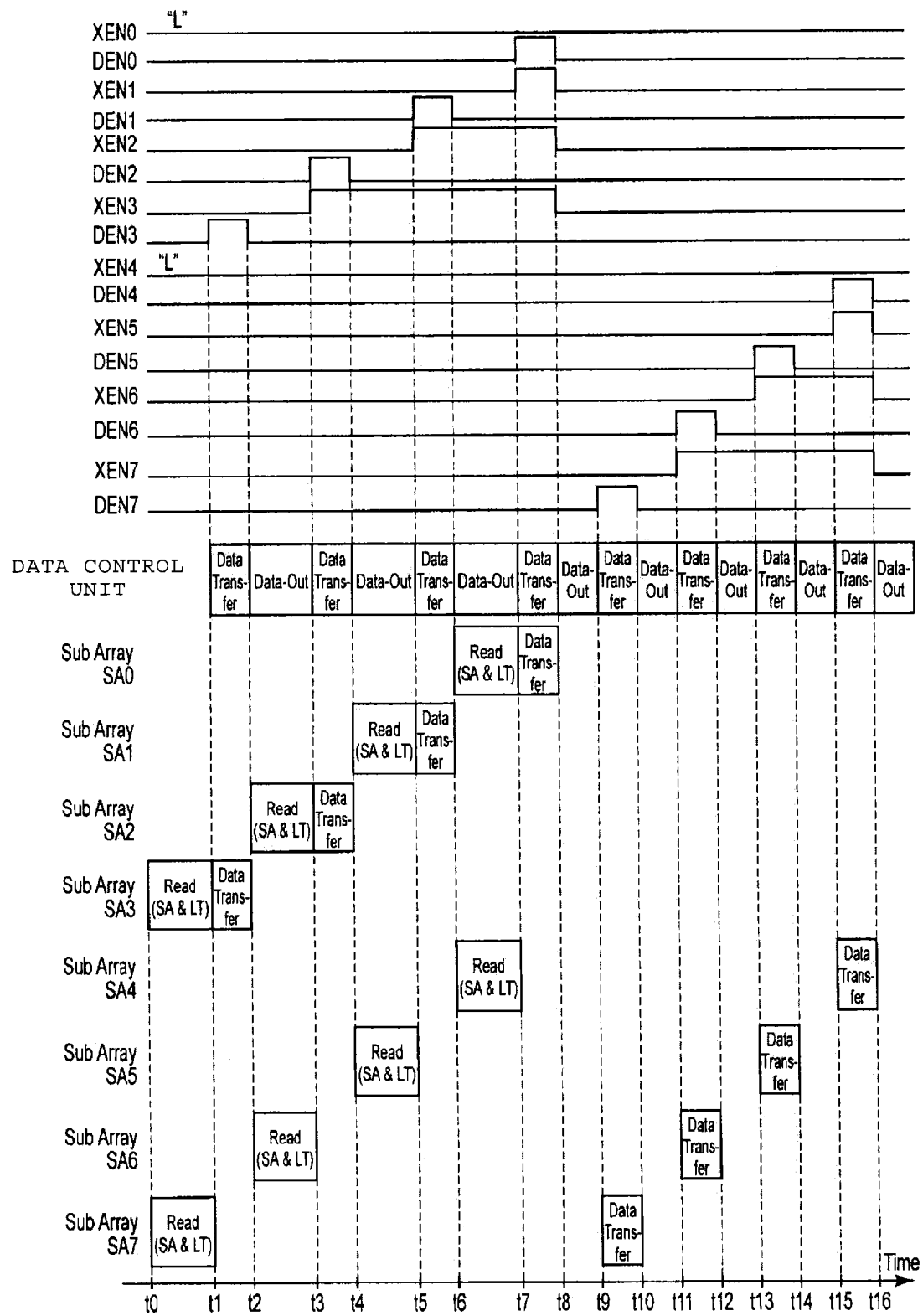
FIG. 44 is a timing chart illustrating various signals and processes in the read operation according to a sixth embodiment.

A data reading method according to the present embodiment will be described with reference to FIG. 44. FIG. 44 is a timing chart illustrating logical levels of the signals XEN0 to XEN7 and DEN0 to DEN7, and operation content of the data control unit and the sub-arrays SA0 to SA7.

As shown in FIG. 44, operations of the left sub-arrays SA0 to SA3 at the times t0 to t8 are the same as in the fourth embodiment with reference to FIG. 41. In the present embodiment, data is also read from the right sub-arrays SA4 to SA7 along with reading of data from the sub-arrays SA0 to SA3.

In other words, between the times t0 and t1, along with reading of data from the sub-array SA3, data is also read from the sub-array SA7 and is stored in the corresponding latch circuit 510. In addition, between the times t2 and t3, along with reading of data from the sub-array SA2, data is also read from the sub-array SA6 and is stored in the corresponding latch circuit 510. Between the times t4 and t5, along with reading of data from the sub-array SA1, data is also read from the sub-array SA5 and is stored in the corresponding latch circuit 510. Between the times t6 and t7, along with reading of data from the sub-array SA0, data is also read from the sub-array SA4 and is stored in the corresponding latch circuit 510.

In addition, when the data of the sub-array SA0 is output from the data control unit 14 between the time t8 and t9, data is transferred to the data control unit 14 from the latch circuit 510 corresponding to the sub-array SA7 between the times t9 and t10, and then this data is output to the controller or the host apparatus. Subsequently, the data of the sub-arrays SA6 to SA4 is sequentially transferred to the data control unit 14 from the corresponding latch circuits 510.

6.2 Effects According to Present Embodiment

In the above-described configuration according to the fourth embodiment, access to the left sub-arrays SA does not exert a particular influence on the right sub-arrays SA, and vice versa. Therefore, as in the present embodiment, along with reading of data from the left sub-arrays SA, data is also read from the right sub-arrays SA and is stored in the latch circuit, and thereby the data of the left sub-arrays SA can be transferred to the data control unit 14, and then the data of the right sub-arrays SA can be rapidly transferred to the data control unit 14.

In addition, although, in the above-described embodiment, a case where data of the left sub-arrays is output to the data control unit 14 and then data of the right sub-arrays is output to the data control unit 14 is described as an example, this order may be reversed.

Further, the present embodiment is applicable to the reading method according to the fifth embodiment.

In addition, as described in the fourth embodiment, if data is simultaneously read from a plurality of sub-arrays, power consumption increases. Therefore, reading timing may be delayed in the left sub-arrays and the right sub-arrays. For example, in FIG. 44, a read operation from the sub-array SA7 is performed not between the times t0 and t1 but between the times t1 and t2, and a read operation from the sub-array SA6 is performed not between the times t2 and t3 but between the times t3 and t4. Thereby, increase in power consumption can be suppressed.

7. Modification Examples and the Like

As described above, the semiconductor memory device 1 according to the present embodiment includes a first sub-array (the sub-array 10L in FIG. 12), a second sub-array (the sub-array 10R in FIG. 12), a first bit line (BLe_L in FIG. 12), a second bit line (BLe_R in FIG. 12), a bit line connection unit (16 in FIG. 12), a first sense amplifier (71L and 70L in FIG. 12), a first source line (SL_L in FIG. 9), a second source line (SL_R in FIG. 9), and a source line driver (17 in FIG. 9).

The first sub-array (the sub-array 10L in FIG. 12) includes a plurality of first memory cells which are stacked on a semiconductor substrate and each of which includes a charge storage layer and a control gate. The second sub-array (the sub-array 10R in FIG. 12) includes a plurality of second memory cells which are stacked on the semiconductor substrate and each of which includes a charge storage layer and a control gate.

The first bit line (BLe_L in FIG. 12) is connected to a first group of the first memory cells. The second bit line (BLe_R in FIG. 12) is connected to a first group of the second memory cells. The bit line connection unit (16 in FIG. 12) connects or disconnects the first bit line to or from the second bit line.

The first sense amplifier (71L and 70L in FIG. 12) reads data from the first bit line and the second bit line, and transfers data to be written to the first bit line and the second bit line.

The first source line (SL_L in FIG. 9) is connected to the first memory cells. The second source line (SL_R in FIG. 9) is connected to the second memory cells. The source line driver (17 in FIG. 9) can apply voltages to the first source line and the second source line.

When reading and writing access to the first memory cells is performed, the first sense amplifier (71L and 70L) is connected to the first bit line (BLe_L) in a state in which the first bit line (BLe_L) is disconnected from the second bit line (BLe_R) by the bit line connection unit (FIG. 12).

When reading and writing access to the second memory cells is performed, the bit line connection unit connects the first bit line (BLe_L) to the second bit line (BLe_R) such that the first sense amplifier (71L and 70L) is connected to the second bit line (BLe_R) via the first bit line (BLe_L) (FIG. 13).

When erase access to the first memory cells and the second memory cells is performed, the source line driver applies an erase voltage (VERA in FIG. 19) to one of the first source line and the second source line, corresponding to a memory cell which is an erase target, and does not apply the erase voltage to the other thereof corresponding to a memory cell which is not an erase target (FIGS. 19 and 20).

Further, a semiconductor memory device 1 according to an embodiment includes a first sub-array (SA3 in FIG. 38), a second sub-array (SA2 in FIG. 38), a first bit line (BL of SA3 in FIG. 38), a second bit line (BL of SA2 in FIG. 38), a first sense amplifier (SC3 in FIG. 38), a second sense amplifier (SC2 in FIG. 38), a first bit line connection unit (transistors 500 and 600 of SC2 and 16-3 in FIG. 38), a first signal transmission unit (transistors 501, 601 and 602 of SC2 and 16-3 in FIG. 38), and a data control unit (14 in FIG. 38).

The first sub-array (SA3 in FIG. 38) includes a plurality of first memory cells stacked on a semiconductor substrate. The second sub-array (SA2 in FIG. 38) includes a plurality of second memory cells stacked on the semiconductor substrate.

The first bit line (BL of SA3 in FIG. 38) is connected to the first memory cells. The second bit line (BL of SA2 in FIG. 38) is connected to the second memory cells.

The first sense amplifier (SC3 in FIG. 38) is provided so as to correspond to the first sub-array. The second sense amplifier (SC2 in FIG. 38) is provided so as to correspond to the second sub-array.

The first bit line connection unit (transistors 500 and 600 of SC2 and 16-3 in FIG. 38) connects or disconnects the first bit line to or from the second bit line. The first signal transmission unit (transistors 501, 601 and 602 of SC2 and 16-3 in FIG. 38) transmits a signal between the first bit line and the second bit line.

The data control unit (14 in FIG. 38) controls input and output of data between the first and second sub-arrays and an external device.

In the read operation from the second sub-array (SA2 in FIG. 38), the second sense amplifier (SC2 in FIG. 38) senses the second bit line (BL of SA2 in FIG. 38). In addition, the first bit line connection unit (transistors 500 and 600 of SC2 and 16-3 in FIG. 38) transmits a signal to the first bit line (BL of SA3 in FIG. 38) according to the sensing result in the second sense amplifier such that read data is transferred to the data control unit (FIG. 38).

According to this configuration, operation speed of a semiconductor memory device can be improved.

In addition, an embodiment is not limited thereto, and may have various modifications.

7.1 First Modification Example

Figure 45:
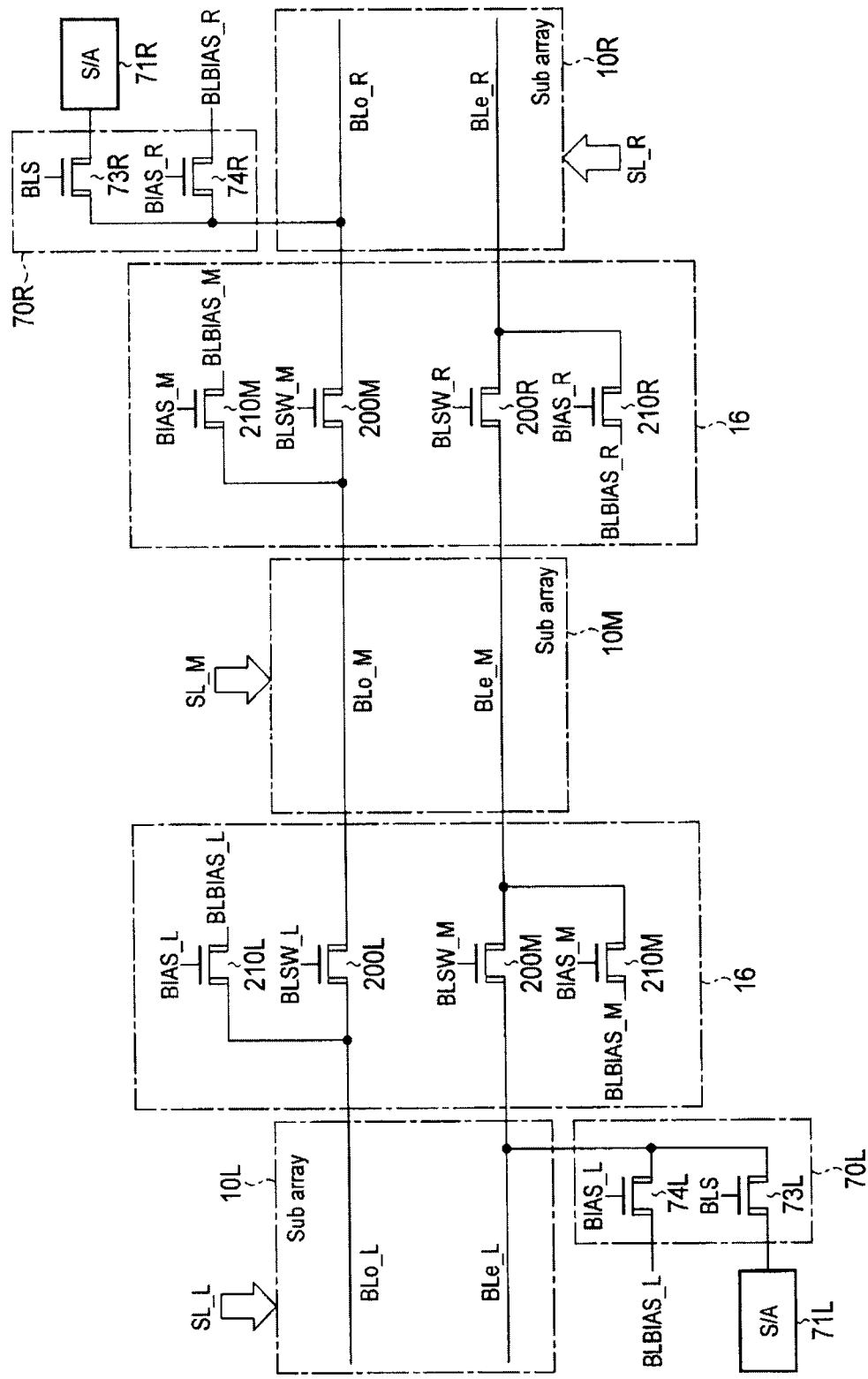
FIG. 45 is a circuit diagram of a memory cell array, a bit line connection unit, and a sub-array control portion according to a first modification example of the first to third embodiments.

For example, in the first to third embodiments, the number of sub-arrays may be three or more. FIG. 45 shows the memory cell array, the bit line connection unit 16, and the sense amplifier circuits SAC in this case.

As shown in FIG. 45, the memory cell array 10 includes the left sub-array 10L, the right sub-array 10R, and a central sub-array 10M interposed therebetween. In addition, the bit line connection unit 16 is provided between the sub-arrays 10L and 10M and between the sub-arrays 10M and 10R.

In this configuration, if the central sub-array 10M is a reading target, the even-numbered central bit line BLe_M is connected to the bit line BLe_L via a transistor 200M, and is precharged and sensed by the sense amplifier portion 71L. At this time, the right bit line BLe_R is disconnected from the bit line BLe_M. In addition, the odd-numbered central bit line BLo_M is connected to the bit line BLo_R via the transistor 200M, and is precharged and sensed by the sense amplifier portion 71R. At this time, the left bit line BLo_L is disconnected from the bit line BLo_M. The same applies to programming.

In addition, if the central sub-array 10M is an erase target, the even-numbered central bit line BLe_M is disconnected from the bit lines BLe_L and BLe_R by the transistors 200M and 200R, and the erase voltage VERA is given thereto via the transistor 210M. The same applies to the odd-numbered central bit line BLo_M.

7.2 Second Modification Example

In addition, in the first to third embodiments, for example, as described with reference to FIGS. 3, 4 and 7, the sense amplifier circuits SAC are disposed on both sides with the bit line connection unit 16 interposed therebetween in the direction D1 along the bit line. In other words, as shown in FIG. 7, the sense amplifier circuit SAC connected to the left bit line BL_L is disposed on the left of the bit line connection unit 16, and the sense amplifier circuit SAC connected to the right bit line BL_R is disposed on the right of the bit line connection unit 16. However, the sense amplifier circuits SAC may be disposed on one side of the bit line connection unit 16. This example is shown in FIG. 46.

Figure 46:
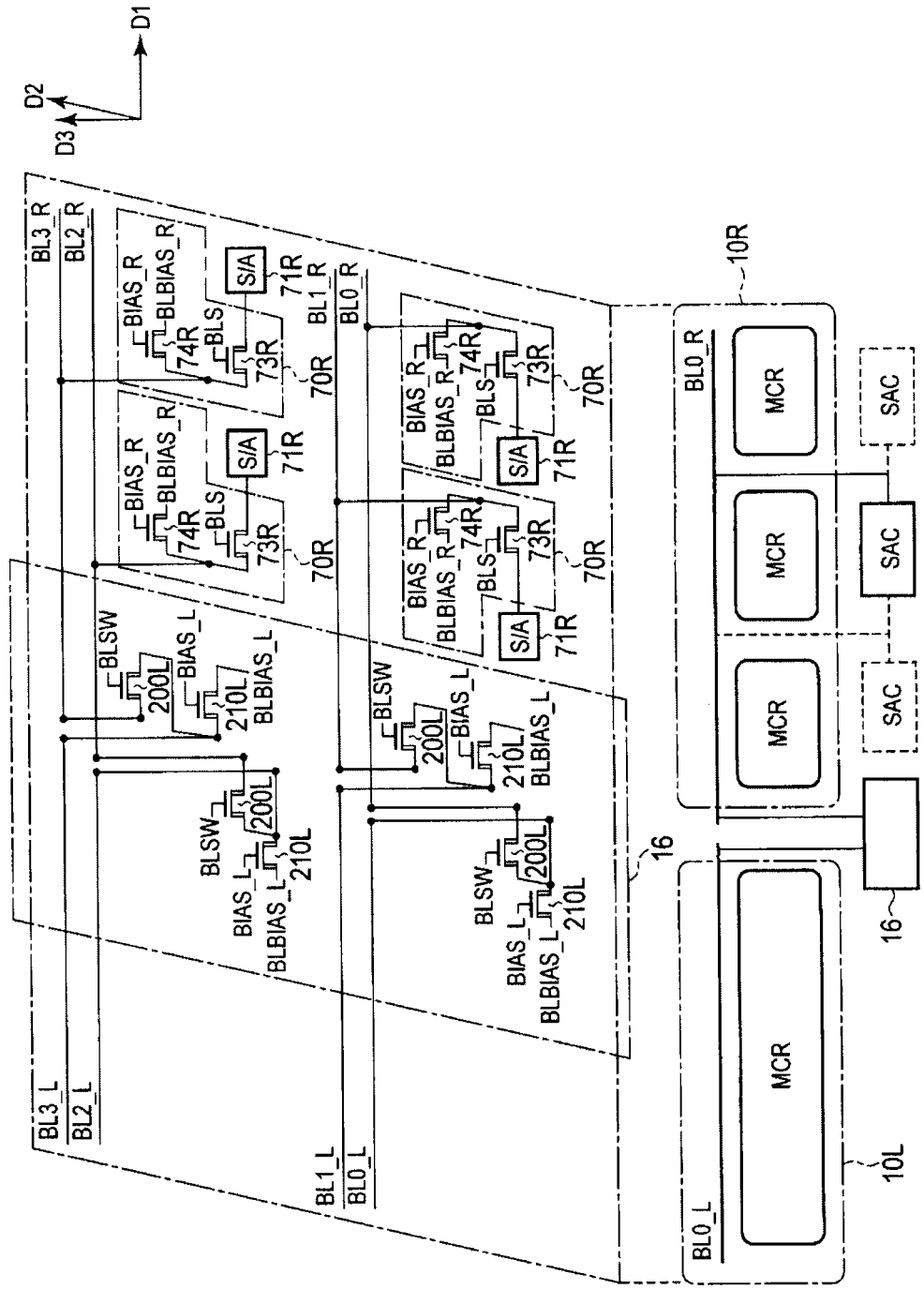
FIG. 46 is a circuit diagram illustrating a positional relationship between a memory cell array, a sense amplifier, and a bit line connection unit according to a second modification example of the first to third embodiments.

In the example shown in FIG. 46, all the sense amplifier circuits SAC are disposed on the right of the bit line connection unit 16. In other words, the sense amplifier circuits SAC connected to the even-numbered bit lines BLe are disposed directly under the right sub-array 10R in the same manner as the sense amplifier circuits SAC connected to the odd-numbered bit lines BLo. The sense amplifier circuits SAC are controlled by signals BLS, BIAS_R and BLBIAS_R. In addition, in the write operation and is read, a voltage of the bit line BL is controlled by the sense amplifier circuit SAC.

The transistor 200L of the bit line connection unit 16 connects the left bit line BL_L to the right bit line BL_R when the left sub-array 10L is selected. In addition, the transistor 210L allows the erase voltage VERA to be supplied to the left bit line BL_L in the erase operation from the left sub-array 10L.

Figure 47:
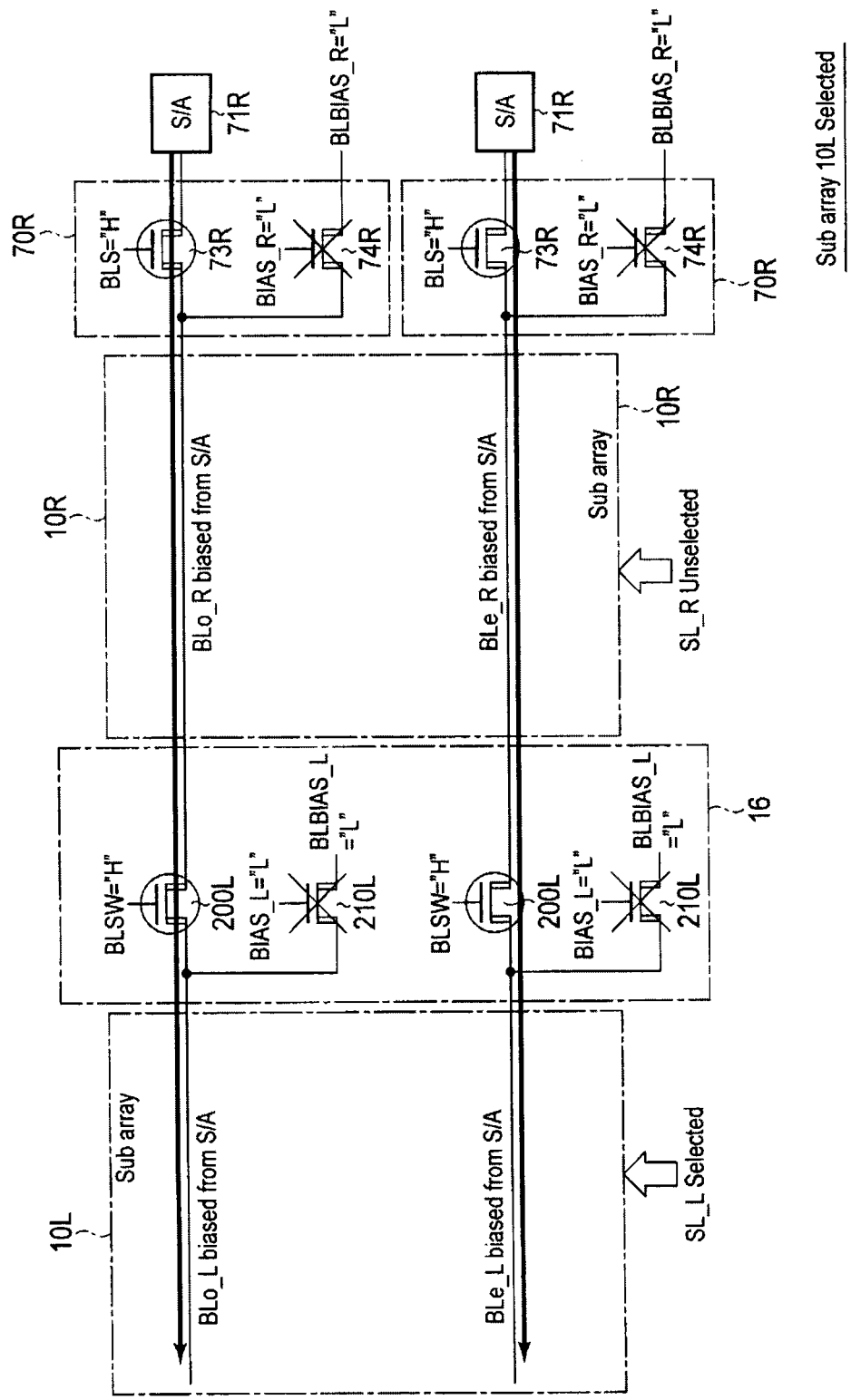
FIG. 47 is a circuit diagram of the memory cell array, the bit line connection unit, and a sub-array control portion according to the second modification example of the first to third embodiments.

FIG. 47 shows a state in which the left sub-array 10L is selected in reading and write operations of this example. As shown in FIG. 47, the transistors 200L are turned on in the bit line connection unit 16, and thereby the left bit lines BLe_L and BLo_L are respectively electrically connected to the right bit lines BLe_R and BLo_R. In addition, the transistors 210L are turned off. Further, in the bit line hook-up portions 70R, the transistors 73R are turned on, and the transistors 74R are turned off.

As a result of the above operation, voltages are applied to the left bit lines BLe_L and BLo_L by the sense amplifier portions 71R via the right bit lines BLe_R and BLo_R. In addition, the left source line SL_L is turned to a selection state, and thus voltages which are required for reading and writing data are applied thereto, and the right source line SL_R is unselected.

Figure 48:
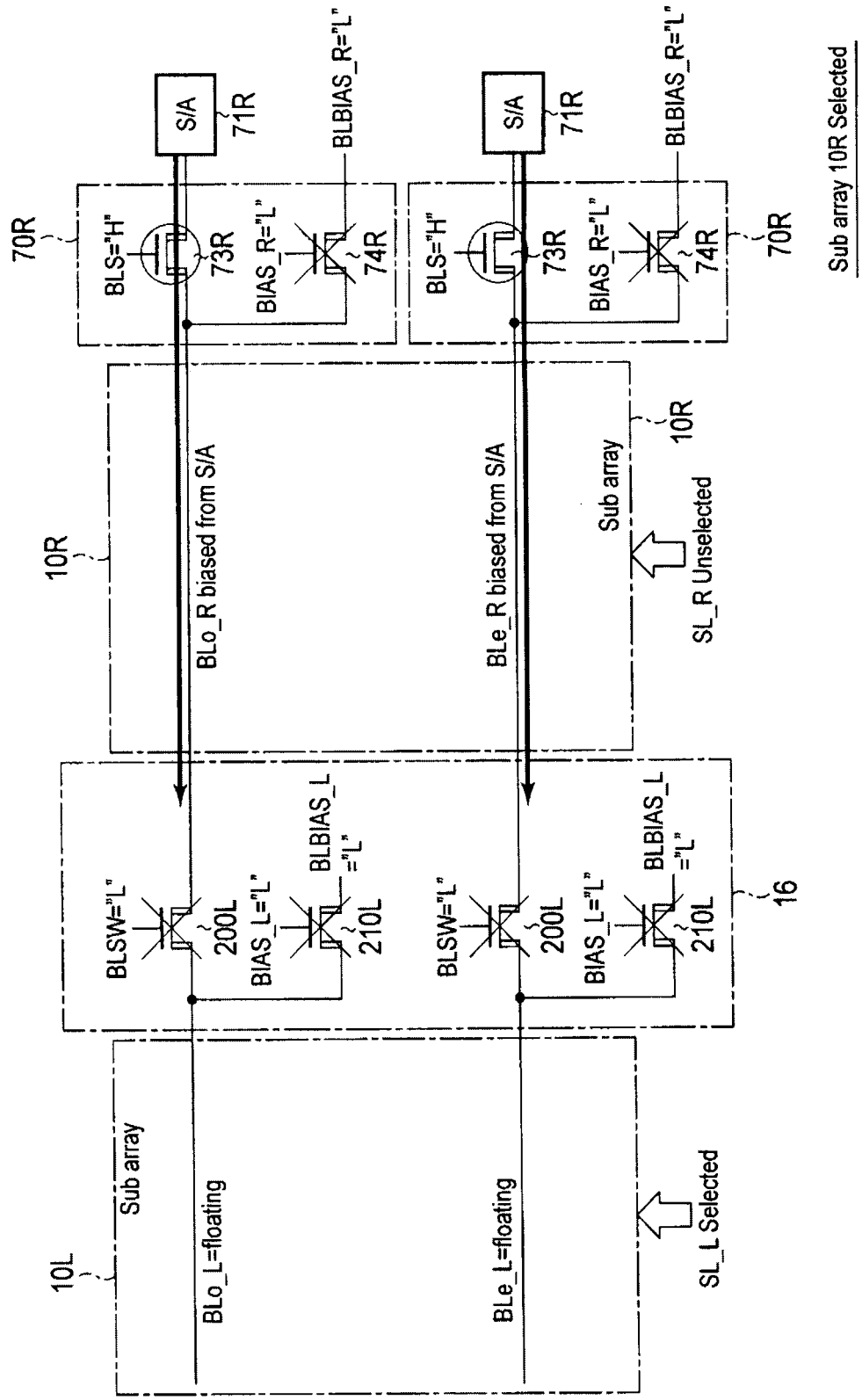
FIG. 48 is a circuit diagram of the memory cell array, the bit line connection unit, and the sub-array control portion according to the second modification example of the first to third embodiments.

FIG. 48 shows a state in which the right sub-array 10R is selected in reading and write operations of this example. As shown in FIG. 48, the transistors 200L are turned off in the bit line connection unit 16, and thereby the left bit lines BLe_L and BLo_L are respectively electrically disconnected from the right bit lines BLe_R and BLo_R. In addition, the transistors 210L are turned off. Further, in the bit line hook-up portions 70R, the transistors 73R are turned on, and the transistors 74R are turned off.

As a result of the above operation, the left bit lines BLe_L and BLo_L are electrically floated, and voltages are applied to the right bit lines BLe_R and BLo_R by the sense amplifier portions 71R. In addition, the right source line SL_R is turned to a selection state, and thus voltages which are required for reading and writing data are applied thereto, and the left source line SL_L is unselected.

Figure 49:
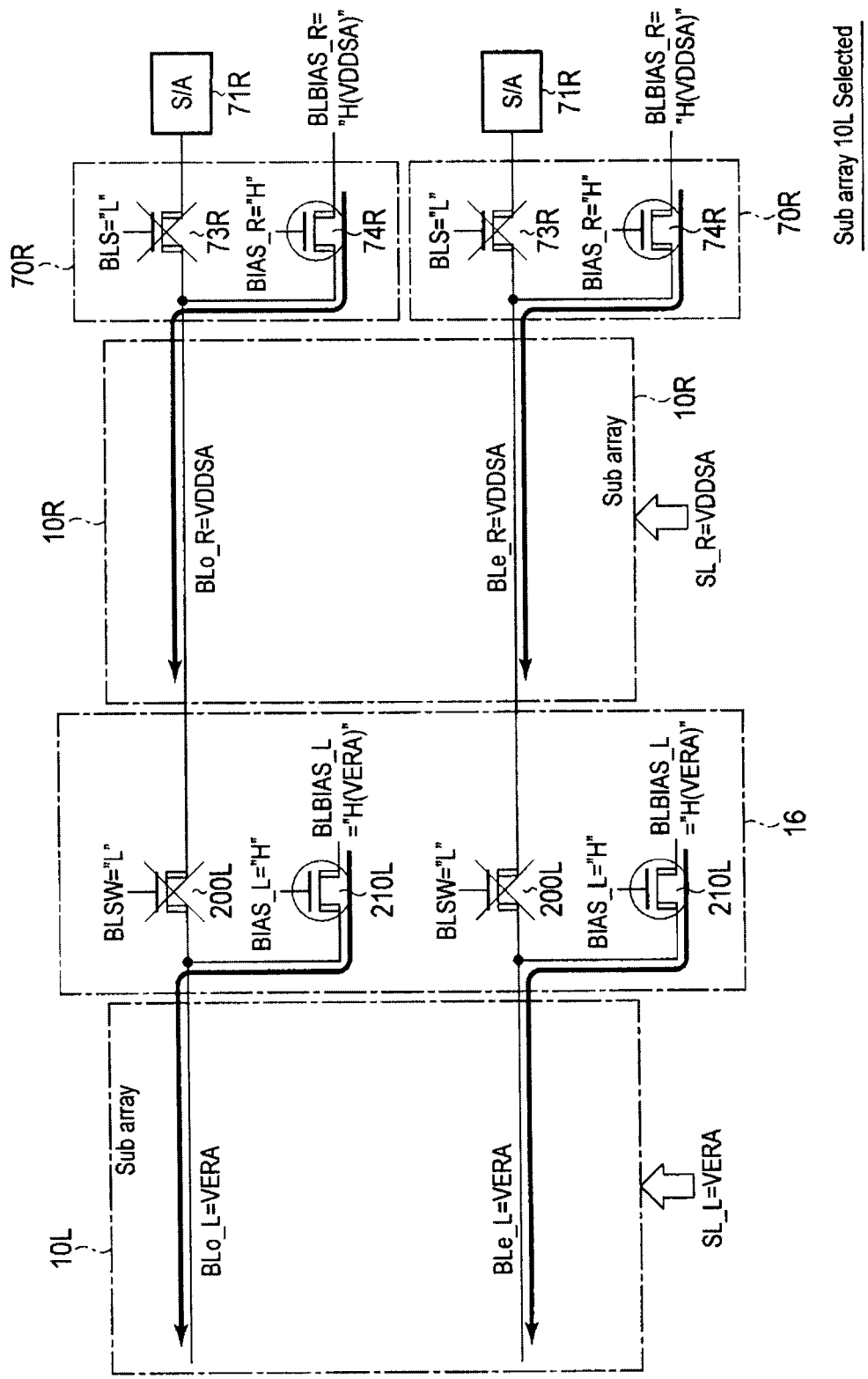
FIG. 49 is a circuit diagram of the memory cell array, the bit line connection unit, and the sub-array control portion according to the second modification example of the first to third embodiments.

FIG. 49 shows a state in which the left sub-array 10L is selected in an erase operation of this example. As shown in FIG. 49, the transistors 200L are turned off in the bit line connection unit 16, and thereby the left bit lines BLe_L and BLo_L are respectively electrically disconnected from the right bit lines BLe_R and BLo_R. In addition, the transistors 210L are turned on. Thereby, the erase voltage VERA is applied to the left bit lines BLe_L and BLo_L via the transistors 210L. In addition, the erase voltage VERA is also applied to the left source line SL_L.

Further, in the bit line hook-up portions 70R, the transistors 73R are turned off, and the transistors 74R are turned on. Thereby, a voltage VDDSA is applied to the right bit lines BLe_R and BLo_R via the transistors 74R. In addition, the voltage VDDSA is applied to the right source line SL_R. The voltage VDDSA is higher than the power supply voltage VDD. Also in the first to third embodiments, in the erase operation, the voltage VDDSA may be applied to an unselected bit line and an unselected source line instead of the voltage VDD.

Figure 50:
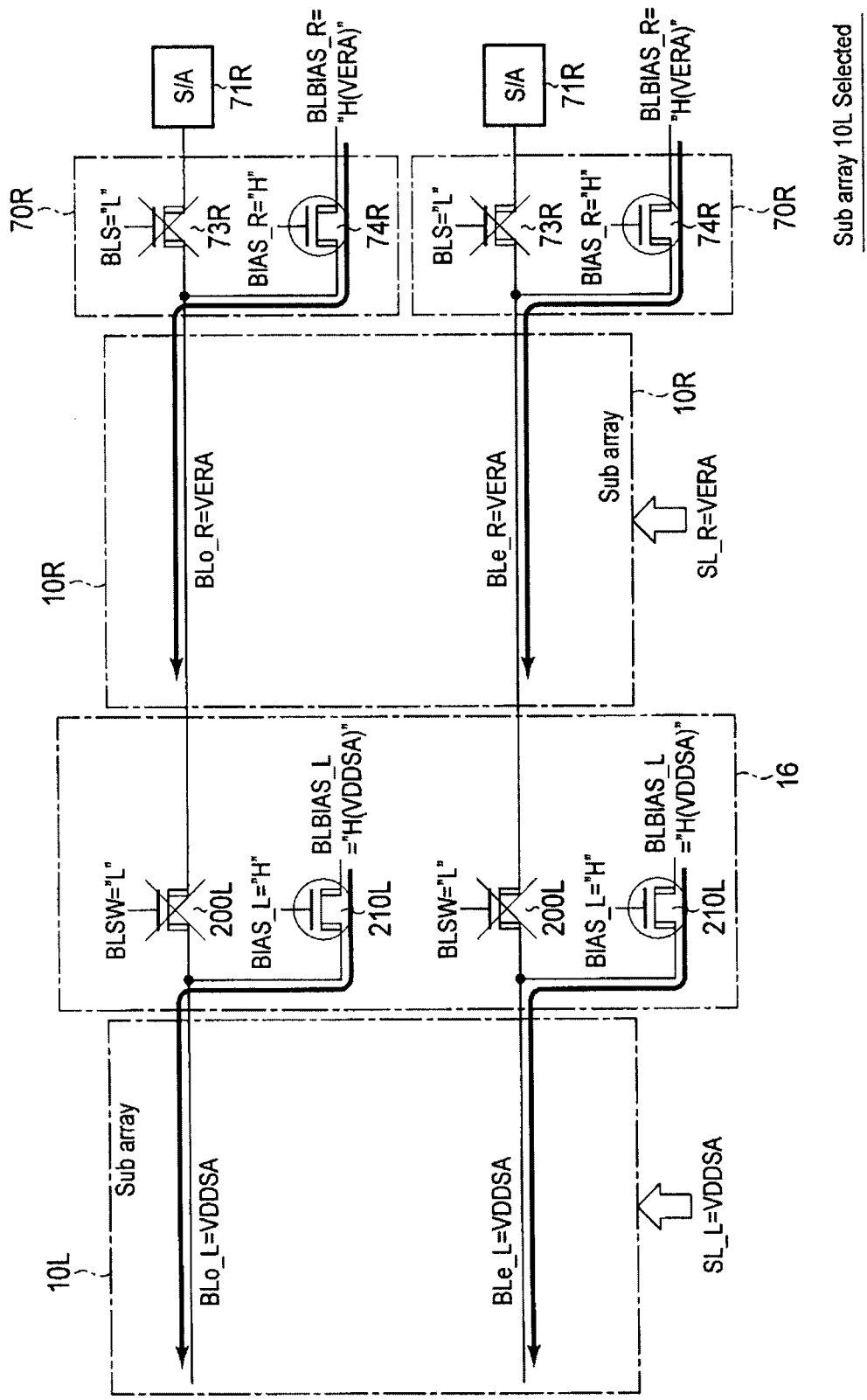
FIG. 50 is a circuit diagram of the memory cell array, the bit line connection unit, and the sub-array control portion according to the second modification example of the first to third embodiments.

FIG. 50 shows a state in which the right sub-array 10R is selected in an erase operation of this example. As shown in FIG. 50, the transistors 200L are turned off in the bit line connection unit 16, and thereby the left bit lines BLe_L and BLo_L are respectively electrically disconnected from the right bit lines BLe_R and BLo_R. In addition, the transistors 210L are turned on. Thereby, the voltage VDDSA is applied to the left bit lines BLe_L and BLo_L via the transistors 210L. In addition, the voltage VDDSA is also applied to the left source line SL_L.

Further, in the bit line hook-up portions 70R, the transistors 73R are turned off, and the transistors 74R are turned on. Thereby, the erase voltage VERA is applied to the right bit lines BLe_R and BLo_R via the transistors 74R. In addition, the erase voltage VERA is also applied to the right source line SL_R.

As described above, the sense amplifier circuits SAC may be disposed on one side of the bit line connection unit 16. In the above-described example, the sense amplifier circuits SAC are disposed on the right of the bit line connection unit 16, but may be disposed on the left of the bit line connection unit 16. In this case, the left bit line BL_L is biased by the sense amplifier circuit SAC in the read operation, written, and erased. On the other hand, the right bit line BL_R is biased by the sense amplifier circuit SAC via the left bit line BL_L in the read operation and written, and is biased by the bit line connection unit 16 in the erase operation.

7.3 Third Modification Example

Figure 51:
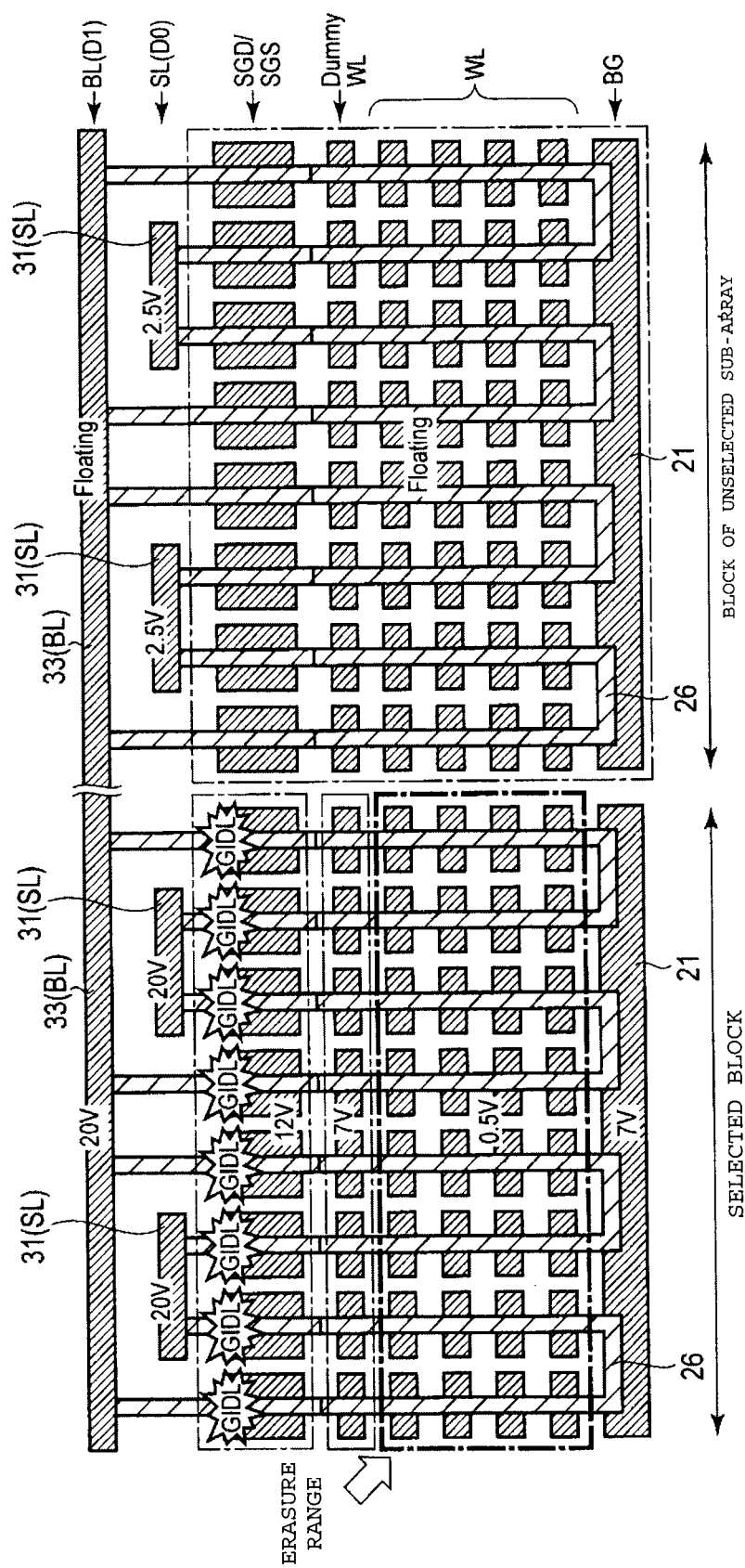
FIG. 51 is a cross-sectional view of a memory cell array according to a first modification example of the first to sixth embodiments.

In addition, the NAND strings 100 described in the first embodiment may include dummy word lines. FIG. 51 is a cross-sectional view of the NAND strings 100, and shows an erase state. As shown in FIG. 51, dummy word lines are provided between the word line WL0 and the select gate line SGS, and between the word line WL7 and the select gate line SGD. A dummy cell formed by the dummy word lines is not substantially treated as holding data, and, for example, is in an ON state at all times.

In addition, in a case of this example, an intermediate voltage between the voltage VERA_GIDL and the voltage VERA_WL is applied to the dummy word lines in the erase operation. Thereby, voltage stress applied to the NAND strings 100 can be reduced.

In addition, data is not necessarily required to be erased in the unit of a block. For example, in an erase target block, voltages of any of select gate lines SGD and SGS are set to a low voltage which does not cause GIDL, and thereby a memory group GP corresponding to the select gate lines SGD and SGS can be excluded from an erase target.

7.4 Other Modification Examples

In addition, in the above-described embodiments, the three-dimensional stacked NAND type flash memory is described as an example of the semiconductor memory device. However, a configuration of the three-dimensional stacked NAND type flash memory is not limited to the configuration as shown in FIG. 4. For example, a semiconductor layer in which a current path of a NAND string may have not a U shape but a single columnar shape. In this case, the transistor BT is unnecessary. In addition, the embodiments are not limited to a three-dimensional stacked type and are applicable to a NAND type flash memory or the like in the related art in which memory cells are arranged in a two-dimensional manner in a plane of a semiconductor substrate.

Figure 52:
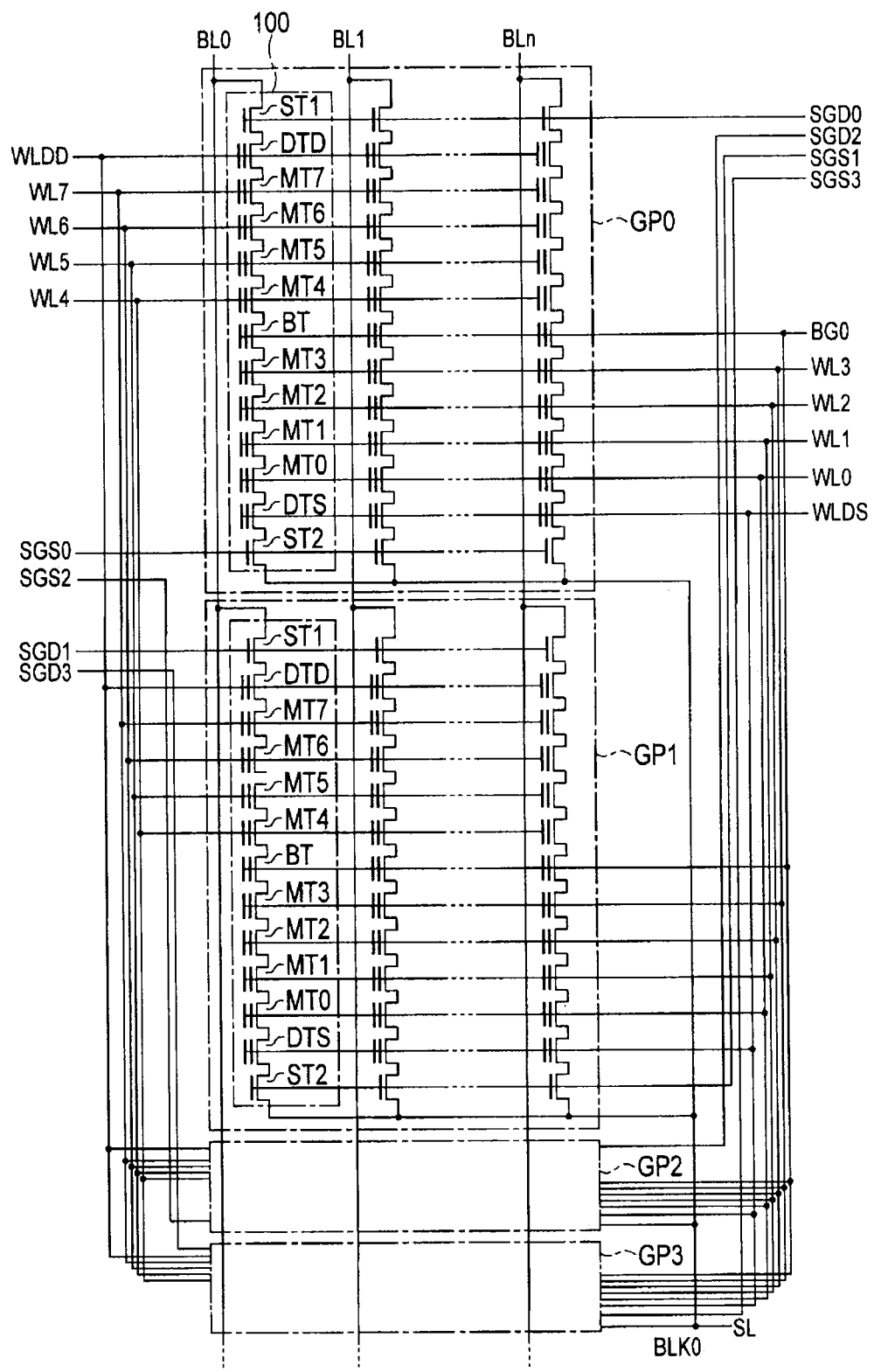
FIG. 52 is a circuit diagram of a memory cell array according to a second modification example of the first to sixth embodiments.

In addition, the memory cell array shown in FIG. 2 may have a configuration as shown in FIG. 52. FIG. 52 is a circuit diagram of the block BLK0, and other blocks BLK may have the same configuration. As shown in FIG. 52, the word lines WL0 to WL3, the dummy word line WLDS adjacent to the word line WL0, the back gate line BG, the even-numbered select gate lines SGD0 and SGD2, and odd-numbered select gate lines SGS1 and SGS3 are extracted to one end side of the memory cell array 10. On the other hand, the word lines WL4 to WL7, the dummy word line WLDD adjacent to the word line WL7, the even-numbered select gate lines SGS0 and SGS2, and odd-numbered select gate lines SGD1 and SGD3 are extracted to the other end side which is opposite to one end side of the memory cell array. This configuration may be used. In this configuration, for example, the row decoder 11 may be divided into two row decoders, and the two row decoders may be disposed so as to be opposite to each other with the memory cell array 10 interposed therebetween. In addition, the select gate lines SGD0, SGD2, SGS1 and SGS3, the word lines WL0 to WL3, the dummy word line WLDS, and the back gate line BG may be selected using one row decoder, and the select gate lines SGS0, SGS2, SGD1 and SGD3, the word lines WL4 to WL7, and the dummy word line WLDD may be selected using the other row decoder. According to this configuration, it is possible to alleviate complexity of lines such as the select gate lines or the word lines of the region (including the row decoders 11) between the row driver 12 and the memory cell array 10.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a first sub-array including a plurality of first memory cells stacked above a semiconductor substrate;
a second sub-array including a plurality of second memory cells stacked above the semiconductor substrate;
a first bit line electrically connected to a first group of the first memory cells;
a second bit line electrically connected to a first group of the second memory cells;

a bit line connection unit configured to connect the first bit line and the second bit line;

a first sense amplifier configured to receive a first voltage from either of the first bit line or the second bit line in a read operation, and transfer a second voltage to either of the first bit line or the second bit line in a write operation;

a first source line electrically connected to the first memory cells;

a second source line electrically connected to the second memory cells; and a source line driver configured to apply voltages to the first source line and the second source line, wherein the first sense amplifier is electrically connected to the first bit line on the condition that the first bit line is disconnected from the second bit line in either the read operation of the first memory cells or the write operation of the first memory cells, the bit line connection unit electrically connects the first bit line to the second bit line in either the read operation of the second memory cells or the write operation of the second memory cells, and the source line driver applies an erase voltage to the first source line and does not apply the erase voltage to the second source line in an erase operation of the first memory cells.

2. The device according to claim 1, wherein the source line driver applies a voltage lower than the erase voltage to the second source line in an erase operation of the first memory cells.

3. The device according to claim 1, wherein the source line driver causes the second source line to be a floating state in an erase operation of the first memory cells.

4. The device according to claim 1, wherein, when an erase operation is performed for the first memory cells, the sense amplifier applies the erase voltage to the first bit line in a state in which the second bit line is disconnected from the first bit line by the bit line connection unit, and when an erase operation is performed for the second memory cells, the bit line connection unit applies the erase voltage to the second bit line in a state in which the first bit line is disconnected from the second bit line.

5. The device according to claim 1, further comprising:

a third bit line electrically connected to a second group of the first memory cells;

a fourth bit line electrically connected to a second group of the second memory cells; and a second sense amplifier configured to receive a third voltage from the third bit line or the fourth bit line, and transfers a fourth voltage to the third bit line or the fourth bit line, wherein the bit line connection unit further electrically connects the third bit line to the fourth bit line, the bit line connection unit further electrically connects the third bit line to the fourth bit line in the read operation or the write operation for the first memory cells, and the second sense amplifier is electrically connected to the fourth bit line in a state in which the third bit line is further disconnected from the fourth bit line by the bit line connection unit in the read operation or the write operation for the second memory cells.

6. The device according to claim 5, wherein, when access to the first memory cells is performed, the second bit line and the fourth bit line become a floating state, and when access to the second memory cells is performed, the first bit line and the third bit line become a floating state.

7. The device according to claim 6, wherein the first sense amplifier is formed on the semiconductor substrate, and the first sub-array and the second sub-array are formed on a layer above the first sense amplifier.

8. The device according to claim 7, wherein the first bit line and the second bit line are formed on a layer above the first sub-array and the second sub-array, the first sub-array includes a plurality of memory regions where the first memory cells are stacked, and a hook-up region provided between adjacent memory regions, and the first bit line is connected to a peripheral circuit provided under the first sub-array.

9. The device according to claim 8, wherein the bit line connection unit is formed on the semiconductor substrate, and the first sub-array and the second sub-array are formed on a layer above the bit line connection unit.

* * * * *